(12) United States Patent
Akiyama et al.

(10) Patent No.: US 6,307,269 B1
(45) Date of Patent: Oct. 23, 2001

(54) SEMICONDUCTOR DEVICE WITH CHIP SIZE PACKAGE

(75) Inventors: Yukiharu Akiyama, Koganei; Tomoaki Kudaishi, Kodaira; Takehiro Ohnishi, Higashimurayama; Noriou Shimada, Kodaira; Shuji Eguchi, Toukai-mura; Asao Nishimura, Kokubunji; Ichiro Anjo, Koganei; Kunihiro Tsubosaki, Hino; Chuichi Miyazaki, Akishima; Hiroshi Koyama, Tachikawa; Masanori Shibamoto, Urawa; Akira Nagai; Masahiko Ogino, both of Hitachi, all of (JP)

(73) Assignees: Hitachi, Ltd.; Hitachi ULSI Systems Co., Ltd., both of Tokyo; Akita Electronics Co., Ltd., Akita, all of (JP)

( * ) Notice: Subject to any disclaimer, the term of this patent is extended or adjusted under 35 U.S.C. 154(b) by 0 days.

(21) Appl. No.: 09/113,500

(22) Filed: Jul. 10, 1998

(30) Foreign Application Priority Data

Jul. 11, 1997 (JP) .................................................. 9-185621
Aug. 27, 1997 (JP) .................................................. 9-230906

(51) Int. Cl.⁷ .................................................. H01L 23/48
(52) U.S. Cl. .......................... 257/778; 257/701; 257/737
(58) Field of Search .................................... 257/778, 737, 257/738, 701; 438/106

(56) References Cited

U.S. PATENT DOCUMENTS 6,130,112 * 10/2000 Kitano et al. ........................ 438/108
6,133,639 * 10/2000 Kovac et al. ......................... 257/778

FOREIGN PATENT DOCUMENTS 8-306745    11/1996 (JP) .
9-172033    6/1997 (JP) .

OTHER PUBLICATIONS

"Big Innovations in Mounting Technologies, Start of a Chip Size Package Era", Nikkei Microdevices, Apr. 1997. (translation attached).

* cited by examiner

Primary Examiner—Roy Potter
(74) Attorney, Agent, or Firm—Antonelli, Terry, Stout & Kraus, LLP

(57) ABSTRACT

A semiconductor device including a semiconductor chip having connection terminals in a peripheral part of a main surface thereof; an elastic body disposed on the main surface leaving the connection terminals exposed; an insulating tape formed on the elastic body and having openings in areas where the connection terminals are situated; plural leads formed on the top surface of the insulating tape, one end of each lead being connected to one of the connection terminals and the other end being disposed on the elastic body; plural bump electrodes formed on the other ends of the plural leads; and a resin body for sealing the connection terminals and one end of each of the leads, wherein the insulating tape protrudes beyond the chip where the plural connection terminals are arranged, and wherein the shape of the resin body is restricted by the protruding part of the insulating tape.

23 Claims, 67 Drawing Sheets

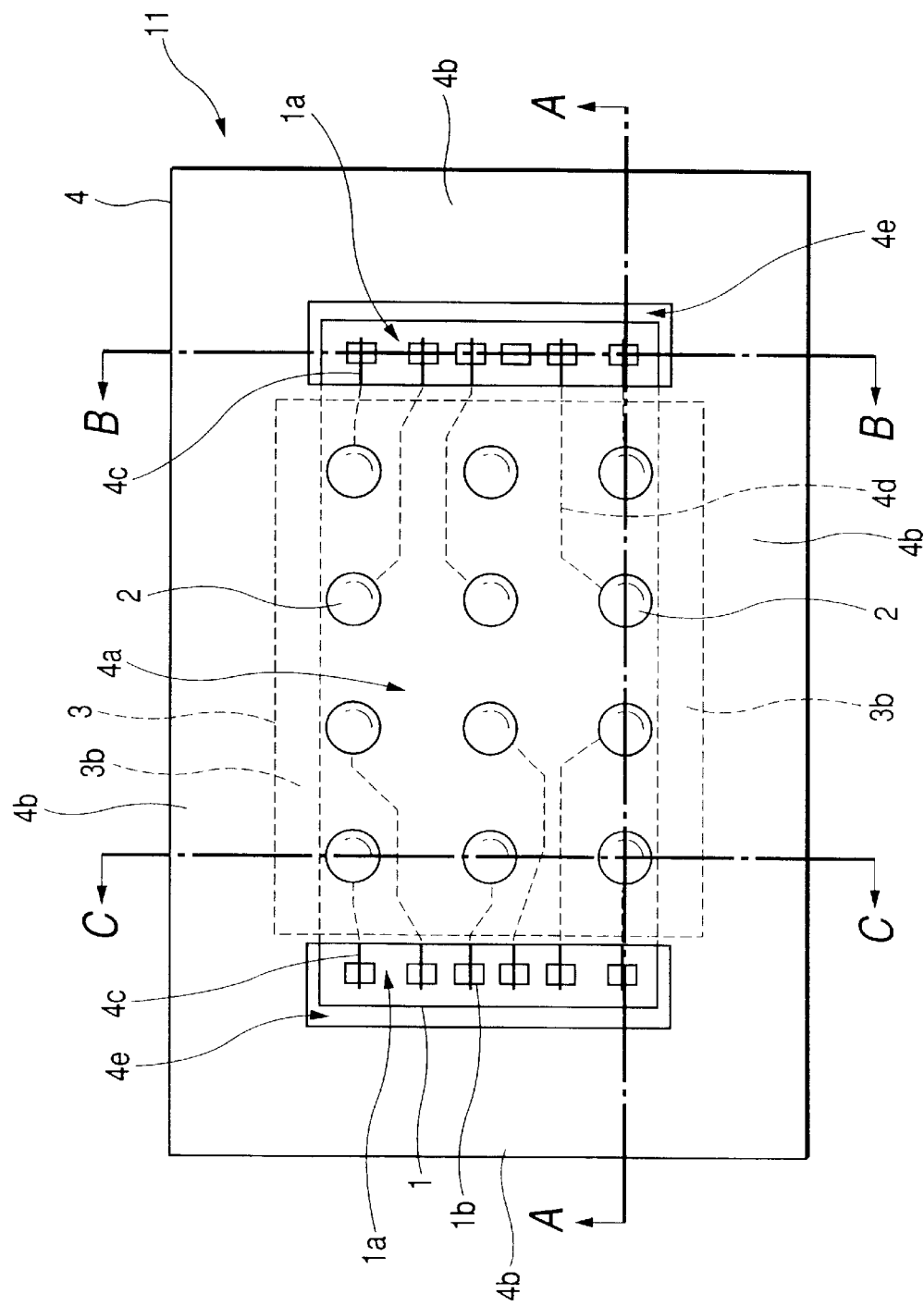

FIG. 3(a)

| THIN FILM WIRING SUBSTRATE SPECIFICATION | | |
|---|---|---|
| TAPE MATERIAL | | POLYIMIDE RESIN |
| TAPE THICKNESS | | 25~75 μm |
| WIRING MATERIAL | | COPPER (ELECTROLYTIC COPPER FOIL) |
| WIRING MATERIAL THICKNESS | | 18~25 μm |
| WIRING PLATING SPECIFICATION | SPECIFICATION (1) | Au 1.5 μm (BOTH SIDES) |
| | SPECIFICATION (2) | Au/Ni = 3.0/0.5 μm (CHIP SIDE), 0.3/0.5 μm (BUMP SIDE) |

FIG. 3(b)

| TYPICAL ELASTOMER SPECIFICATIONS | | ELASTOMER SPECIFICATION | |
|---|---|---|---|
| | | SPECIFICATION (1) | SPECIFICATION (2) |
| BASIC COMPOSITION | | 3-LAYER POROUS FILM | 3-LAYER POLYIMIDE FILM |
| INTERMEDIATE MATERIAL (SKELETAL LAYER) | | POROUS FLUORIDE RESIN | POLYIMIDE RESIN |
| UPPER/LOWER LAYER MATERIAL (ADHESIVE LAYER) | | EPOXY-IMPREGNATED POROUS FLUORIDE RESIN | ACRYL/EPOXY RESIN |
| ELASTOMER | CHIP LOWER PART | 80~230 μm | 80~250 μm |
| | CHIP OUTER PART | 100~250 μm | |
| INTERMEDIATE LAYER THICKNESS | CHIP LOWER PART | 40~200 μm | 60~230 μm |
| | CHIP OUTER PART | 60~220 μm | |
| UPPER LAYER THICKNESS (CHIP SURFACE) | | 10~80 μm | 10~80 μm |
| LOWER LAYER (CHIP SUBSTRATE SURFACE) | | 10~80 μm | 10~80 μm |
| LONGITUDINAL ELASTIC MODULUS | | 200~2000MPa | 1000~8000MPa |

FIG. 3(c)

| TYPICAL SEAL MATERIAL SPECIFICATION | SEAL MATERIAL SPECIFICATION | |
|---|---|---|
| | SPECIFICATION (1) | SPECIFICATION (2) |
| SUBSTRATE COMPOSITION | EPOXY NON-SOLVENT TYPE LIQUID RESIN | EPOXY SOLVENT TYPE LIQUID RESIN |
| NON-VOLATILE COMPONENTS | 100wt% | 60~95wt% |
| MAIN COMPONENTS | EPOXY AND SILICA | EPOXY AND SILICA |
| SILICA CONTENT (OF MAIN COMPONENT) | 0~80wt% (PREFERABLY 50~80wt%) | |
| CURING AGENT | IMIDAZOLE (0.1~10wt%) | PHENOL (10~45wt%) |
| CURING ENHANCER | | IMIDAZOLE (0.1~15wt%) |
| SOLVENT | | GAMMA-BUTYLLACTONE (5~40wt%) |
| VISCOSITY (IN APPLICATION) | 0.5~13Pa·s (PREFERABLY 1~8Pa·s) | |
| RESIN HEATING TEMPERATURE IN APPLICATION | AMBIENT TEMPERATURE~80°C | AMBIENT TEMPERATURE |

FIG. 3(d)

| | BUMP POLE SPECIFICATION | |
|---|---|---|
| MATERIAL SPECIFICATION | SPECIFICATION (1) | Sn63/Pb37 EUTECTIC SOLDER |
| | SPECIFICATION (2) | OTHER HIGH FUSION POINT SOLDER |
| | SPECIFICATION (3) | Au~68 PLATED Ni ALLOY |
| DIAMETER | 0.3mm~0.6mm | |

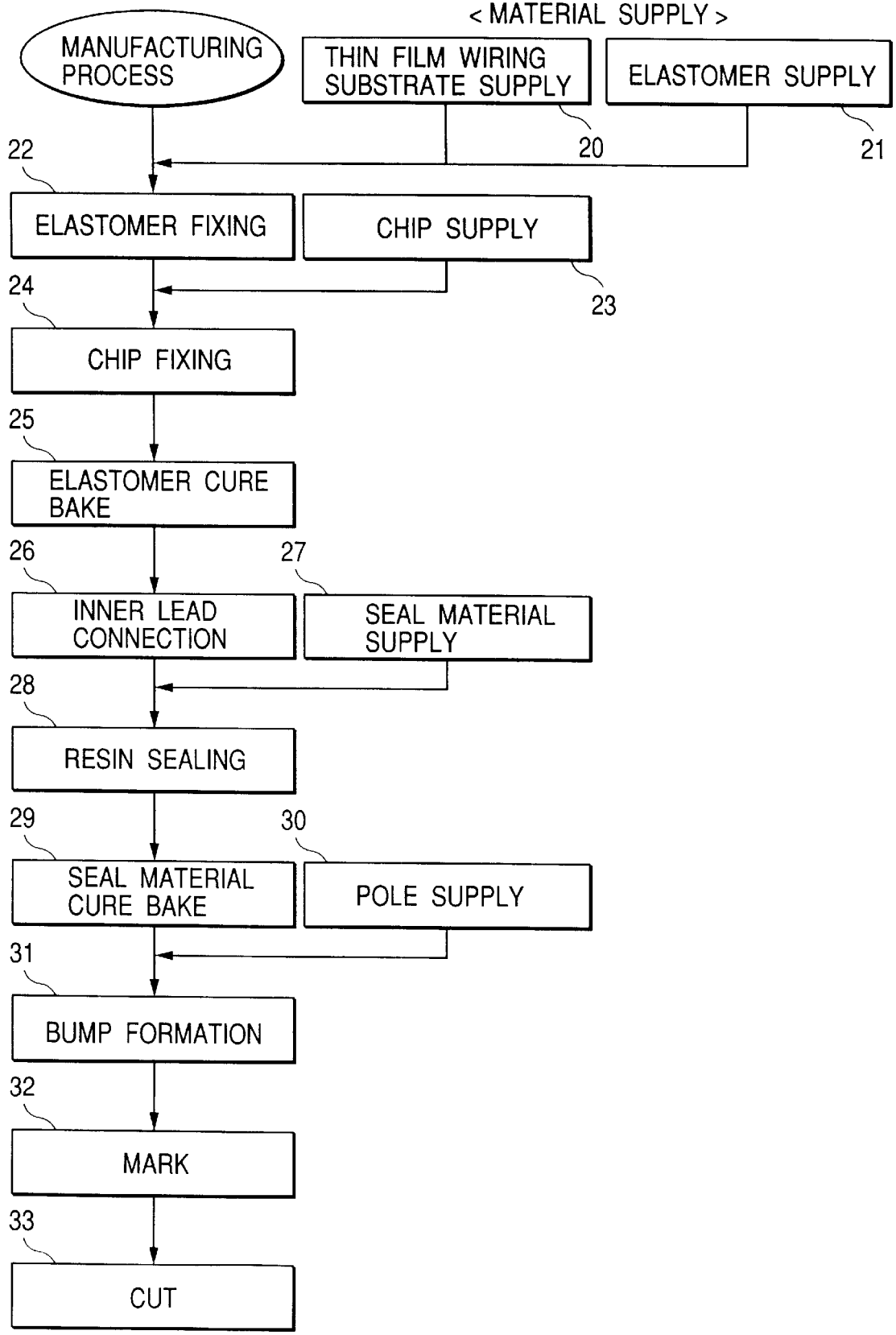

FIG. 5

| ELASTOMER FIXING CONDITIONS | |
|---|---|
| TEMPERATURE | 110~170°C |
| LOAD | 2~10kg/cm² |
| TIME | 1~5s |
| CHIP FIXING CONDITIONS | |
| TEMPERATURE | 110~170°C |
| LOAD | 5~20kg/cm² |
| TIME | 5~20s |
| CURE CONDITIONS AFTER CHIP FIXING | |
| TEMPERATURE | 140~170°C |
| TIME | 5~30 MIN |

| INNER LEAD CONNECTION CONDITIONS | | |
|---|---|---|
| | CONDITION (1) | CONDITION (2) |
| ULTRASONIC WAVE FREQUENCY | 60kHz | 120kHz |
| ULTRASONIC WAVE AMPLITUDE | 1.5~3.5 μm | 0.1~0.6 μm |
| JOINING TIME | 10~40ms | 10~40ms |
| JOINING LOAD | 30~90g | 30~90g |
| TEMPERATURE | 150~250°C | 150~250°C |

| CURE CONDITIONS AFTER SEALING | |
|---|---|
| TEMPERATURE | 140~150°C |
| TIME | 30 MIN~2 HOURS |
| HUMP FORMING REFLOW CONDITIONS | |
| TEMPERATURE | 230~240°C |
| TIME | 5~10s |

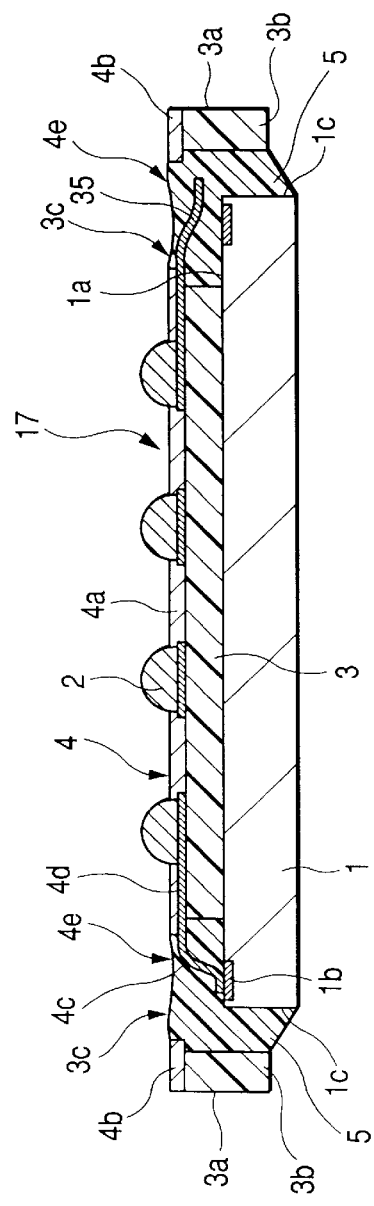
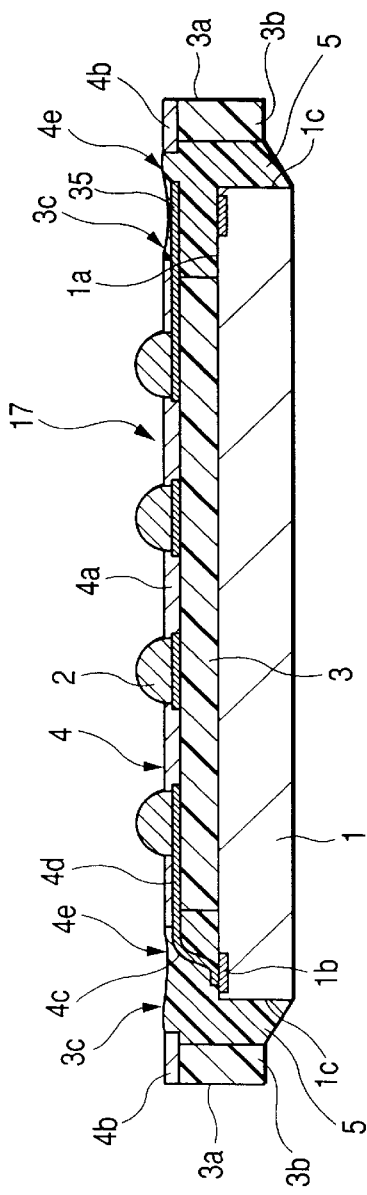
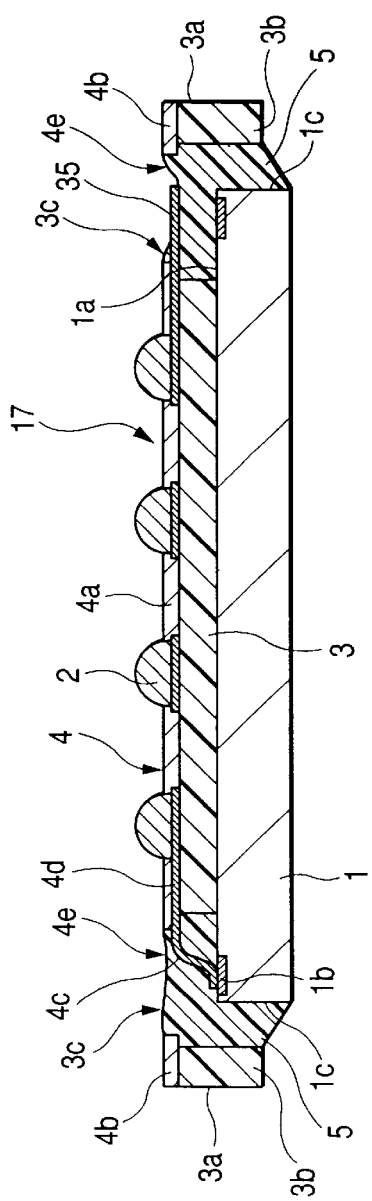
FIG. 40(a)
FIG. 40(b)
FIG. 40(c)

FIG. 46

| TYPICAL COLORING ELASTOMER SPECIFICATIONS | COLORING ELASTOMER SPECIFICATION (1) | COLORING ELASTOMER SPECIFICATION (2) |
|---|---|---|
| BASIC COMPOSITION | 3-LAYER POROUS FILM | 3-LAYER POLYIMIDE FILM |
| INTERMEDIATE MATERIAL (SKELETAL LAYER) | POROUS FLUORIDE RESIN | POLYIMIDE RESIN |
| UPPER/LOWER LAYER MATERIAL (ADHESIVE LAYER) | EPOXY-IMPREGNATED POROUS FLUORIDE RESIN WITH COLORANT | ALKYL/EPOXY RESIN WITH COLORANT |
| COLORANT | CARBON | |
| COLORANT COMPOSITION | TYPICAL SPECIFICATION: PARTICLE DIAMETER 0.1~30 μm (PREFERABLY 0.5~10 μm) | |
| | REASON: WHEN PARTICLE DIAMETER IS LESS THAN 0.1 μm, CARBON PARTICLES AGGLOMERATE AND DISPERSION IS NON-UNIFORM WHICH IS UNDESIRABLE. WHEN PARTICLE DIAMETER EXCEEDS 30 μm, CARBON PARTICLES DO NOT EASILY DISPERSE IN RESIN WHICH IS UNDESIRABLE | |
| COLORANT PROPORTION | TYPICAL SPECIFICATION: 0.1~3.0% (PREFERABLY 0.5~2.5%) | |
| | REASON: WHEN PROPORTION IS LESS THAN 0.1%, COLORATION IS INSUFFICIENT WHICH IS UNDESIRABLE. WHEN PROPORTION EXCEEDS 3.0%, MATERIAL HAS ELECTRICAL CONDUCTANCE DUE TO CARBON WHICH IS UNDESIRABLE | |

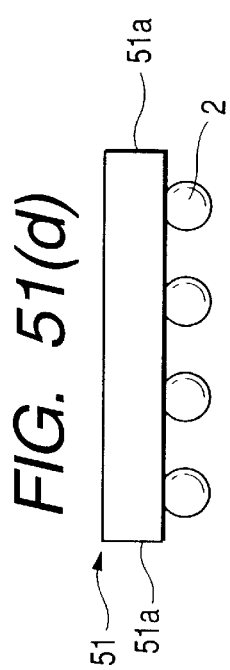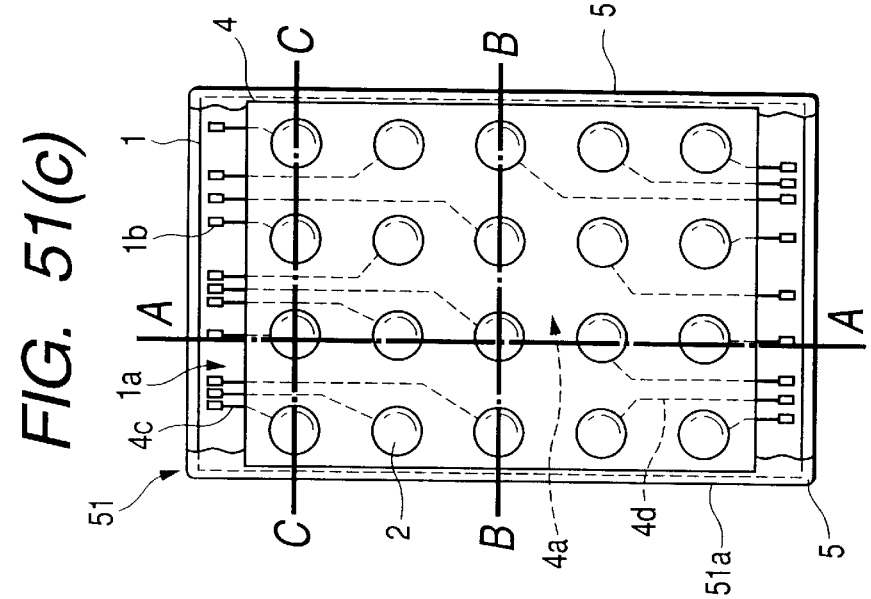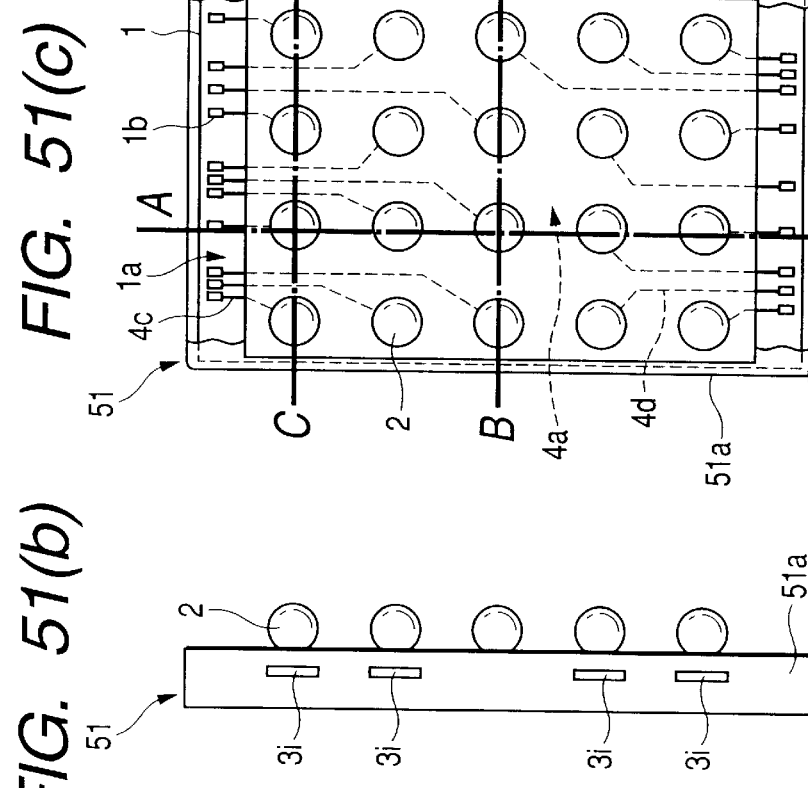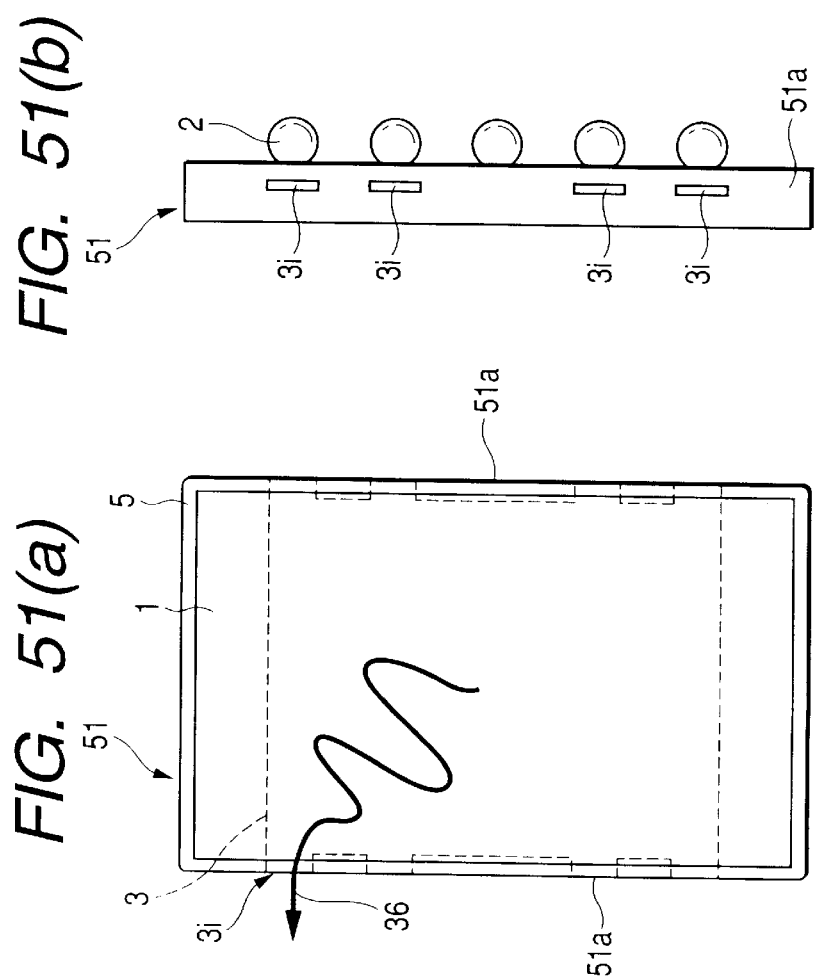

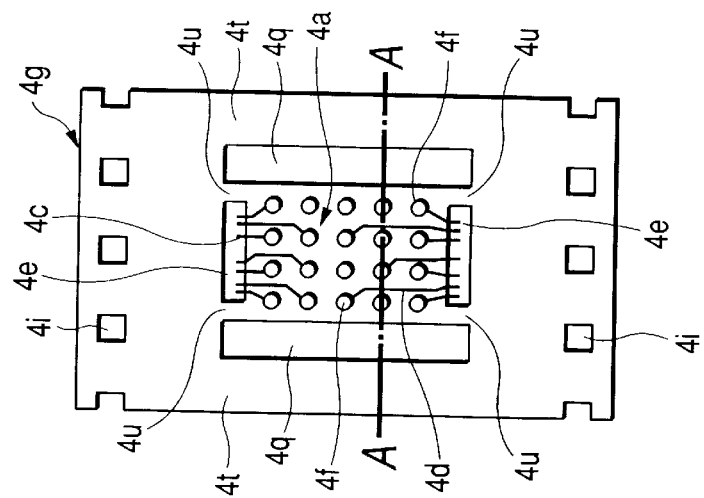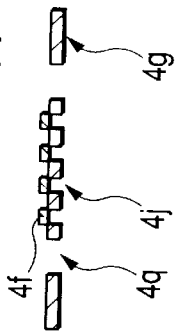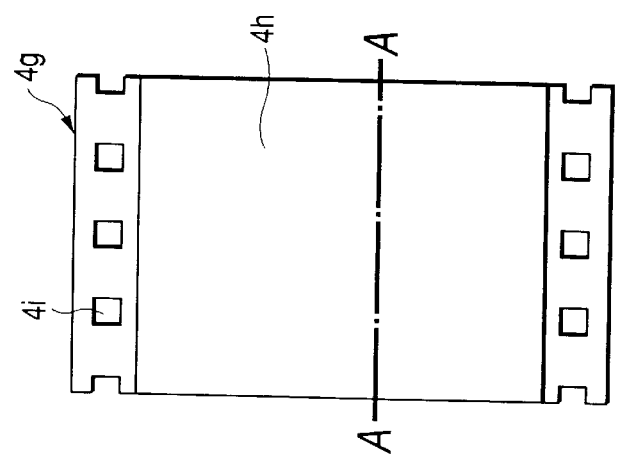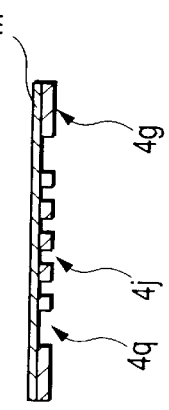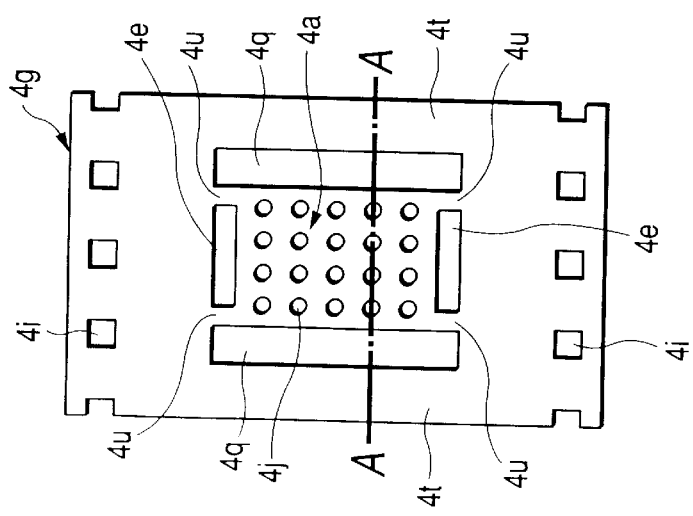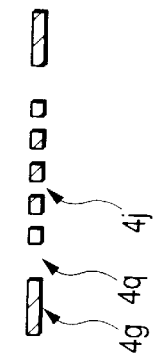

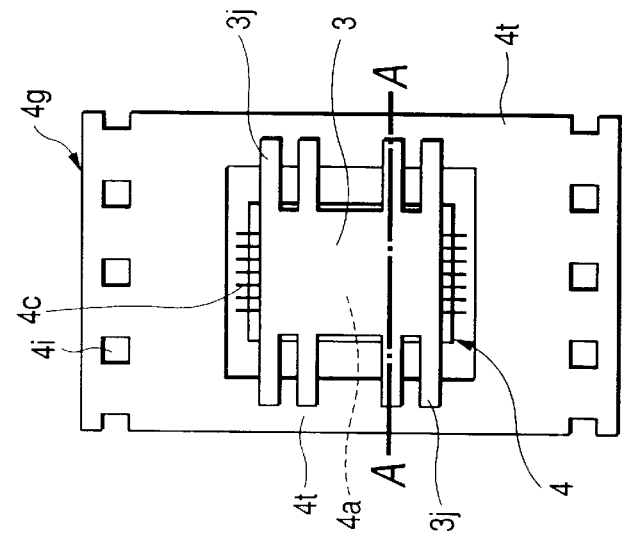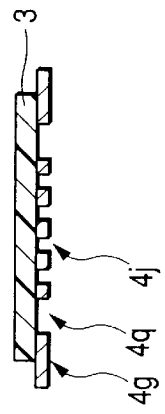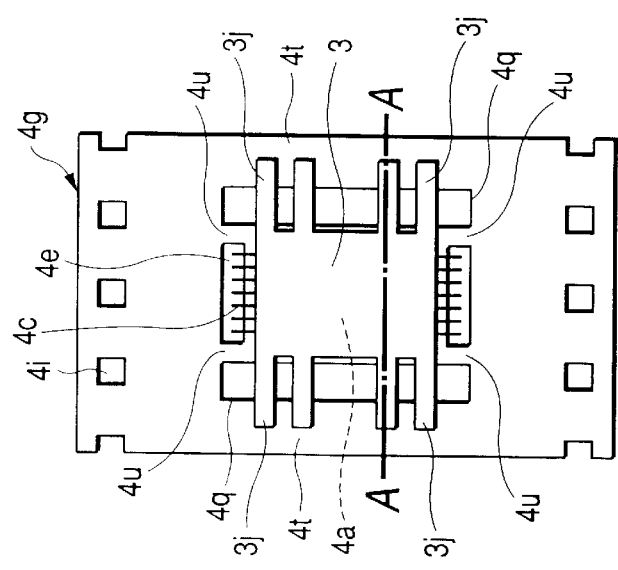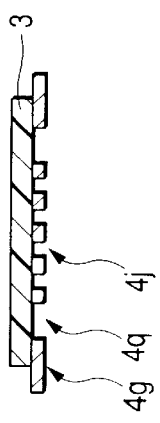

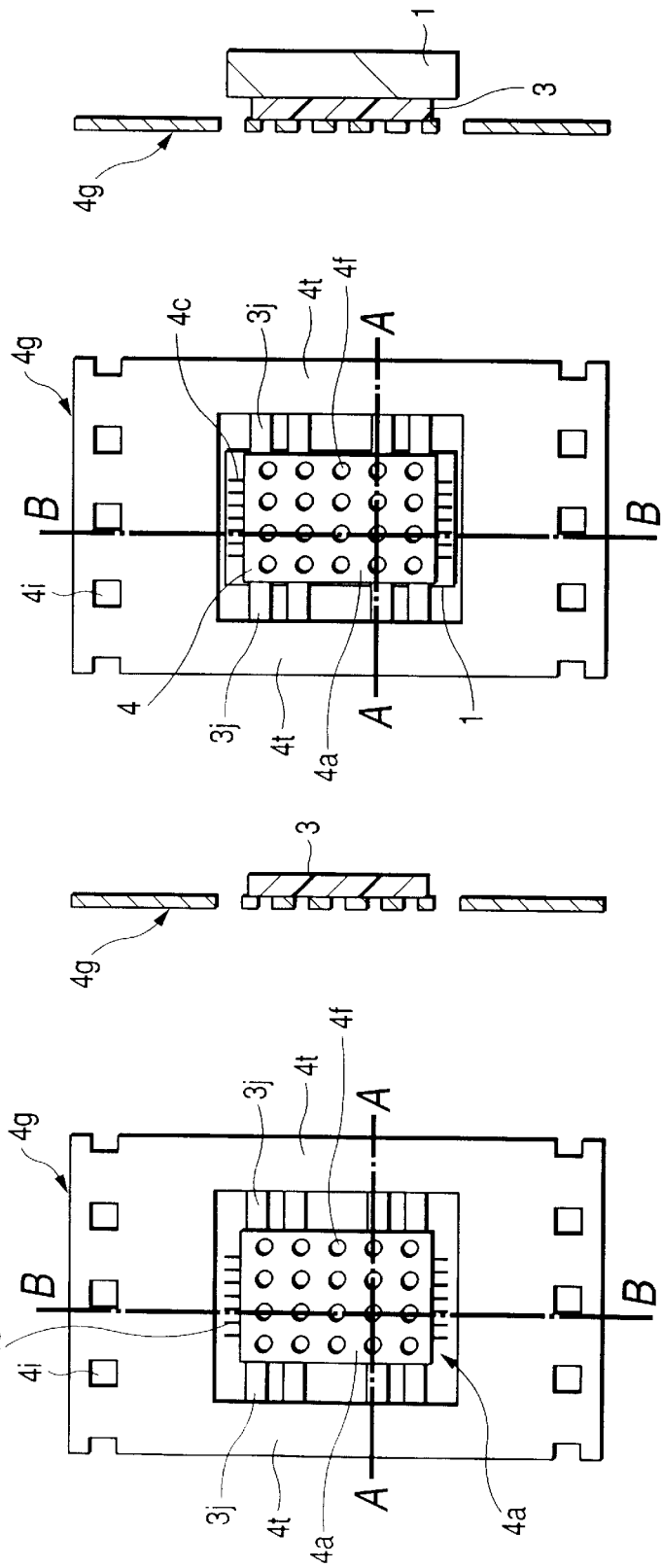

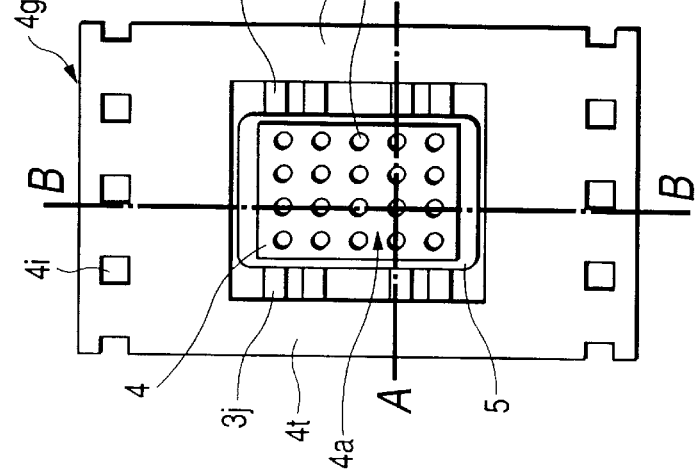
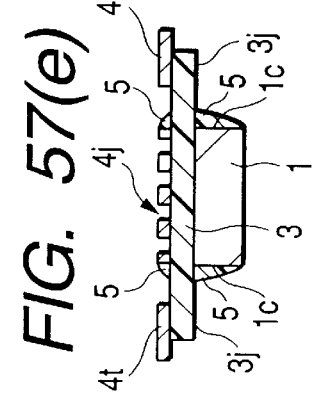
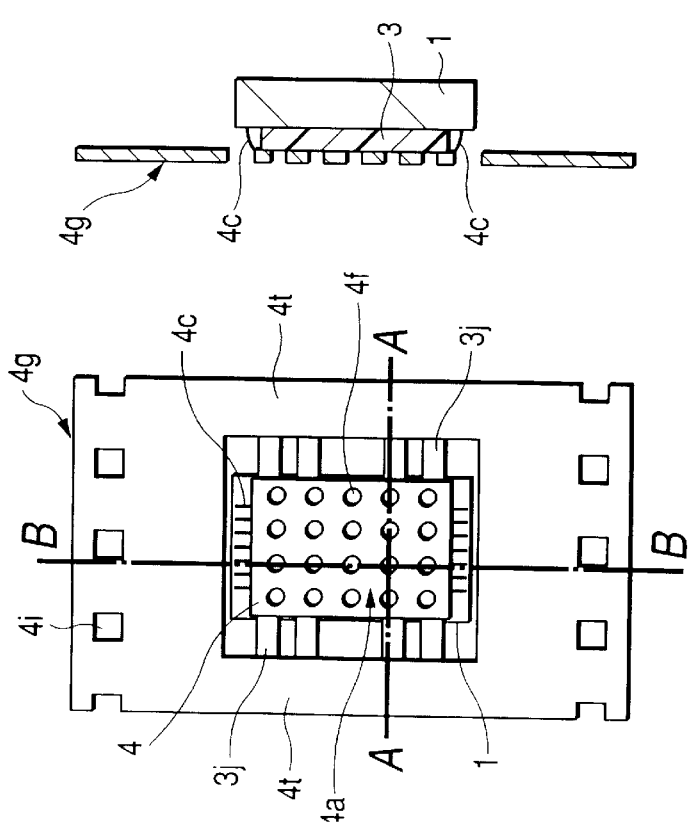
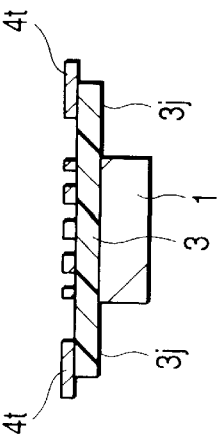

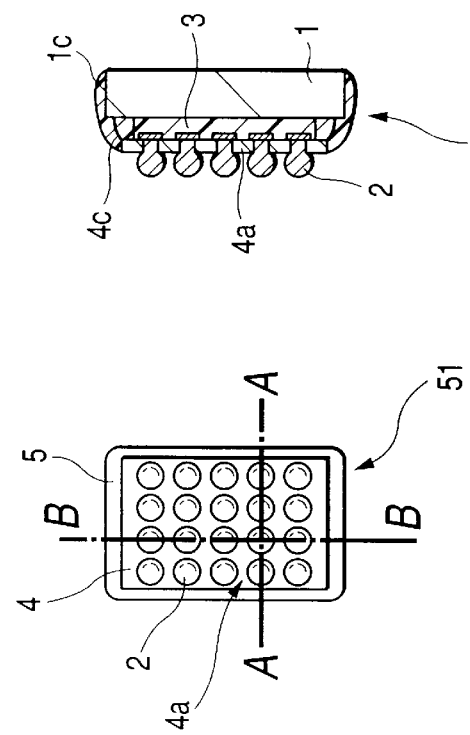
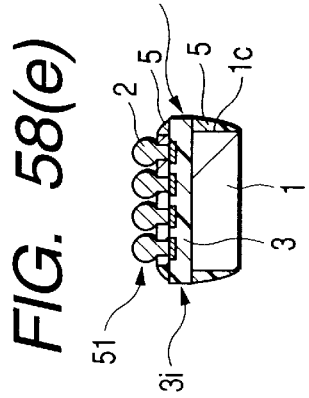
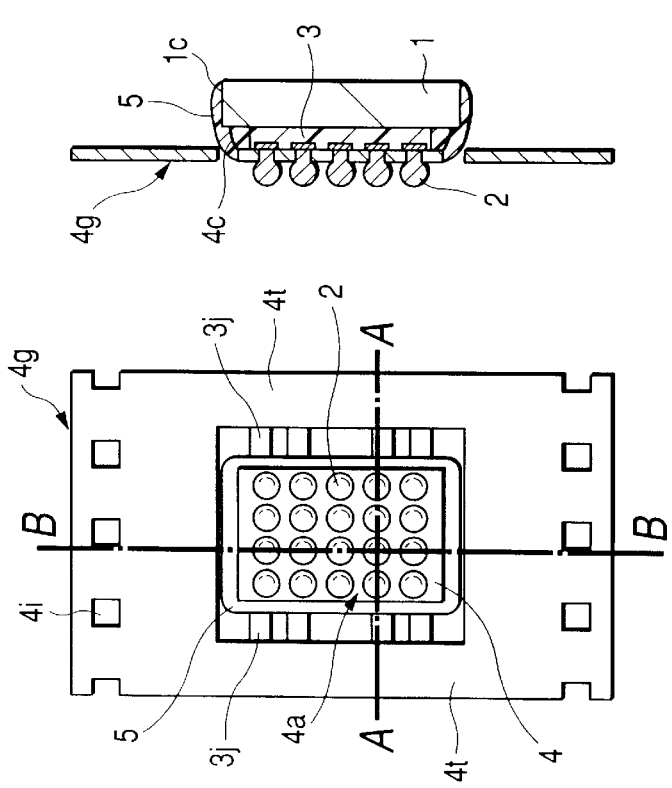
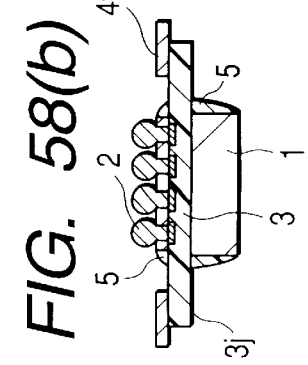
FIG. 58(a) FIG. 58(c) FIG. 58(d) FIG. 58(f)
FIG. 58(b) FIG. 58(e)

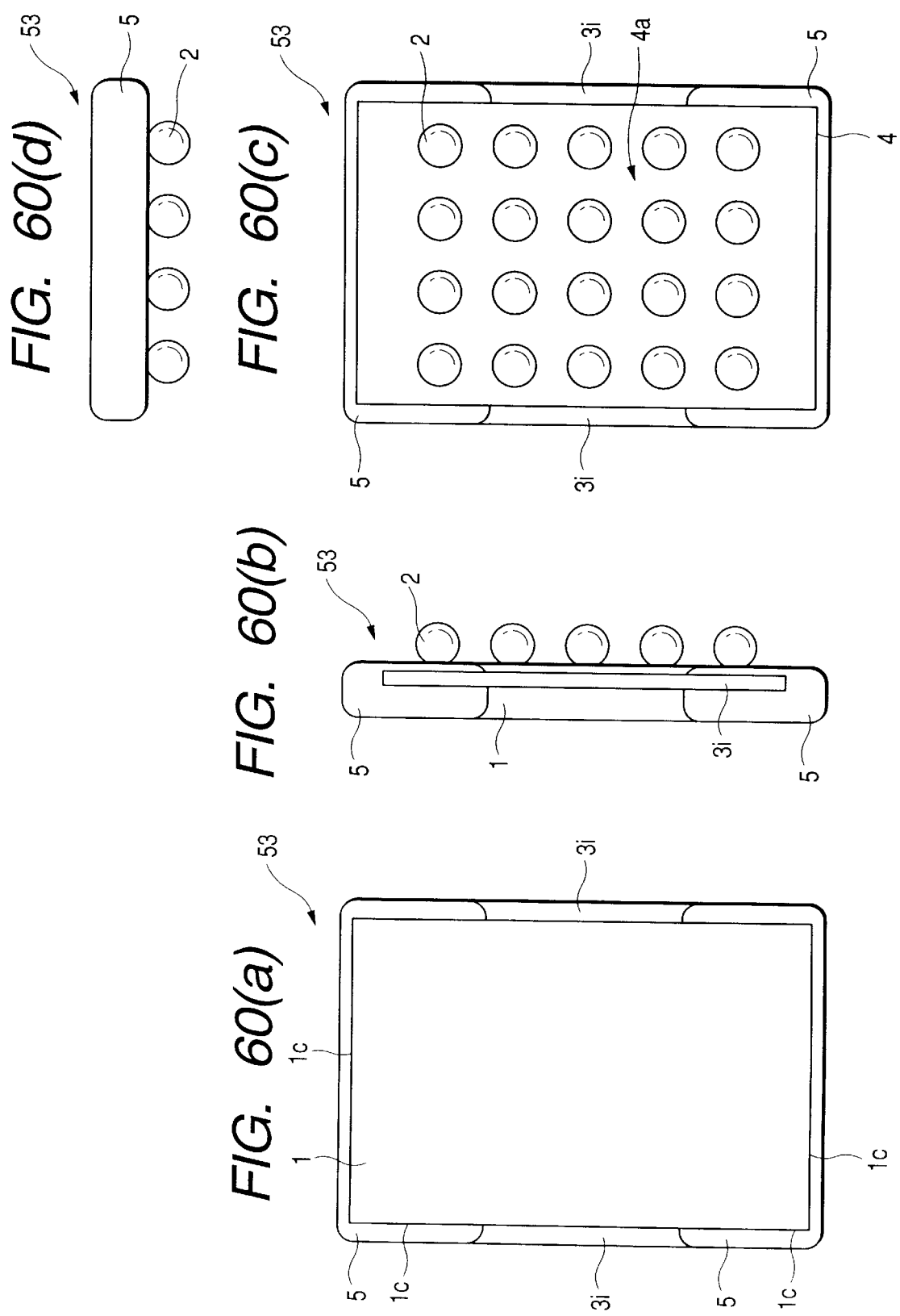

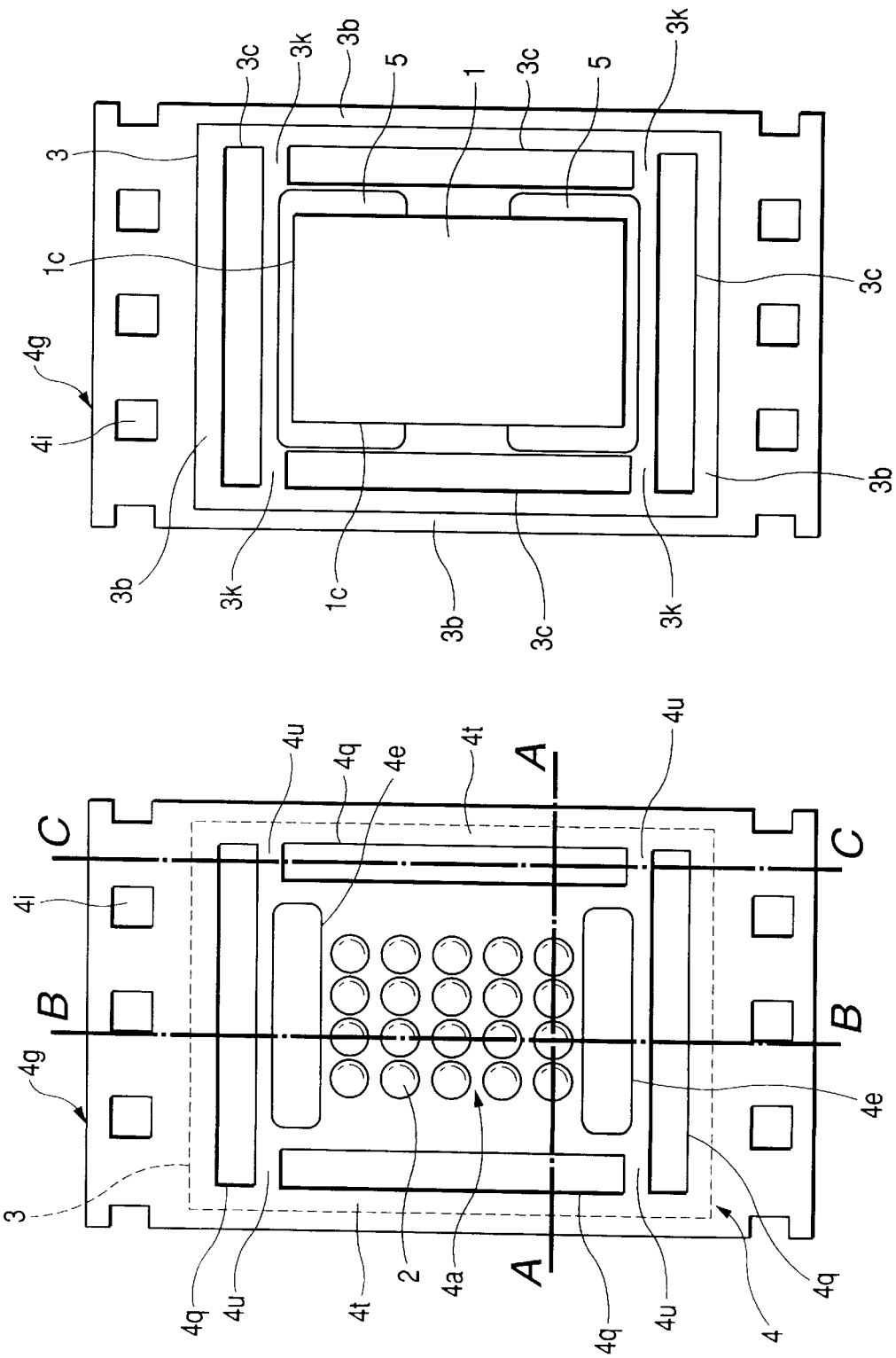

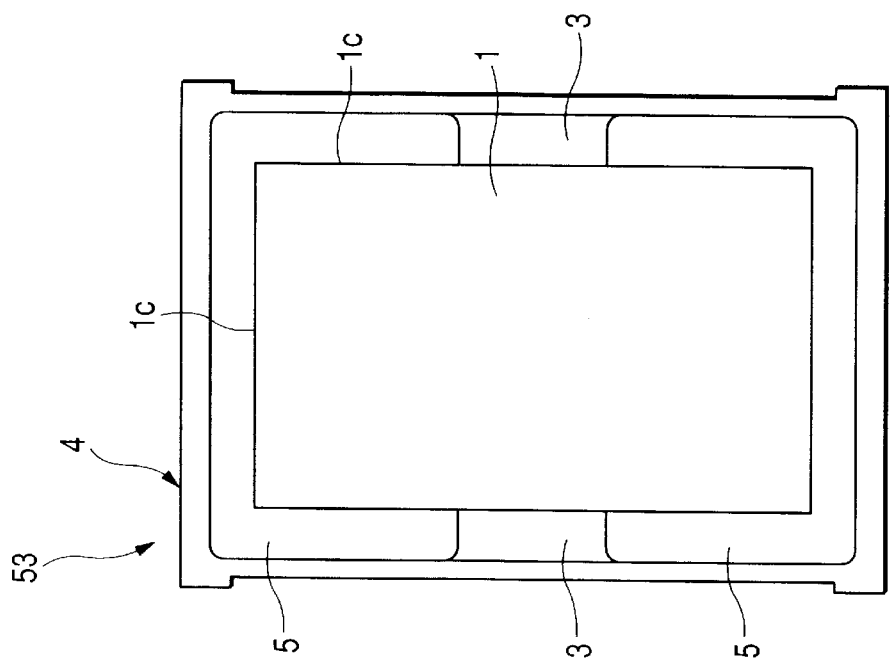
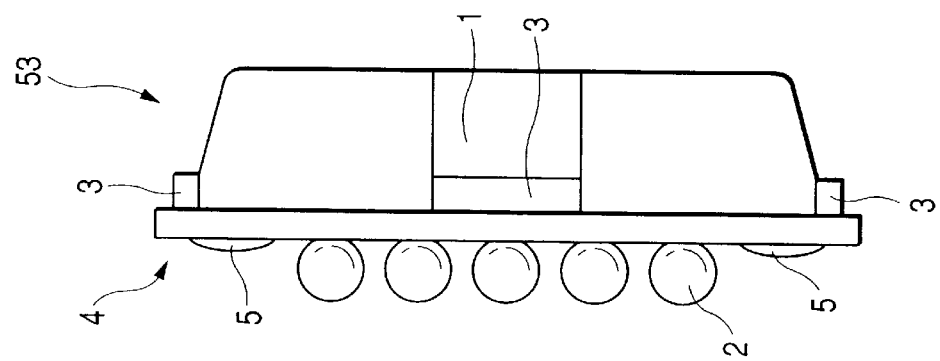
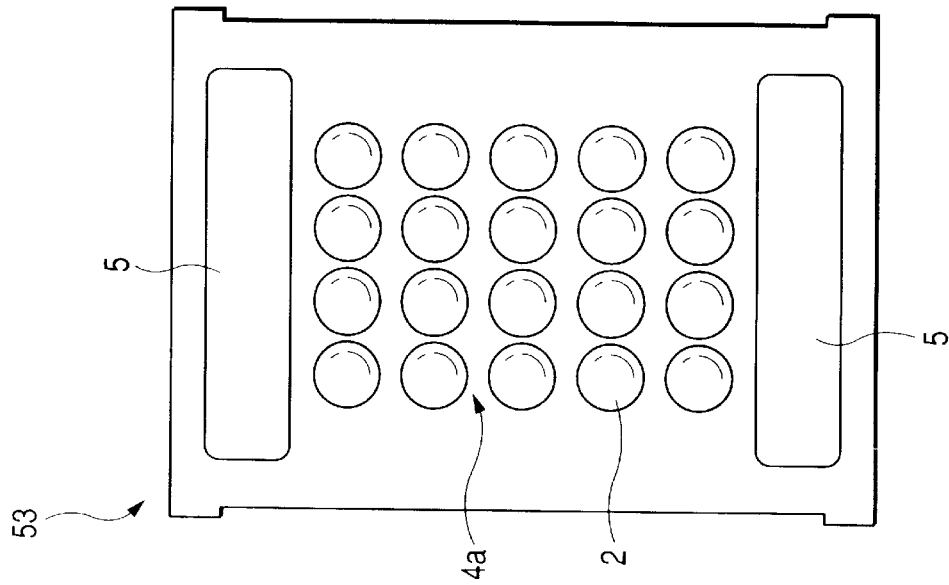

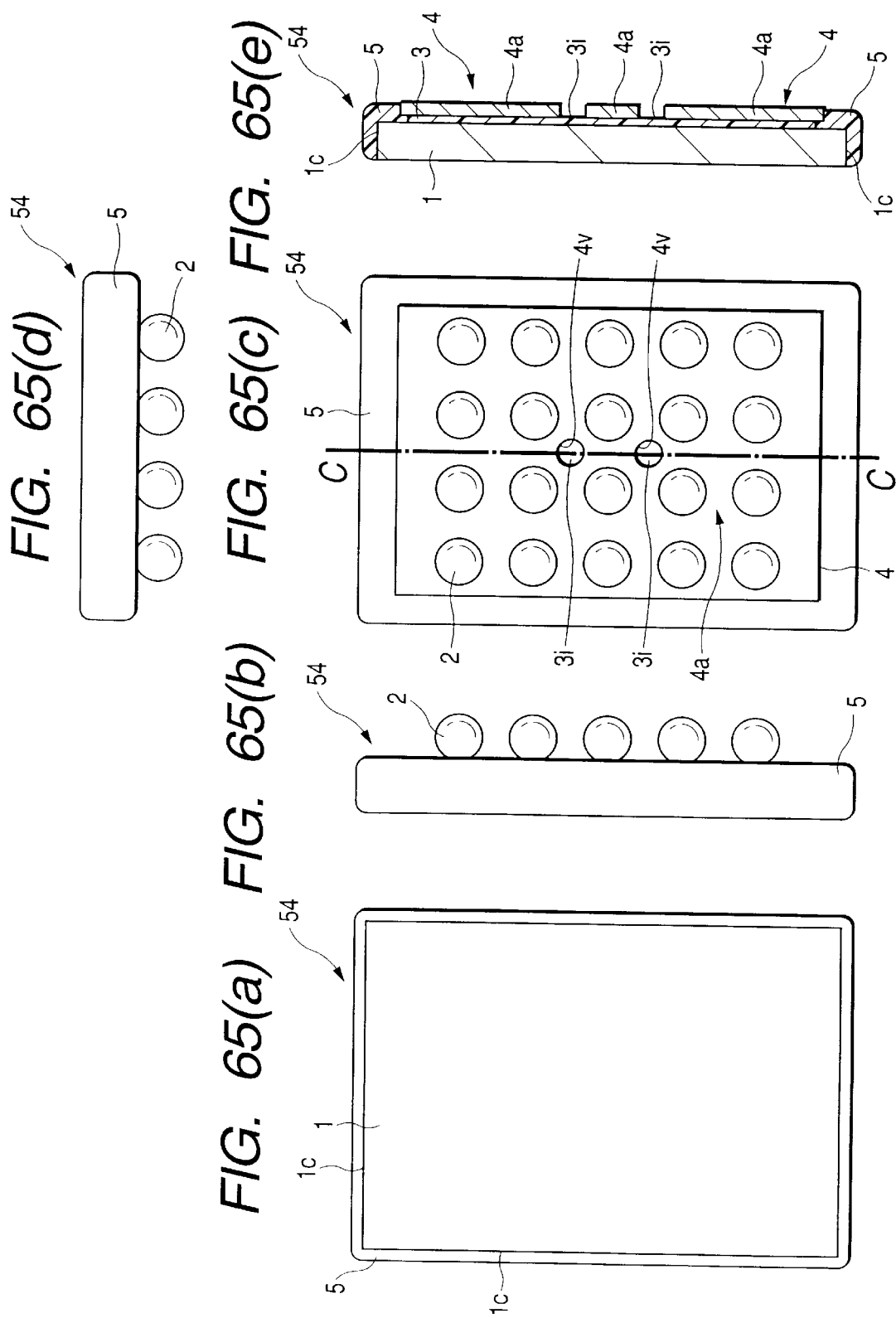

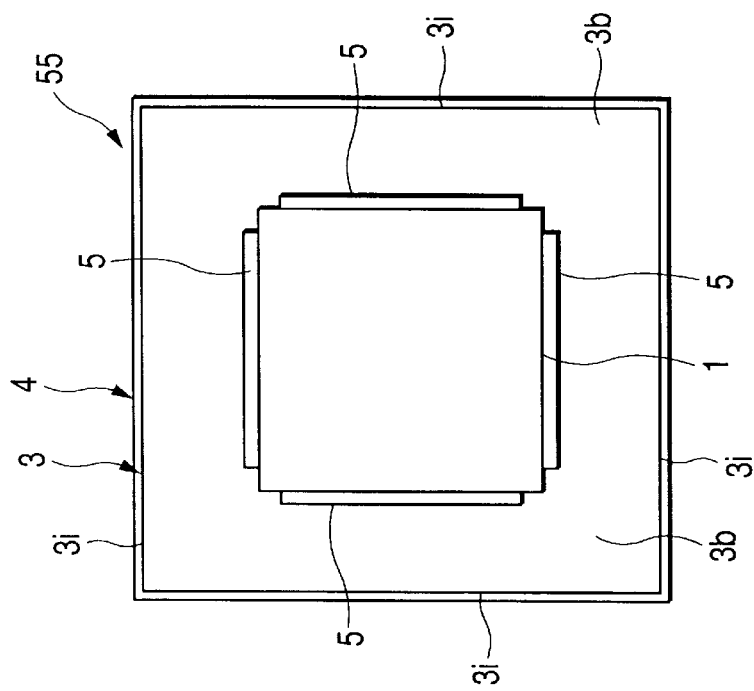
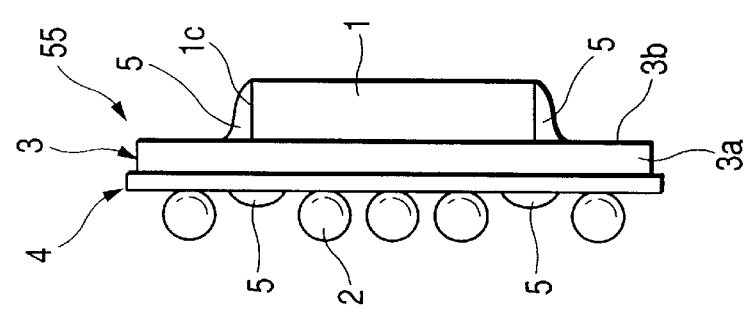
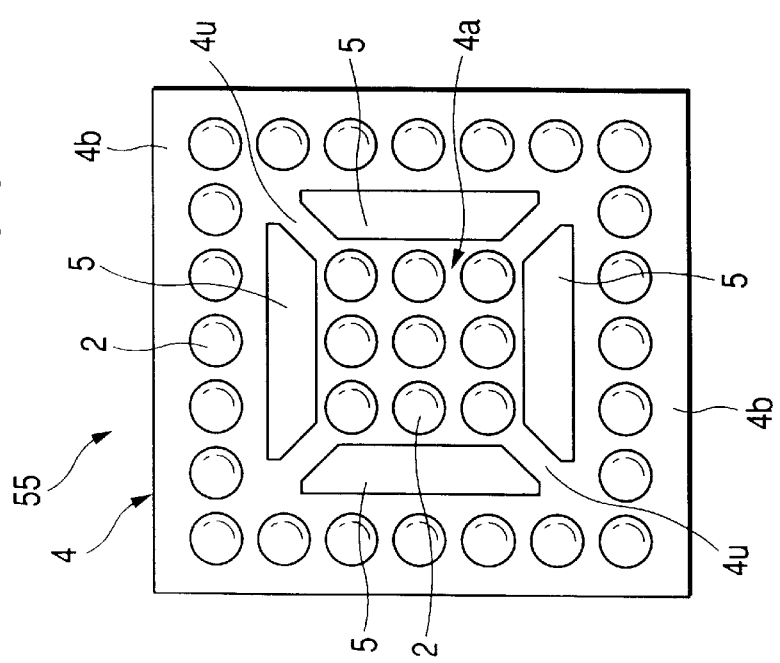

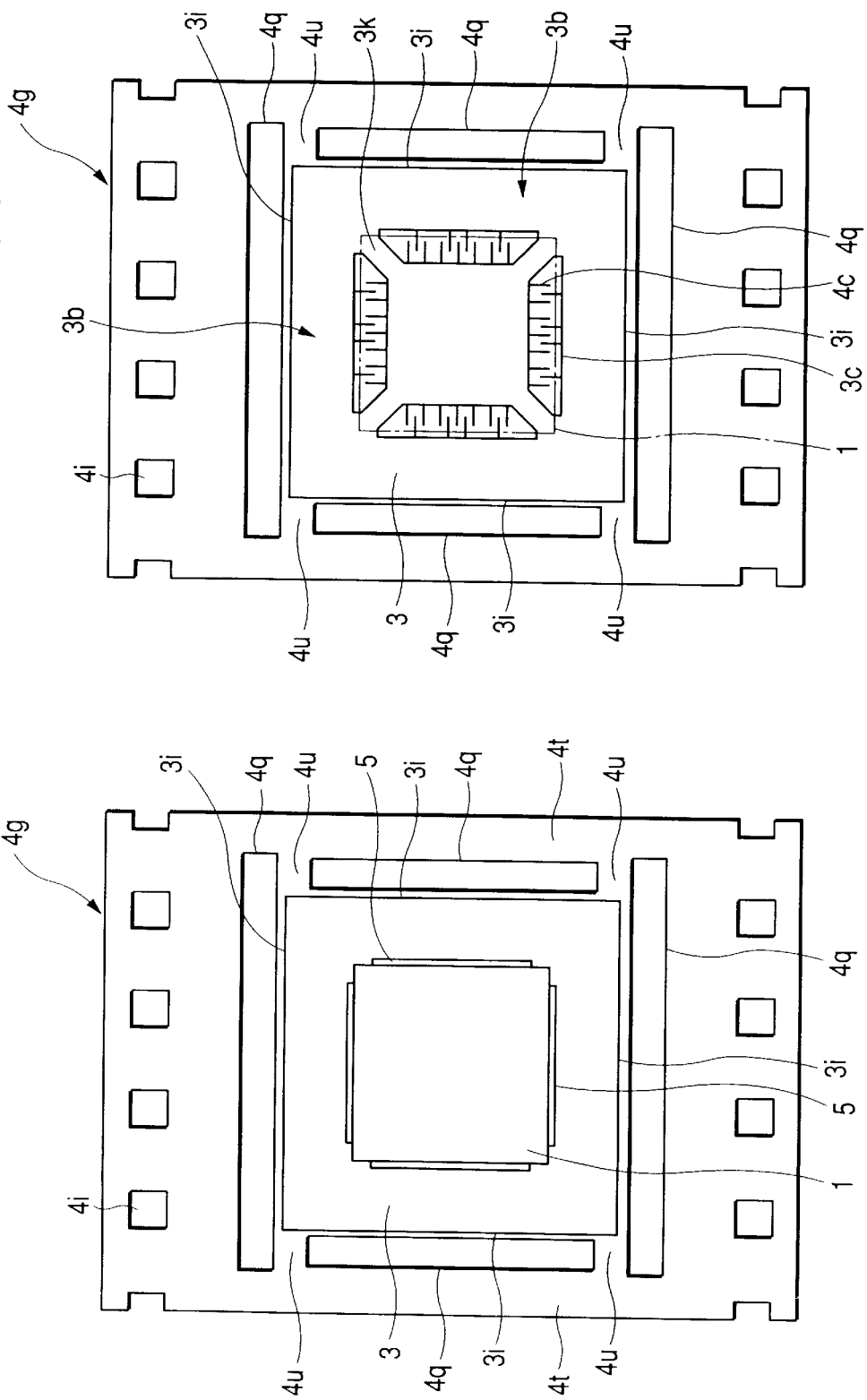

SEMICONDUCTOR DEVICE WITH CHIP SIZE PACKAGE

BACKGROUND OF THE INVENTION

This invention relates to a technique for manufacturing a semiconductor device and, in particular, to a technique for manufacturing a relatively low cost semiconductor device with improved seal properties in a CSP (Chip Size Package).

This invention is the result of the inventor's own research of which a summary follows.

A CSP is a thin, compact semiconductor device of chip size, and it is often used in printed circuit boards built into portable electronic devices.

The general structure of a CSP comprises a thin film wiring substrate on which are mounted bump electrodes which are external terminals, leads electrically connected to electrode pads of a semiconductor chip, an elastomer (elastic structure) arranged between the semiconductor chip and the thin film wiring substrate and formed in approximately the same size as the thin film wiring substrate, and sealing parts which seal the electrode pads and the leads of the thin film wiring substrate connected to it.

Structures of CSPs studied by the inventors for comparison purposes are described, for example, in "Nikkei Microdevices" Apr. 1, 1997, No. 142, pp. 44–53, published by Nikkei BP Co. on Apr. 1, 1997, and, in particular, the next generation CSP structure (comparison examples) described in FIG. 6, on page 48 thereof. This CSP comprises a semiconductor chip having electrode pads formed on its main surface, bump electrodes which are external terminals arranged over the main surface of the semiconductor chip, and a contour ring outside the semiconductor chip.

SUMMARY OF THE INVENTION

However, in a CSP having the aforesaid general structure according to the prior art, a sealing resin easily flows onto the sides of the semiconductor chip. This impairs the precision of the contour size of the CSP so that, in some cases, it could not be inserted in its socket.

In other words, there was a problem in that the contour shape of the CSP was not fixed.

If the amount of sealing resin is reduced in an attempt to solve this problem, the leads of the thin film wiring substrate may be exposed. The sealing properties of the sealing parts are then inadequate, and humidity resistance is not so reliable as a result.

In this comparison CSP of the prior art, if the contour ring is made a separate structure, manufacturing costs increase.

In a CSP having the usual structure, during solder reflow in forming the bump electrodes, the internal pressure rises due to expansion of moisture and gas in the elastomer, and as a result, the seal part is destroyed causing a "popcorn" phenomenon.

It is therefore an object of this invention to provide a chip size semiconductor device of lower cost and improved sealing properties, and a method of manufacturing such a device.

It is a further object of this invention to provide a semiconductor device and manufacturing method which prevents occurrence of this popcorn phenomenon.

This and other features of the invention will become clear from the following description and attached drawings.

The following is a simple description of the main points of a typical example of the present invention.

The semiconductor device of this invention is a chip size package having connection terminals provided on the outer periphery of its main surface. The package comprises an elastic structure arranged on the main surface of the semiconductor chip leaving the connection terminals exposed, a thin film wiring substrate comprising a substrate body having wiring whereof one end is electrically connected to the aforesaid terminals via leads and the other ends are electrically connected to bump electrodes which are external terminals and comprising substrate protruding parts having openings which leave the connection terminals exposed and which protrude beyond the openings and the semiconductor chip, and sealing parts which seal the connection terminals of the semiconductor chip and seal the leads of the thin film wiring substrate, the substrate body and the substrate protruding parts of the thin film wiring substrate being formed in a one-piece construction.

As the substrate protruding parts are not separate from the substrate body but are formed together with it in a one-piece construction, the substrate protruding parts need not be formed from costly materials.

As a result, the cost of manufacturing the semiconductor device is reduced.

The semiconductor device of this invention is a chip size structure having connection terminals provided on the outer periphery of its main surface. It comprises an elastic structure arranged on the main surface of the semiconductor chip comprising elastic protruding parts having openings which leave the connection terminals exposed, a thin film wiring substrate comprising a substrate body having wiring whereof one end is electrically connected to the aforesaid terminals via leads and the other ends are electrically connected to bump electrodes which are external terminals, and comprising substrate protruding parts having openings which leave the connection terminals exposed and which protrude beyond the openings and the semiconductor chip, and sealing parts which seal the connection terminals of the semiconductor chip and seal the leads of the thin film wiring substrate, the substrate body and the substrate protruding parts of the thin film wiring substrate being formed in a one-piece construction, and the thin film wiring substrate and the elastic structure having substantially the same size.

The semiconductor device of this invention is a chip size structure having connection terminals provided on the outer periphery of its main surface, comprising an elastic structure arranged on the main surface of the semiconductor chip having parts exposed to the outside for exposing the connection terminals, a thin film wiring substrate comprising a substrate main body having wiring whereof one end is electrically connected to the aforesaid connection terminals via leads and the other ends are electrically connected to bump electrodes which are external terminals, and comprising openings so as to expose the aforesaid connection terminals, and sealing parts which seal the connection terminals of the semiconductor chip and seal the leads of the thin film wiring substrate.

The method of manufacturing a semiconductor device according to this invention comprises a step for preparing a thin film wiring substrate which is a chip size structure having connection terminals provided on the outer periphery of its main surface, comprising a substrate body with wiring, and comprising substrate protruding parts which protrude beyond openings in which leads are connected to this wiring and formed in a one-piece construction with the substrate body, a step for joining an elastic structure and the substrate body of the thin film wiring substrate, a step for joining the main surface of the semiconductor chip and the elastic structure so as to expose the connection terminals of the semiconductor chip in the openings of the thin film wiring substrate, a step for electrically connecting the connection terminals of the semiconductor chip and the corresponding leads of the thin film wiring substrate, a step for sealing the connection terminals of the semiconductor chip and the leads of the thin film wiring substrate using a sealing resin comprising a low silica material so as to form sealing parts, a step for electrically connecting the wiring of the substrate body so as to form bump electrodes, and a step for simultaneously cutting the substrate protruding parts and sealing parts formed therein to a desired contour size.

The method of manufacturing a semiconductor device according to this invention comprises a step for preparing a thin film wiring substrate which is a chip size structure having connection terminals provided on the outer periphery of its main surface, comprising a substrate main body having wiring joined to an elastic structure and openings in which leads are connected to the wiring, wherein the substrate body is supported in a substrate frame by supporting parts of the elastic structure, a step for joining the main surface of the semiconductor chip and the elastic structure so as to leave the connection terminals of the semiconductor chip exposed in the openings of the thin film wiring substrate, a step for electrically connecting the connection terminals of the semiconductor chip and the corresponding leads of the thin film wiring substrate, a step for resin sealing the connection terminals of the semiconductor chip and the leads of the thin film wiring substrate so as to form sealing parts, a step for electrically connecting the wiring of the substrate body so as to form bump electrodes, a step for cutting the supporting part of the elastic structure so as to separate the substrate body from the substrate frame, and a step for exposing the exposed parts of the elastic structure.

BRIEF DESCRIPTION OF THE DRAWINGS

FIG. 1 is a plan view through the sealing parts of a typical structure of a semiconductor device (CSP) according to a first embodiment of this invention.

FIGS. 2(a) to 2(c) are diagrams showing the structure of the semiconductor device shown in FIG. 1, in which FIG. 2(a) is a cross-sectional view through a line A—A in FIG. 1, FIG. 2(b) is a cross-sectional view through a line B—B in FIG. 1, and FIG. 2(c) is a cross-sectional view through a line C—C in FIG. 1.

FIGS. 3(a), 3(b), 3(c) and 3(d) are specification tables showing example specifications of parts used in the semiconductor device shown in FIG. 1.

FIG. 4 is a manufacturing sequence showing a typical process for manufacturing the semiconductor device shown in FIG. 1.

FIG. 5 is a chart showing typical processing conditions in each stage of the production process shown in FIG. 4

FIGS. 9(a) and 9(b) are diagrams each showing a typical method of manufacturing the semiconductor device (CSP) according to the first embodiment of this invention, in which FIG. 9(a) is a partial plan view showing an elastomer attachment, and FIG. 9(b) is a partial plan view showing a semiconductor chip attachment.

FIGS. 15(a) to 15(c) are diagrams showing the structure of the semiconductor device shown in FIG. 14, in which FIG. 15(a) is a cross-sectional view through a line A—A in FIG. 14, FIG. 15(b) is a cross-sectional view through a line B—B in FIG. 14, and FIG. 15(c) is a cross-sectional view through a line C—C in FIG. 14.

FIGS. 17(a) to 17(c) are diagrams showing the structure of the semiconductor device shown in FIG. 16, in which FIG. 17(a) is a cross-sectional view through a line A—A in FIG. 16, FIG. 17(b) is a cross-sectional view through a line B—B in FIG. 16, and FIG. 17(c) is a cross-sectional view through a line C—C in FIG. 16.

FIGS. 19(a) to 19(c) are diagrams showing the structure of the semiconductor device shown in FIG. 18, in which FIG. 19(a) is a cross-sectional view through a line A—A in FIG. 18, FIG. 19(b) is a cross-sectional view through a line B—B in FIG. 18, and FIG. 19(c) is a cross-sectional view through a line C—C in FIG. 18.

FIGS. 21(a) to 21(c) are diagrams showing the structure of the semiconductor device shown in FIG. 20, in which FIG. 21(a) is a cross-sectional view through a line A—A in FIG. 20, FIG. 21(b) is a cross-sectional view through a line B—B in FIG. 20, and FIG. 21(c) is a cross-sectional view through a line C—C in FIG. 20.

FIGS. 23(a) to 23(c) are diagrams showing the structure of the semiconductor device shown in FIG. 22, in which FIG. 23(a) is a cross-sectional view through a line A—A in FIG. 22, FIG. 23(b) is a cross-sectional view through a line B—B in FIG. 22, and FIG. 23(c) is a cross-sectional view through a line C—C in FIG. 22.

FIGS. 25(a) to 25(c) are diagrams showing the structure of the semiconductor device shown in FIG. 24, in which FIG. 25(a) is a cross-sectional view through a line A—A in FIG. 24, FIG. 25(b) is a cross-sectional view through a line B—B in FIG. 24, and FIG. 25(c), is a cross-sectional view through a line C—C in FIG. 24.

FIGS. 29(a) to 29(c) are diagrams showing the structure of the semiconductor device shown in FIG. 28, in which FIG. 29(a) is a cross-sectional view through a line A—A in FIG. 28, FIG. 29(b) is a cross-sectional view through a line B—B in FIG. 28, and FIG. 29(c) is a cross-sectional view through a line C—C in FIG. 28.

FIGS. 31(a) to 31(c) are diagrams showing the structure of the semiconductor device shown in FIG. 30, in which FIG. 31(a) is a cross-sectional view through a line A—A in FIG. 30, FIG. 31(b) is a cross-sectional view through a line B—B in FIG. 30, and FIG. 31(c) is a cross-sectional view through a line C—C in FIG. 30.

FIGS. 33(a) to 33(c) are diagrams showing the structure of the semiconductor device shown in FIG. 32, in which FIG. 33(a) is a cross-sectional view through a line A—A in FIG. 32, FIG. 33(b) is a cross-sectional view through a line B—B in FIG. 32, and FIG. 33(c) is a cross-sectional view through a line C—C in FIG. 32.

FIGS. 35(a) to 35(c) are diagrams showing the structure of the semiconductor device shown in FIG. 34, in which FIG. 35(a) is a cross-sectional view through a line A—A in FIG. 34, FIG. 35(b) is a cross-sectional view through a line B—B in FIG. 34, and FIG. 35(c) is a cross-sectional view through a line C—C in FIG. 34.

FIGS. 37(a) to 37(c) are diagrams showing the structure of the semiconductor device shown in FIG. 36, in which FIG. 37(a) is a cross-sectional view through a line A—A in FIG. 36, FIG. 37(b) is a cross-sectional view through a line B—B in FIG. 36, and FIG. 37(c) is a cross-sectional view through a line C—C in FIG. 36.

FIGS. 39(a) to 39(c) are diagrams showing the structure of the semiconductor device shown in FIG. 38, in which FIG. 39(a) is a cross-sectional view through a line A—A in FIG. 38, FIG. 39(b) is a cross-sectional view through a line B—B in FIG. 38, and FIG. 39(c) is a cross-sectional view through a line C—C in FIG. 38.

FIGS. 40(a), 40(b), 40(c) are diagrams each showing an unconnected lead in the semiconductor device according to the fourteenth embodiment of this invention, in which FIG. 40(a) is a cross-sectional view when the unconnected lead is deformed, and FIGS. 40(b), 40(c) are cross-sectional views when the unconnected lead is not deformed.

FIG. 43(a) before bonding

FIG. 43(b) during bonding

FIG. 43(c) after bonding

FIG. 43(d) after sealing

FIG. 44(a) before bonding

FIG. 44(b) during bonding

FIG. 44(c) after sealing

FIG. 45(a) before bonding

FIG. 45(b) during bonding

FIG. 45(c) after sealing

FIG. 46 is an elastomer specification table showing examples of color specifications of an elastomer (elastic structure) used in a semiconductor device (CSP) according to a seventeenth embodiment of this invention.

FIGS. 48(a) to 48(e) are diagrams showing typical elastomer compositions in a semiconductor device according to the eighteenth embodiment of this invention, in which FIGS. 48(a) to 48(d) show a 3-layer structure, FIG. 48(e) shows a 5-layer structure.

FIGS. 51(a), 51(b), 51(c), 51(d) are diagrams showing an example structure of a semiconductor device according to a twenty-first embodiment of this invention, in which FIG. 51(a) is a base view, FIG. 51(b) is a side view, FIG. 51(c) is a partial cut-away plan view, and FIG. 51(d) is a front view.

FIGS. 52(a), 52(b), 52(c) are diagrams showing the structure of the semiconductor device shown in FIG. 51, in which FIG. 52(a) is a cross-sectional view through a line A—A in FIG. 51, FIG. 52(b) is a cross-sectional view through a line B—B in FIG. 51, and FIG. 52(c) is a cross-sectional view through a line C—C in FIG. 51.

FIGS. 53(a), 53(b) are enlarged partial cross-sections showing the structure of the semiconductor device shown in FIG. 52, in which FIG. 53(a) is a diagram showing a part D in FIG. 52(b), and FIG. 53(b) is a diagram showing a part E in FIG. 52(c).

FIGS. 54(a) to 54(f) are diagrams showing an example of a method of manufacturing a thin film wiring substrate used in the semiconductor device according to the twenty-first embodiment of this invention, in which FIGS. 54(a), 54(c), 54(e) are partial plan views, and FIGS. 54(b), 54(d), 54(f) are respectively cross-sections through a line A—A.

FIGS. 55(a) to 55(d) are diagrams showing an example of a method of manufacturing a thin film wiring substrate used in the semiconductor device according to the twenty-first embodiment of this invention, in which FIGS. 55(a), 55(c) are partial plan views, and FIGS. 55(b), 55(d) are respectively cross-sections through a line A—A.

FIGS. 56(a) to 56(f) are diagrams showing an example of a method of manufacturing a thin film wiring substrate used in the semiconductor device according to the twenty-first embodiment of this invention, in which FIGS. 56(a), 56(d) are partial plan views, FIGS. 56(b), 56(e) are respectively cross-sections through a line A—A, and FIGS. 56(c), 56(f) are respectively cross-sections through a line B—B.

FIGS. 57(a) to 57(f) are diagrams showing an example of a method of manufacturing a thin film wiring substrate used in the semiconductor device according to the twenty-first embodiment of this invention, in which FIGS. 57(a), 57(d) are partial plan views, FIGS. 57(b), 57(e) are respectively cross-sections through a line A—A, and FIGS. 57(c), 57(f) are respectively cross-sections through a line B—B.

FIGS. 58(a) to 58(f) are diagrams showing an example of a method of manufacturing a thin film wiring substrate used in the semiconductor device according to the twenty-first embodiment of this invention, in which FIGS. 58(a), 58(d) are partial plan views, FIGS. 58(b), 58(e) are respectively cross-sections through a line A—A, and FIGS. 58(c), 58(f) are respectively cross-sections through a line B—B.

FIGS. 59(a), 59(b), 59(c) are diagrams showing an example of a method of manufacturing a thin film wiring substrate used in the semiconductor device according to a twenty-second embodiment of this invention, in which FIG. 59(a) is a side view, FIG. 59(b) is a plan view, and FIG. 59(c) is a front view.

FIGS. 60(a), 60(b), 60(c), 60(d) are diagrams showing an example of the structure of a thin film wiring substrate according to a twenty-third embodiment of this invention, in FIG. 60(a) is a base view, FIG. 60(b) is a side view, FIG. 60(c) is a plan view, and FIG. 60(d) is a front view.

FIGS. 61(a), 61(b) are diagrams showing an example of a state when sealing is complete in a manufacturing method according to the twenty-third embodiment of this invention.

FIGS. 62(a), 62(b), 62(c) are diagrams showing cross-sections through the plan view shown in FIG. 61(a), in which FIG. 62(a) is a cross-section showing the plane A—A, FIG. 62(b) is a cross-section showing the plane B—B, and FIG. 62(c) is a cross-section showing the plane C—C.

FIGS. 63(a), 63(b), 63(c) are diagrams showing an example of a state when sealing is complete in a manufacturing method according to the twenty-third embodiment of this invention, in which FIG. 63(a) is a plan view, FIG. 63(b) is a side view, and FIG. 63(c) is a base view.

FIGS. 65(a) to 65(e) are diagrams each showing an example structure of a semiconductor device according to a twenty-fourth embodiment of this invention, in which FIG. 65(a) is a base view, FIG. 65(b) is a side view, FIG. 65(c) is a plan view, FIG. 65(d) is a front view, and FIG. 65(e) is a cross-section through a line C—C in FIG. 65(c).

FIGS. 66(a), 66(b), 66(c) are diagrams showing an example structure of a semiconductor device according to a twenty-fifth embodiment of this invention, in which FIG. 66(a) is a plan view, FIG. 66(b) is a side view, and FIG. 66(c) is a base view.

FIGS. 69(a), 69(b) are diagrams each showing an example of a state when sealing is complete in a manufacturing method according to the twenty-fifth embodiment of this invention, in which FIG. 69(a) is a base view, and FIG. 69(b) is a base view showing a semiconductor chip removed.

DESCRIPTION OF THE PREFERRED EMBODIMENTS

This invention will now be described in detail with reference to the attached drawings.

Embodiment 1

Figure 2A:
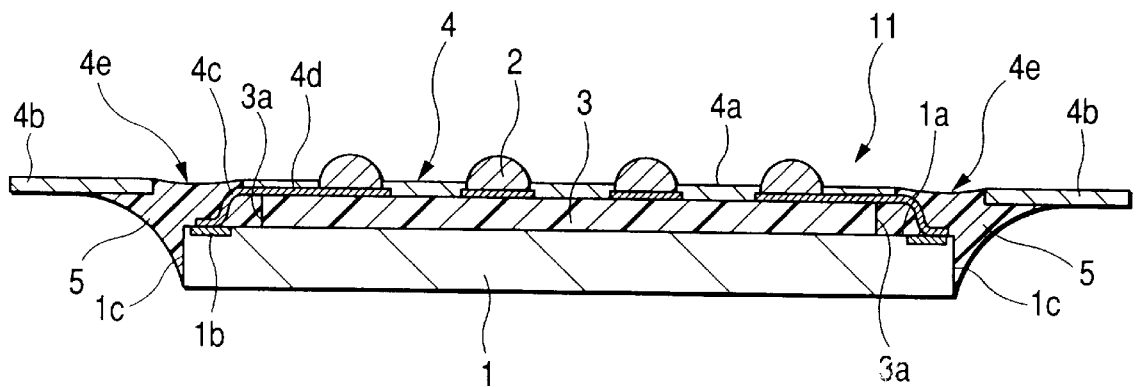
Figure 2B:
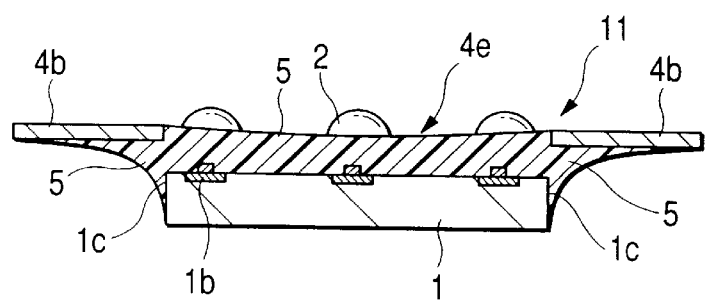
Figure 2C:
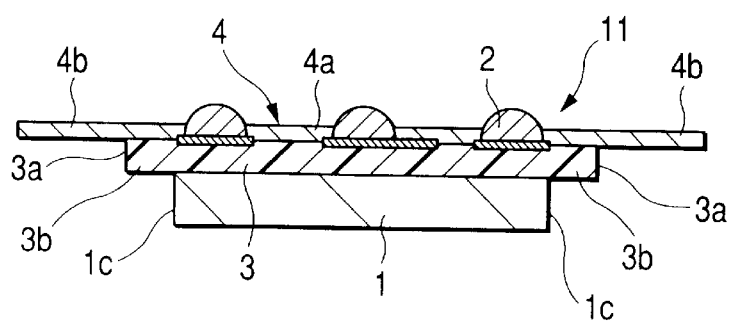
Figure 6A:
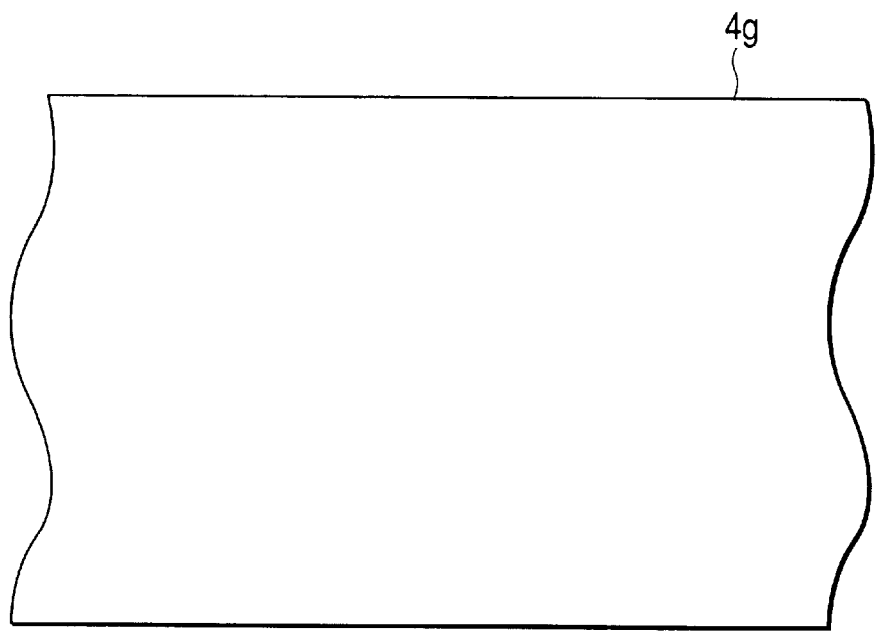
FIGS. 6(a), 6(b) are partial plan views showing a typical method of manufacturing a thin film wiring substrate used for a semiconductor device (CSP) according to the first embodiment of this invention.
Figure 6B:
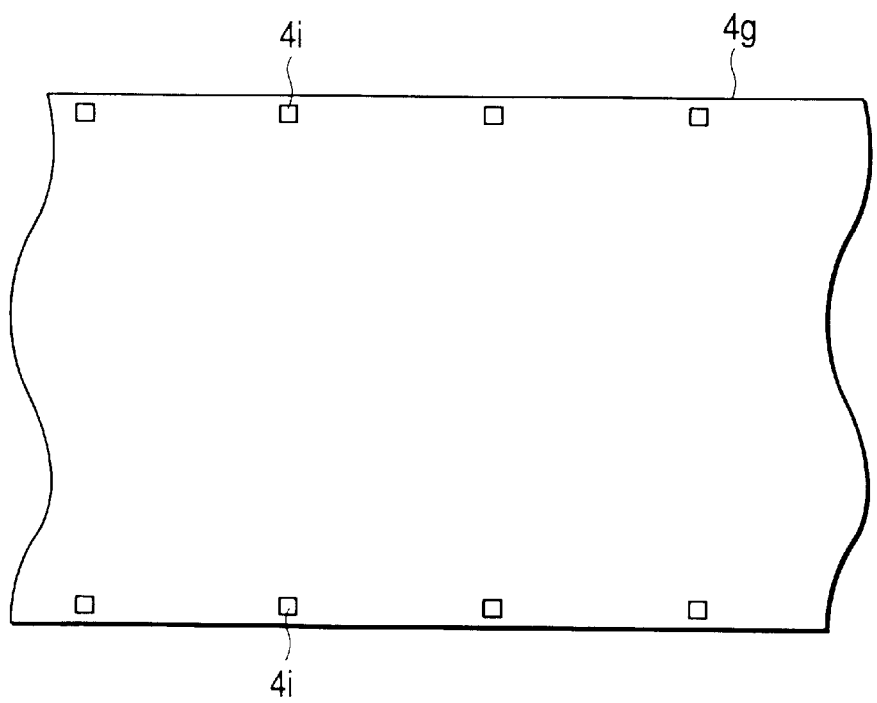
Figure 9A:
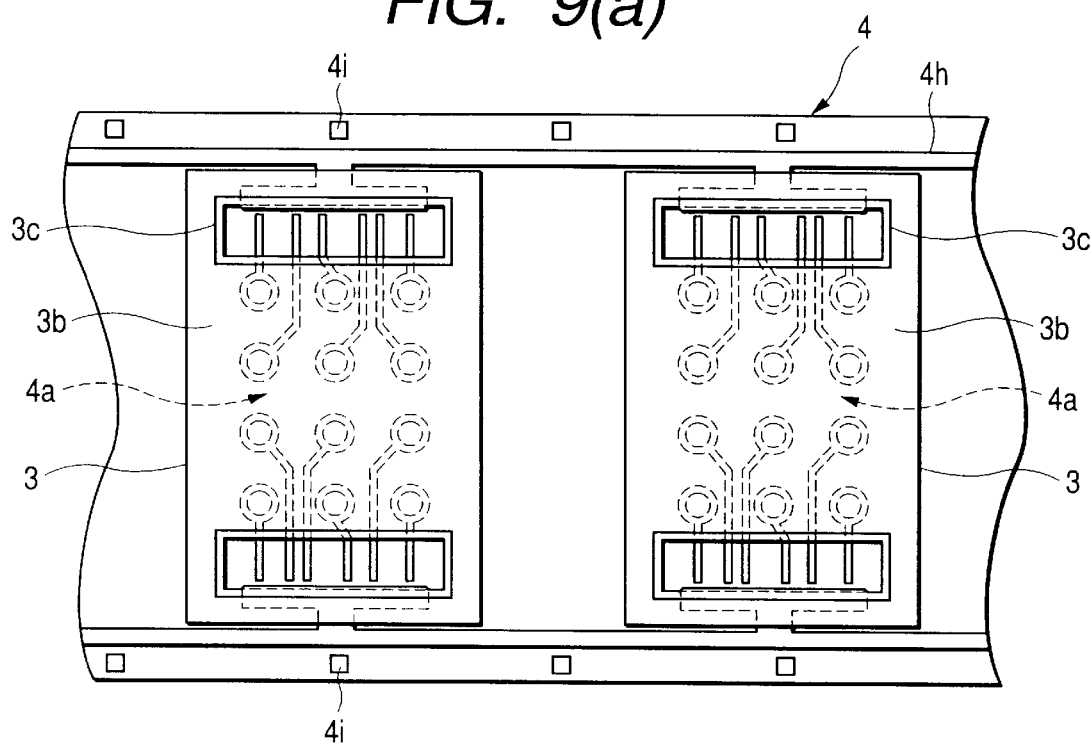
Figure 9B:
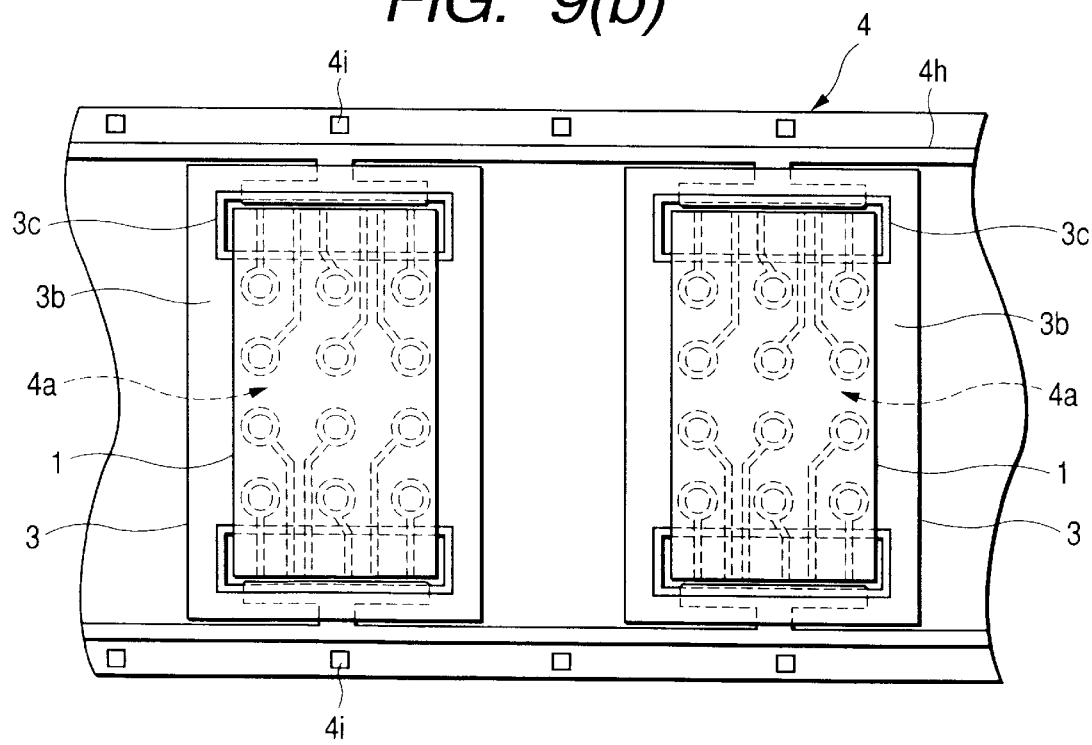
Figure 10:
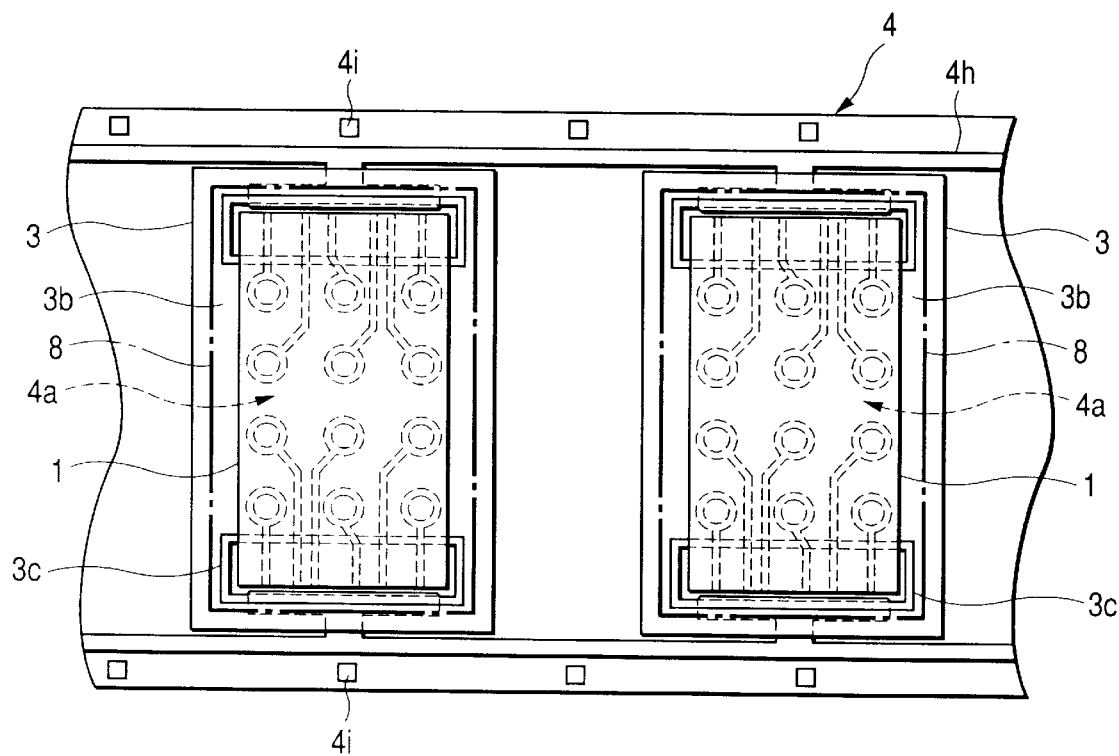
FIG. 10 is a partial plan view showing an example of a cutting position in a method of manufacturing a semiconductor device (CSP) according to the first embodiment of this invention.
Figure 11A:
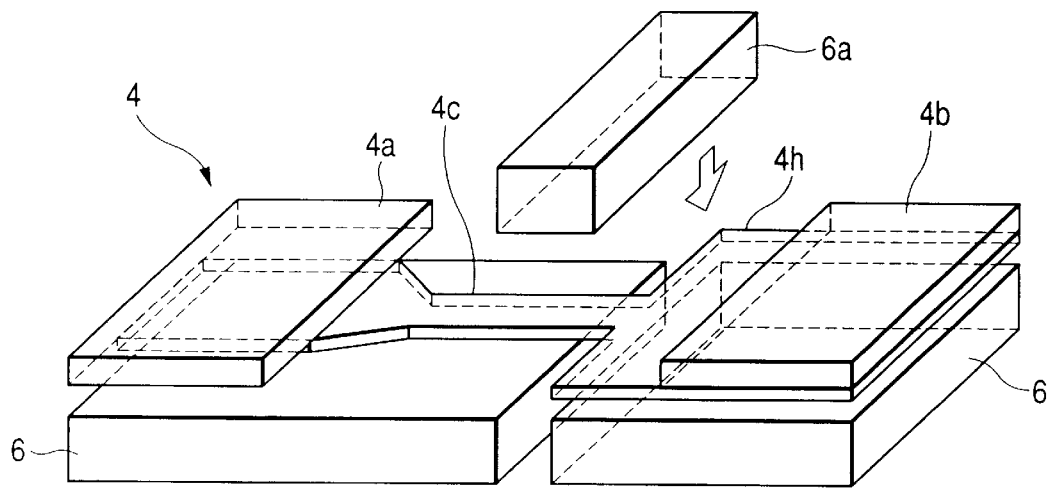
FIGS. 11(a), 11(b) are perspective views showing an example of a lead cutting method in a method of manufacturing the semiconductor device (CSP) according to the first embodiment of this invention.
Figure 11B:
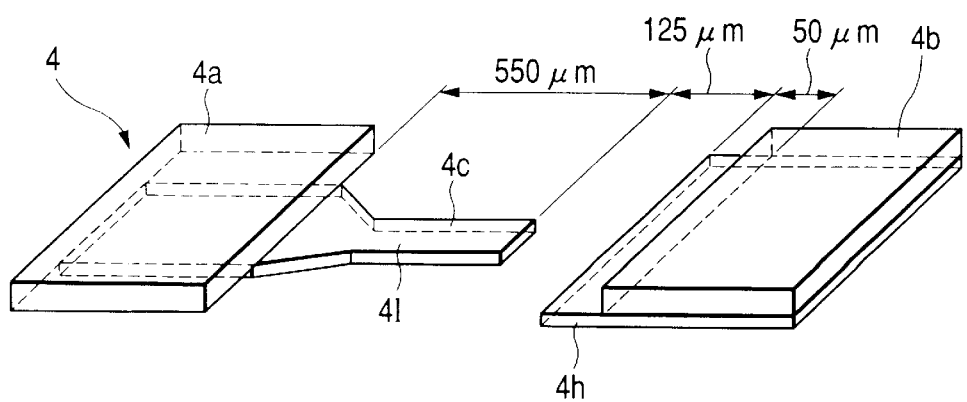
Figure 12A:
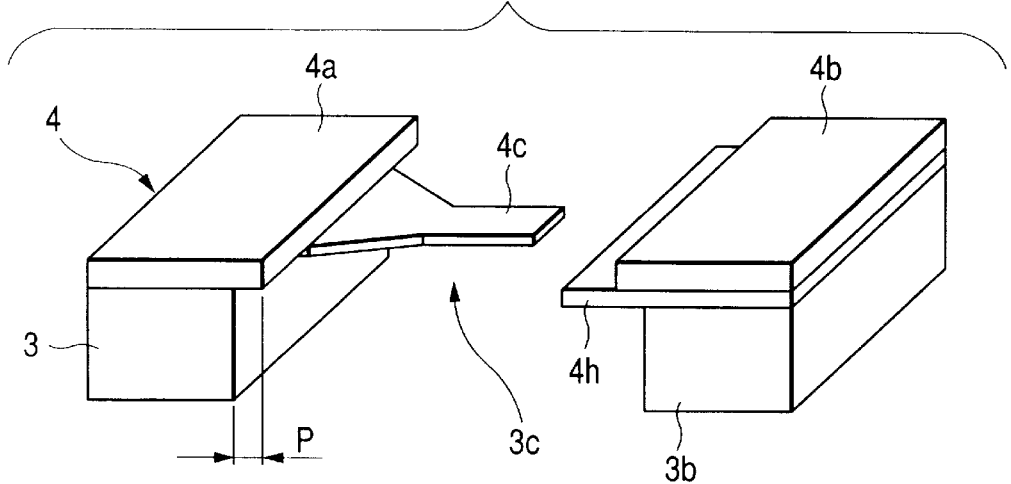
FIGS. 12(a), 12(b), 12(c) are perspective views showing an example of an elastomer attachment state in a method of manufacturing a semiconductor device (CSP) according to the first embodiment of this invention.
Figure 12B:
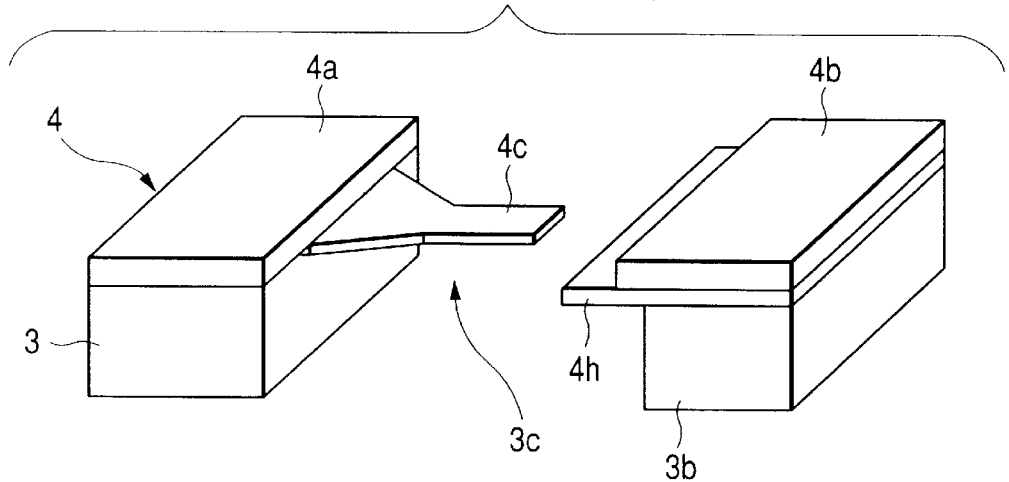
Figure 12C:
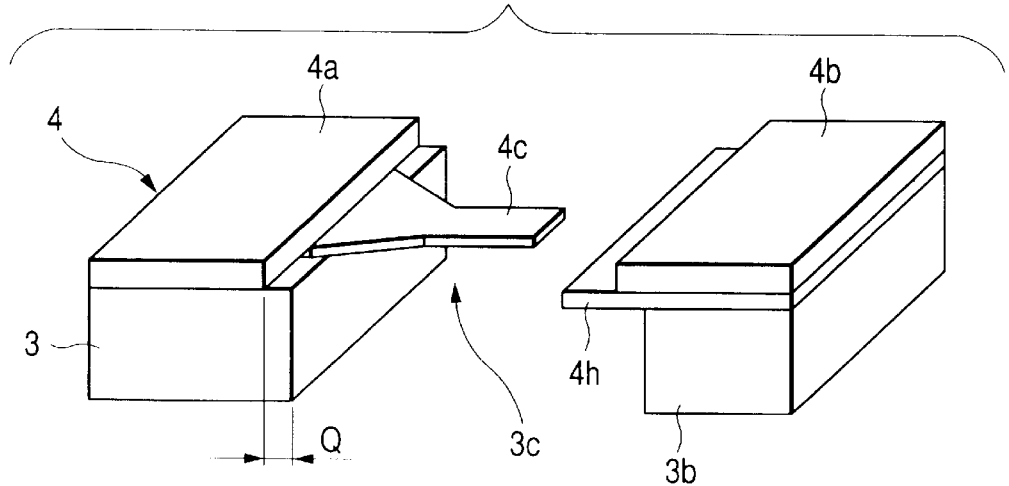
Figure 13A:
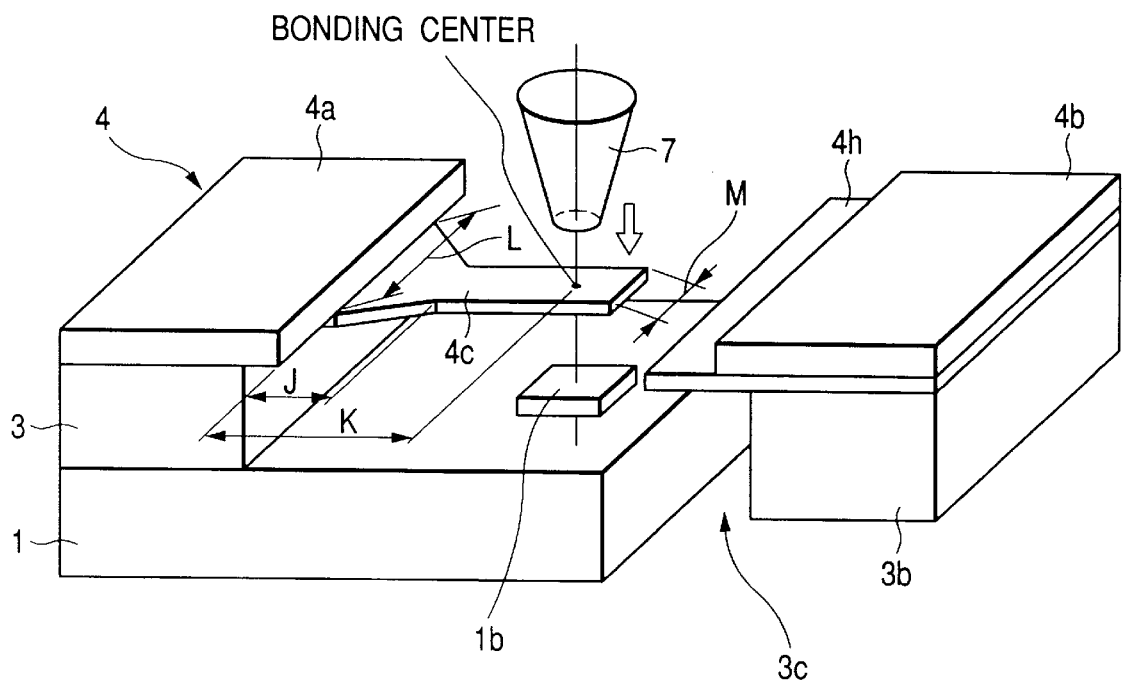
FIGS. 13(a), 13(b) are perspective views showing an example of a lead bonding method in a method of manufacturing a semiconductor device (CSP) according to the first embodiment of this invention.
Figure 13B:
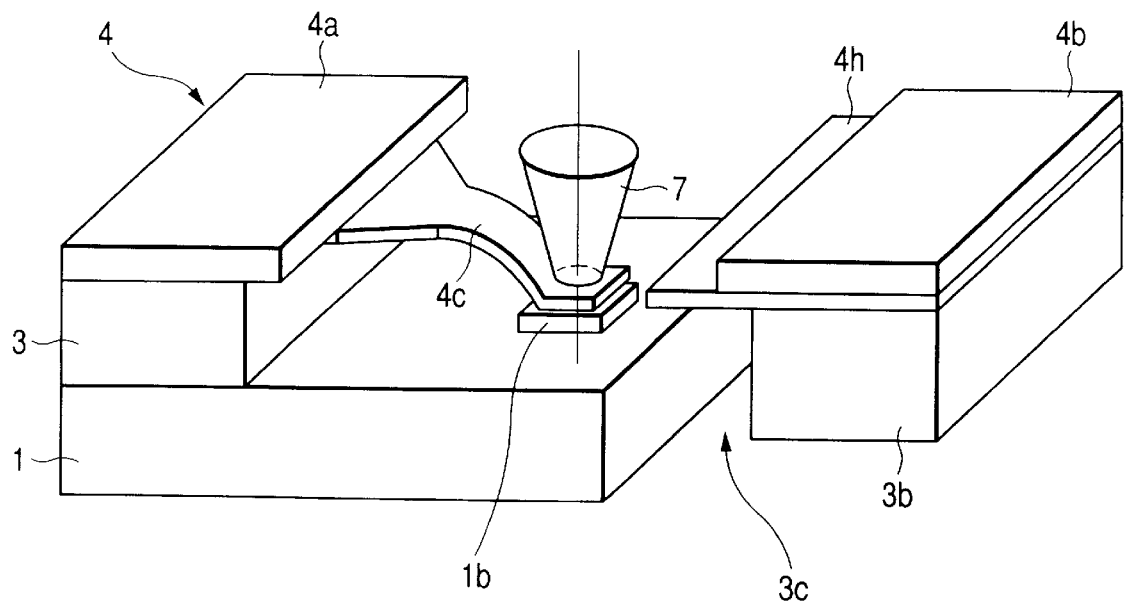
Figure 27:
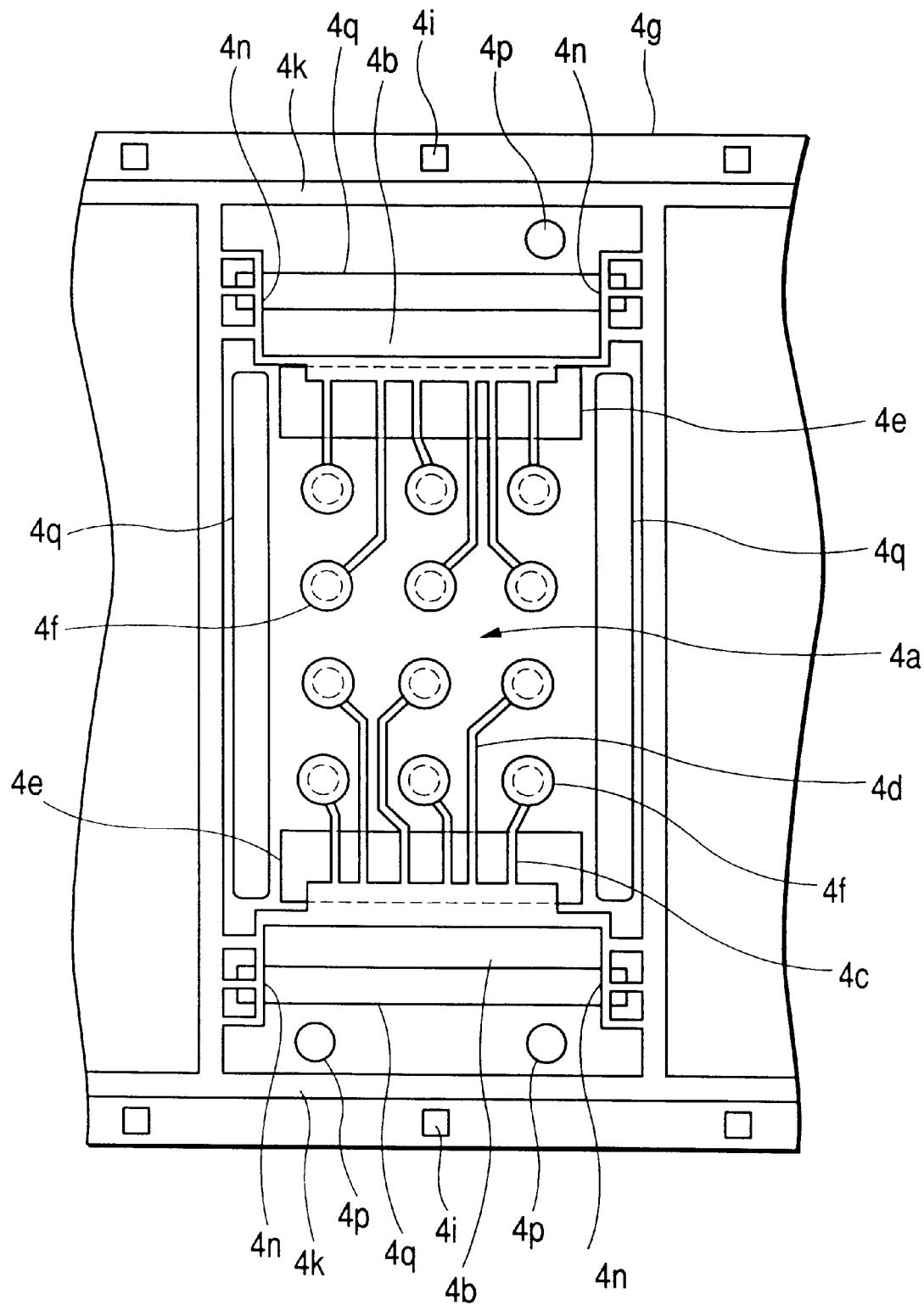
FIG. 27 is an enlarged partial view showing the detailed structure of the thin film wiring substrate shown in FIG. 8.

FIG. 1 is a plan view through the sealing parts of a typical structure of a semiconductor device (CSP) according to a first embodiment of this invention. FIGS. 2(a) to 2(c) are diagrams showing the structure of the semiconductor device shown in FIG. 1. FIG. 2(a) is a cross-sectional view through a line A—A in FIG. 1, FIG. 2(b) is a cross-sectional view through a line B—B in FIG. 1, FIG. 2(c) is a cross-sectional view through a line C—C in FIG. 1. FIGS. 3 (a,b,c,d) are specification tables showing example specifications of parts used in the semiconductor device shown in FIG. 1. FIG. 4 is a manufacturing sequence showing a typical process for manufacturing the semiconductor device shown in FIG. 1. FIG. 5 is a chart showing typical processing conditions in each stage of the production process shown in FIG. 4. FIG. 6, FIG. 7 and FIG. 8 are partial plan views showing a typical method of manufacturing a thin film wiring substrate used for a semiconductor device (CSP) according to the first embodiment of this invention. FIGS. 9(a) 9(b) are diagrams each showing a typical method of manufacturing the semiconductor device (CSP) according to the first embodiment of this invention. FIG. 9(a) is a partial plan view showing an elastomer attachment, FIG. 9(b) is a partial plan view showing a semiconductor chip attachment. FIG. 10 is a partial plan view showing an example of a cutting position in a method of manufacturing a semiconductor device (CSP) according to the first embodiment of this invention. FIGS. 11(a), 11(b) are perspective views showing an example of a lead cutting method in a method of manufacturing the semiconductor device (CSP) according to the first embodiment of this invention. FIGS. 12(a), 12(b), 12(c) are perspective views showing an example of an elastomer attachment state in a method of manufacturing a semiconductor device (CSP) according to the first embodiment of this invention. FIGS. 13(a), 13(b) are perspective views showing an example of a lead bonding method in a method of manufacturing a semiconductor device (CSP) according to the first embodiment of this invention. FIG. 27 is an enlarged partial view showing the detailed structure of the thin film wiring substrate shown in FIG. 8.

A semiconductor device (CSP11) according to the first embodiment shown by FIG. 1 and FIG. 2 is a small structure whereof the package size is near the chip size. It comprises a semiconductor chip 1 having a main surface 1a and an electrode pad 1b (connection terminal or bonding pad) 1b formed on the outer peripheral part of the main surface 1a, and bump electrodes 2 which are external terminals arranged on the inside of the semiconductor chip 1. This structure, wherein a pad is formed on the periphery of the chip and bump electrodes are arranged inside the chip, will hereafter be referred to as a peripheral pad fan-in CSP.

As the external terminals are bump electrodes, the CSP11 is also a pole grid array.

Describing the structure of this CPS11, it comprises an elastomer 3 (elastic structure) arranged on the main surface 1a of the semiconductor chip 1 so as to leave electrode pads 1b exposed, a thin film wiring substrate 4 comprising a substrate main body 4a provided with wiring 4d of which one end is electrically connected to the electrode pads 1b of the semiconductor chip 1 via leads 4c and the other ends are electrically connected to the bump electrodes 2, openings 4e for exposing the electrode pads 1b, and substrate protruding parts 4b which protrude beyond these openings 4e and the semiconductor chip 1, and sealing parts 5 which seal the electrode pads 1b of the semiconductor chip 1 and seal the leads 4c of the thin film wiring substrate 4, the substrate body 4a and the substrate protruding parts 4b of the thin film wiring substrate 4 being formed in a one-piece construction. (For the purpose of this invention, "wiring" shall be understood to mean parts formed on the tape, and "leads" shall be understood to mean parts protruding from the tape including the wiring.)

The plan view of the CSP11 shown in FIG. 1 is a view through the seal part 5 shown in FIG. 2 in order to show the electrode pads 1b of the semiconductor chip 1 and the leads 4c of the thin film wiring substrate 4.

Therefore, in the plan view of the CSP11 shown in FIG. 1, the aforesaid sealing parts 5 are omitted, although sealing parts 5 shown in FIG. 2 are actually formed in the openings 4e of the thin film wiring substrate 4 of the CSP11 shown in FIG. 1 (this is also the case hereafter for Embodiments 2 to 20).

In this first embodiment, plural electrode pads 1b (herein, six at one side) are disposed on the periphery of each of the two short sides at right angles (hereinafter referred to as the short side direction) to the longitudinal direction of the main surface 1a of the rectangular semiconductor chip 1, and twelve bump electrodes 2 which are external terminals are therefore disposed in a grid shape covering a plan view area over the main surface of the semiconductor chip 1.

Therefore, one each of the rectangular openings 4e is formed at a position corresponding to an outer edge facing the short side direction of the main surface of the semiconductor chip 1 in the thin film wiring substrate 4.

As a result, the plural electrode pads 1b facing the short side direction of the semiconductor chip 1 are exposed by the openings 4e of the thin film wiring substrate 4 which are provided at corresponding positions when the semiconductor chip 1 is attached to the elastomer 3.

The thin film wiring substrate 4 of the CSP11 according to the first embodiment comprises a substrate body part 4a comprising wiring 4d, two of the openings 4e, and substrate protruding parts 4b which protrude beyond the substrate body 4a and two openings 4e.

When the semiconductor chip 1 is attached to the elastomer 3, the substrate body 4a, elastomer 3 and semiconductor chip 1 are laminated together, and the substrate protruding parts 4b of the thin film wiring substrate 4 then protrude in an anvil shape beyond the semiconductor chip 1.

Figure 8A:
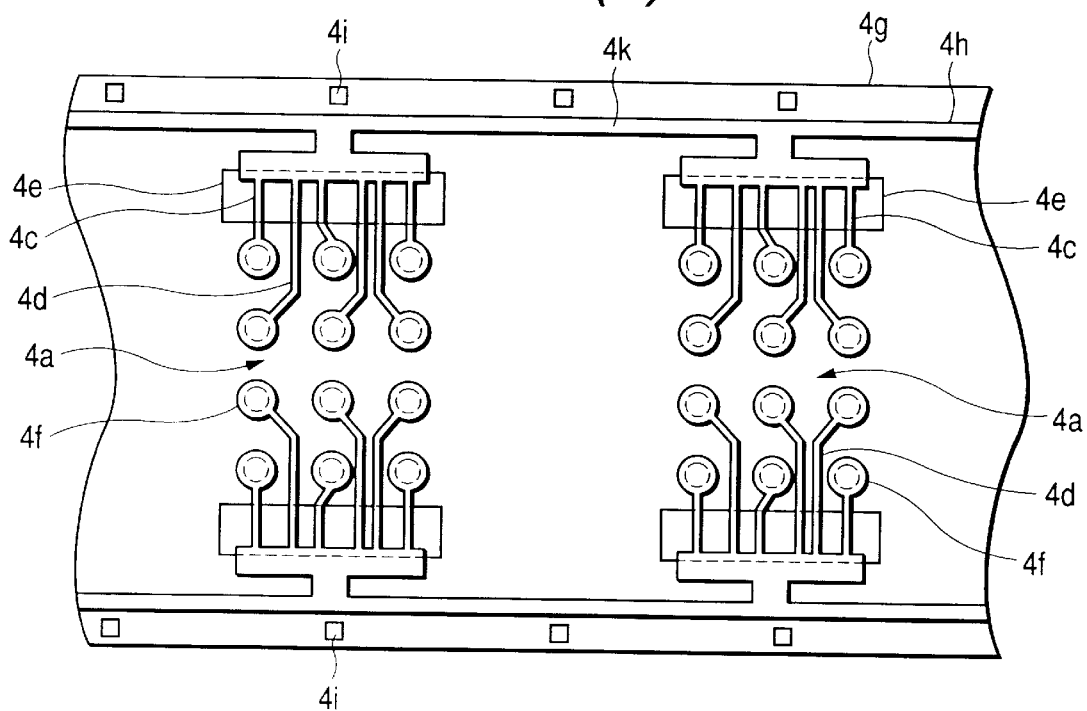
FIGS. 8(a), 8(b) are partial plan views showing a typical method of manufacturing a thin film wiring substrate used for a semiconductor device (CSP) according to the first embodiment of this invention.

Twelve bump lands 4f (FIG. 8(a)) which are electrically connected to the wiring 4d and on which the bump electrodes 2 are mounted, are provided in the substrate body 4a.

The elastomer 3 is an insulating elastic material which supports the semiconductor chip 1, and is arranged between the thin film wiring substrate 4 and semiconductor chip 1. The elastomer 3 according to the first embodiment comprises protruding parts 3b (elastic protruding parts) which protrude beyond the semiconductor chip 1. After assembling the CSP11, a predetermined side faces 3a of the elastomer 3 (herein, the two side faces 3a in the same direction as the longitudinal direction of the semiconductor chip 1) are exposed to the outside.

As shown in FIG. 1 or FIG. 2(c), when the elastomer 3 is attached to the thin film wiring substrate 4, the elastomer protruding parts 3b which protrude beyond the semiconductor chip 1 in the elastomer 3 are laid over the substrate protruding parts 4b of the thin film wiring substrate 4.

The sealing parts 5 are formed by sealing the electrode pads 1b of the semiconductor chip 1 and the leads 4c connected to them, the whole of the opposite side faces 1c in the short side direction of the semiconductor chip 1, and the area near both ends of the two opposite side faces 1c in the longitudinal direction of the semiconductor chip 1 with sealing resin. As the substrate protruding parts 4b of the thin film wiring substrate 4 are formed in the vicinity of the semiconductor chip 1, the sealing resin forms a bridge between (straddles) the substrate protruding parts 4b and the semiconductor chip 1 in the sealing parts 5.

The specification of each part of the CSP11 (materials, dimensions and thickness, etc.) will now be described referring to FIGS. 3(a,b,c,d). It should however be understood that these specifications are only given as examples, and the invention is not to be construed as being limited in any way by them.

The tape which is the base material of the thin film wiring substrate 4 is formed of polyimide resin, and its thickness is of the order of 25 to 75 μm. The wiring 4d (comprising the leads 4c and bump lands 4f) provided in the thin film wiring substrate 4 is copper foil having a thickness of the order of 18 to 25 μm. The wiring 4d is plated with Au plating to a thickness of 1.5 μm on both sides, or Au/Ni plating of different thickness on the side of the electrode pad 1b and the side of the bump electrode 2.

In the thin film wiring substrate 4 used in the first embodiment, the wiring 4d is a single layer structure as shown in FIG. 2(a). It is also "single layer back wiring" wherein the wiring 4D is formed only on the under surface of the tape base material (tape base material 4g in FIG. 6(a)).

The elastomer 3 is a three-layer structure (FIG. 47) comprising a base layer (skeleton layer 3d, referred to also as core layer) having adhesive layers 3e on both sides. Examples of its application are specification ① and specification ② shown in FIGS. 3(a,b,c,d). Details of specification ① are given in Japanese Patent Application No. Hei 9-149106 and details of specification ② are given in Japanese Patent Application No. Hei 8-136159.

The elastomer 3 used in the first embodiment is also colorless, therefore the elastomer 3 according to the first embodiment is an effectively transparent structure which transmits light.

From the viewpoints of porosity and water repelling properties, it is also desirable that the base layer (skeleton layer 3d) of the elastomer 3 is formed of a porous fluoride resin, i.e. it is desirable to use the elastomer of specification ①.

Herein, the elastomer 3 formed from a porous fluoride resin comprises a skeleton layer 3d having a 3-dimensional mesh structure.

This 3-dimensional mesh structure is a non-woven fabric formed by 3-dimensional entwining of a fibrous compound.

The sealing resin, which is the sealing material for forming the sealing parts 5, has the specification 1̂ or the specification ① shown in FIGS. 3(a,b,c,d).

During cure bake after sealing, voids tend to form in the solvent type liquid resin when the solvent vaporizes, and it is therefore desirable to use the resin of specification ①.

The sealing resin used in the CSP11 of the first embodiment is a material of relatively high volatility. However, it is possible to use sealing resin of high volatility by increasing the displacement time of a potting nozzle, not shown, during the coating step (e.g. approximately 30 seconds for coating the six electrode pads 1b on one side of the semiconductor chip 1), or by heating the sealing resin, and it is thus possible to form a bridge of sealing resin between the substrate protruding parts 4b and semiconductor chip 1.

It is also preferable to use a resin containing silica to reduce residual stress due to contraction during seal cure, and more preferable to use a resin containing at least 50 weight percent silica.

The material of the bump electrode 2 is Sn/Pb eutectic solder or other high melting point solder, or Au-plated Ni or the like, and its diameter is of the order of 0.3–0.6 mm.

The CSP11 (semiconductor device) of the first embodiment offers the following advantages.

The substrate body 4a and substrate protruding parts 4b of the thin film wiring substrate 4 are formed in a one-piece construction. As the substrate protruding parts 4b are not a separate structure from the substrate body 4a, it is not necessary to form the substrate protruding parts 4b from costly materials.

Therefore, the cost of manufacturing the CSP11 (semiconductor device) is reduced.

As the substrate protruding parts 4b protrude beyond the openings 4e in the thin film wiring substrate 4, the sealing parts 5 may be formed as a bridge between the substrate protruding parts 4b and the semiconductor chip 1 when the sealing resin is applied via the openings 4e.

As a stable seal is obtained sealing properties are improved, and as a result, humidity resistance is more reliable.

The sealing resin contains at least 50 weight percent silica, so residual stress due to contraction in cure bake can be reduced.

Therefore, the reliability of the sealing parts 5 is improved.

The base layer of the elastomer 3 which forms the elastic structure is constructed of a porous fluoride resin, and the two opposite side faces 3*a* of the elastomer 3 in the same direction as the longitudinal direction of the semiconductor chip 1 are exposed to the outside. Therefore, water vapor due to moisture absorbed during reflow can be released to the outside, reflow properties are improved, and entry of water into the CSP11 can be prevented by the water repelling properties of the fluoride in the porous fluoride resin.

As a result, degradation of electrical properties of the CSP11 is reduced.

Next, the method of manufacturing the CSP11 (semiconductor device) of the first embodiment will be described together with the advantages gained therefrom.

The method will be described in the sequence shown in FIG. 4 referring to the process conditions shown in FIG. 5.

The elastomer 3 shown in FIG. 9, FIG. 10, FIG. 12 and FIG. 13 comprises openings 3*c*. These figures describe the method of manufacturing the CSP16, 17 of the sixth or seventh embodiments described later, but as the first embodiment is the same as regards the basic manufacturing method, FIG. 9, FIG. 10, FIG. 12 and FIG. 13 will be used also in the first embodiment.

First, the thin film wiring substrate 4 comprising the substrate body 4*a* comprising the wiring 4*d*, and the substrate protruding parts 4*b* which protrude beyond the openings 4*e* in which the leads 4*c* are connected to the wiring 4*d*, is provided.

The method of manufacturing the thin film wiring substrate 4 will be described referring to FIG. 6 to FIG. 8.

First, the tape base material 4*g* comprising the polyimide resin shown in FIG. 6(*a*) is prepared. An adhesive for attaching the copper foil 4*h* shown in FIG. 7(*b*) is coated on the top and under surfaces of this base tape 4*g*.

Next, preparing holes 4*i* for tape feed are formed at an approximately equal interval on both sides of the tape base material 4*g* as shown in FIG. 6(*b*).

Next, twelve bump openings 4*j* and two wiring join holes 4*e* on both sides are formed by stamping as shown in FIG. 7(*a*), and the copper foil 4*h* is laminated on the tape base material 4*g* as shown in FIG. 7(*b*).

The copper foil 4*h* is then fashioned into a desired pattern by etching as shown in FIG. 8(*a*) so as to form a wiring pattern.

This forms the bump lands 4*f* and a power supply line 4*k*.

In order to make the aforesaid gold plating electrically react after plating the copper foil 4*h*, adjacent power supply lines 4*k* must be connected together.

After etching the copper foil 4*h* to form the wiring pattern, the copper foil 4*h* is gold plated. The specification of this gold plating is that of the wiring plating shown in FIGS. 3(*a,b,c,d*). It may be gold plating having a thickness of 1.5 $\mu$m (wiring plating ① shown in FIGS. 3(*a,b,c,d*)), gold/nickel differential thickness plating (wiring plating ② shown in FIGS. 3(*a,b,c,d*)), or another type of plating.

The wiring leads which are connected together as shown in FIG. 8(*a*) are then cut by a punch die 6*a* of a cutter 6 shown in FIG. 11(*a*) so as to separate the leads 4*c* as shown in FIG. 8(*b*).

As regards the width of the cutting blade of the punch die 6, it is desirable to use a small cutting blade having a width of the order of 50 to 200 $\mu$m and more preferably 100 to 150 $\mu$m so that the leads 4*c* can be fashioned into a beam shape 41 after cutting as shown in FIG. 11(*b*).

By using a small cutting blade of the order of 125 $\mu$m, the cut parts of the leads 4*c* can be formed with a dimension of the order of 125 $\mu$m, and as a result, the distance between the semiconductor chip 1 and the substrate protruding parts 4*b* can be shortened when the semiconductor chip 1 (FIG. 1) is mounted.

The sealing areas of the sealing parts 5 can therefore be made narrow, so sealing properties are improved.

Also as the distance between the semiconductor chip 1 and the substrate protruding parts 4*b* can be made short, the CSP11 cam be made compact.

By cutting so as to fashion the leads 4*c* into the beam shape 41 shown in FIG. 11(*b*), the thin film wiring substrate 4 shown in FIG. 8(*b*) is produced.

The detailed structure of the thin film wiring substrate 4 used in the first embodiment will now be described referring to FIG. 8 and FIG. 27.

As shown in FIG. 27, four long holes 4*q* effectively corresponding to the four sides of the substrate body 4*a* are formed around the substrate body 4*a*.

The purpose of these holes 4*q* is to reduce the cross-sectional area when the substrate body 4*a* is cut off, improve ease of cutting, and to lessen distortion when winding up or cutting the thin film wiring substrate 4 which is in the form of a long thin tape.

Positioning holes 4*p* for positioning during cutting are provided outside the upper and lower long holes 4*q* of the substrate body 4*a* (according to this embodiment a total of three holes is provided, i.e. one upper one and two lower ones, but there is no limit on the number of these positioning holes 4*p* if they are provided outside both the upper and lower long holes 4*q*.

Recognition patterns 4*n* formed of the same copper foil as the wiring pattern are also provided in these upper and lower long holes 4*q* of the substrate body 4*a*.

These recognition patterns 4*n* are used to recognize the position of the thin film wiring substrate 4 during cutting, etc., and are such that they can be recognized also from the reverse side of the thin film wiring substrate 4 (side on which there is no wiring pattern) during bonding. Specifically, they straddle the ends of the long holes 4*q* so that they can be recognized from the top surface and under surface of the thin film wiring substrate 4.

The thin film wiring substrate 4 shown in FIG. 27 comprises plural substrate bodies 4*a* arranged horizontally in a row with respect to the feed direction, however plural rows of the substrate bodies 4*a* (e.g. two) may be arranged horizontally.

In this case, the efficiency of manufacturing the CPU11 may be improved.

Subsequently, thin film wiring substrate supply 20 and elastomer supply 21 shown in FIG. 4 are performed, and elastomer attachment 22 is performed.

To attach the elastomer 3, the substrate body 4*a* of the thin film wiring substrate 4 and elastomer 3 are joined as shown in FIG. 9(*a*) based on elastomer attachment conditions whereof an example is given in FIG. 5.

In this way, the thin film wiring substrate 4 is assembled with the elastomer 3.

When the elastomer 3 is attached, there may be three positional relationships of the elastomer 3 and substrate body 4*a* as shown in FIGS. 12(*a*), 12(*b*), 12(*c*).

First, FIG. 12(*a*) shows the case where the edge of the substrate body 4*a* protrudes beyond the elastomer 3 by an protruding amount P.

FIG. 12(b) shows the case where the edge of the substrate body 4a and the edge of the elastomer are perfectly aligned. FIG. 12(c) shows the case where the edge of the substrate body 4a falls short of the elastomer 3 by an amount Q.

In general, during heat curing after applying a sealing material (herein, a sealing resin), volatile components of the sealing material are produced as volatile gases. As the specific gravity of these volatile gases is less than that of the sealing material, the volatile gases escape to the outside from the upper part of the sealing material.

However, when a P value predetermined range described hereafter is exceeded and the edge of the elastomer 3 does not protrude to the edge of the substrate body 4a (P>300 μm), volatile gases produced further inside than the edge of the substrate body 4a cannot escape to the outside of the sealing material as the upper part is obstructed by the edge of the substrate body 4a, so these gases remain as bubbles in the sealing material.

After heat curing of the sealing material, part of the components of the volatile gases in the bubbles gradually escape to the outside through minute (intermolecular) gaps in the sealing material, so the internal pressure of the bubbles is released.

As a result, voids are formed in the sealing material where the bubbles occur.

The voids create unfilled spaces in areas which should be filled by sealing material, and have an adverse effect on the humidity resistance and temperature cycle reliability of the semiconductor device.

It is therefore desirable that the value of P lies within a P value predetermined range of $0 \leq P \leq 300$ μm, and preferably $0 \leq P \leq 100$ μm, so that the escape path of the volatile gases is not obstructed by the substrate body 4a, and so that the volatile gases produced can be released outside the sealing material.

If this is done, voids are not formed in the sealing material.

On the other hand, when a Q value predetermined range described hereafter is exceeded and the edge of the elastomer 3 protrudes beyond the edge of the substrate body 4a (Q>100 μm), part of the leads 4c is fixed by the elastomer 3, so a correct wiring configuration cannot be formed when the leads 4c are bonded.

This has an adverse effect on temperature cycle reliability.

It is therefore desirable that the position of the edge of the elastomer 3 relative to the edge of the substrate body 4a is within a Q value predetermined range of for example $0 \leq Q \leq 100$ μm, and preferably $0 \leq Q \leq 50$ μm, so that correct bonding of the leads 4c can be performed.

Hence, by ensuring that P and Q are within the predetermined ranges, a CSP11 of high reliability can be manufactured free of voids in the sealing material and wherein the leads 4c are correctly bonded.

Subsequently, chip supply 23 (FIG. 4) is performed wherein the semiconductor chip 1 is supplied having the electrode pads 1b on the outer periphery of the main surface 1a as shown in FIG. 2(a). Chip attachment 24 shown in FIG. 4 is then performed based on the chip attachment conditions shown in FIG. 5.

Herein, in the chip attachment 24, the main surface 1a of the semiconductor chip 1 is joined to the elastomer 3 as shown in FIG. 2(a) leaving the electrode pads 1b of the semiconductor chip 1 exposed in the openings 4e of the thin film wiring substrate 4, as shown in FIG. 1.

Specifically, the semiconductor chip 1 is attached to the top of the elastomer 3 as shown in FIG. 9(b).

Subsequently, an elastomer cure bake 25 shown in FIG. 4 is performed based on the post-chip attachment cure conditions shown in FIG. 5 so as to raise the joining strength of the elastomer 3 and semiconductor chip 1.

Next, inner lead connections 26 shown in FIG. 4 is performed based on the inner lead connection conditions shown in FIG. 5. Two sets of inner lead connection conditions ① and ② are shown in FIG. 5, however the inner lead connection conditions are not limited to this.

First, a bonding tool 7 is lowered to a predetermined position as shown in FIG. 13(a), then one of the leads 4c of the thin film wiring substrate 4 is pressed onto the corresponding electrode pad 1b on the semiconductor chip 1 by the bonding tool 7 so that the lead 4c and the electrode pad 1b are electrically connected.

The bonding method of the first embodiment is single bonding.

After bonding, the lead 4c is pushed up by the bonding tool 7 so that it is just above the electrode pad 1b. If a value obtained by dividing the stress produced in the taper-shaped tip of the lead 4c by the stress produced at the edge of the substrate body 4a is defined as a bending stress ratio alpha, this bending stress ratio α is given by the following expression from the dimensions of the taper-shaped lead 4c:

$$\alpha =:L \times (K-J)/(M \times K) \quad \text{(FIG. 13(a))}$$

The dimensions and shape of the lead 4c are therefore designed such that the bending stress ratio α is within the range 1.0 to 1.75.

Subsequently, supply of sealing resin which is the sealing material, i.e. a sealing material supply 27, is performed as shown in FIG. 4.

Specifically, a resin sealing 28 shown in FIG. 4 is performed using a sealing material (sealing resin) shown in the sealing material specifications of FIGS. 3(a,b,c,d).

In this step, the sealing resin is allowed to drip from the opening 4e of the thin film wiring substrate 4 shown in FIG. 1 by a potting method using a potting nozzle, not shown, and the electrode pad 1b of the semiconductor chip 1 and lead 4c of the thin film wiring substrate 4 are sealed so as to form the sealing parts 5. The drip time may be for example 30 seconds for the openings 4e on one side.

As the space between the substrate protruding parts 4b and semiconductor chip 1 can be sealed in a bridge-like fashion in the CSP11 of the first embodiment, a stable resin sealing 28 can be performed, and the humidity resistance of the sealing parts 5 can therefore be made more reliable.

Next, a sealing material cure bake 29 shown in FIG. 4 is performed based on the post-seal curing conditions shown in FIG. 5 so as to harden the sealing parts 5.

Figure 7A:
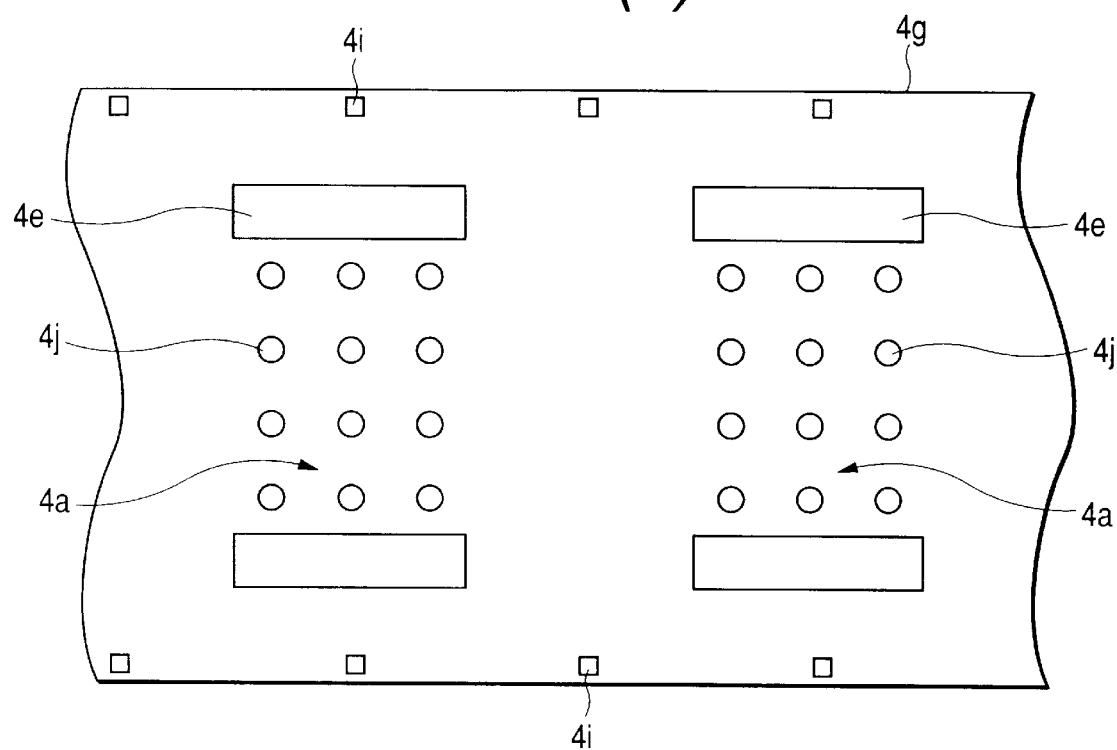
FIGS. 7(a), 7(b) are partial plan views showing a typical method of manufacturing a thin film wiring substrate used for a semiconductor device (CSP) according to the first embodiment of this invention.
Figure 7B:
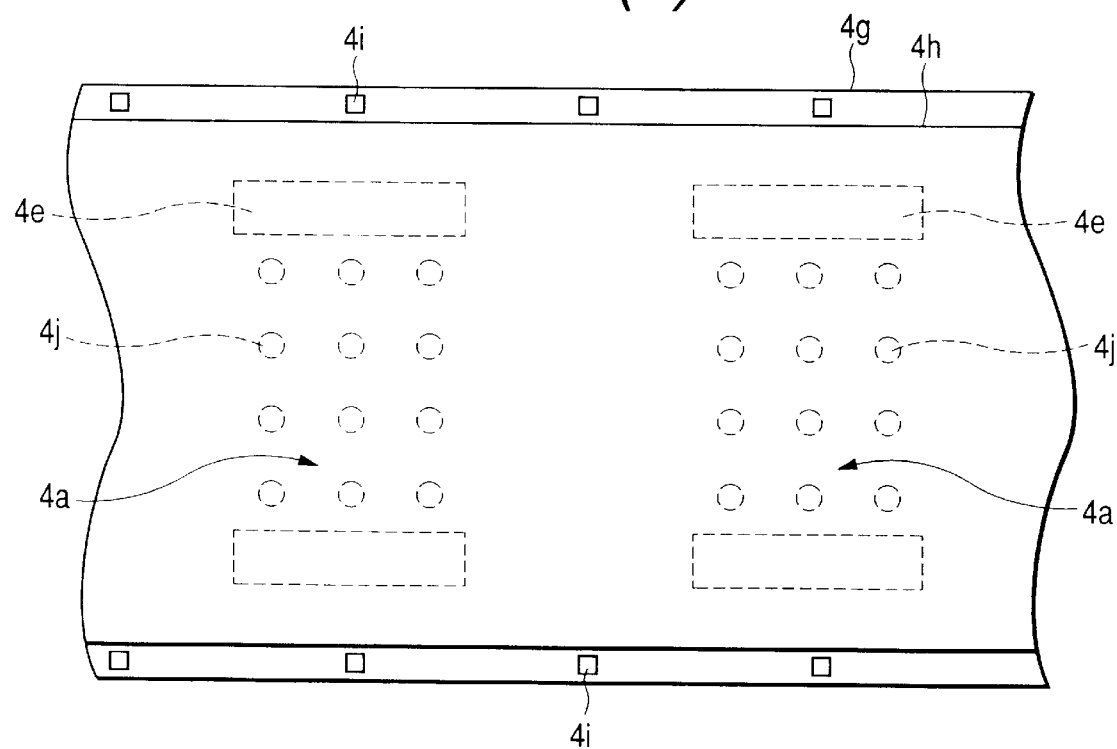
Figure 8B:
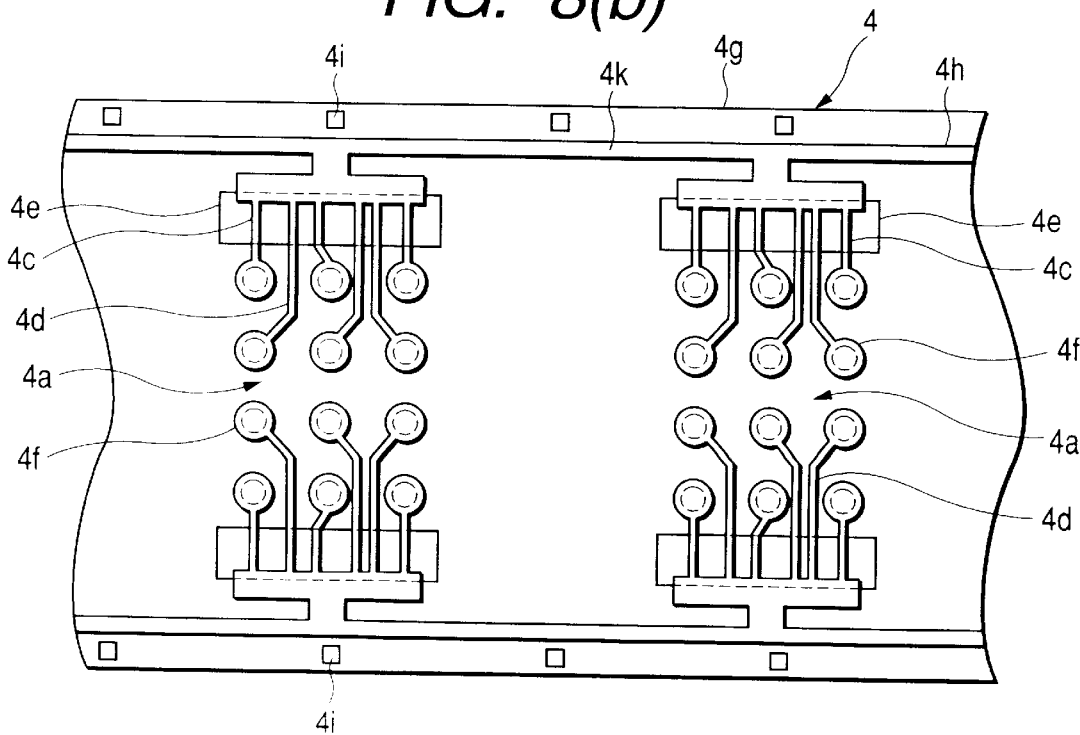

Also, a pole supply 30 (FIG. 4) is performed for supplying a bump pole material shown in the bump pole specifications of FIGS. 3(a,b,c,d) to the bump openings 4j (FIG. 7(a)).

A bump forming 31 shown in FIG. 4 is then performed based on the reflow conditions for bump forming shown in FIG. 5.

The bump forming 31 is performed by passing the material obtained by supplying the pole material to the openings 4j of the substrate body 4a through a reflow furnace, not shown.

This electrically connects the wiring 4d to the bump electrodes 2 as shown in FIG. 1 and FIG. 2.

When the bump electrodes 2 are formed according to the first embodiment, even if the CSP11 has absorbed moisture and is passed through reflow, the side faces 3a in a predetermined direction of the elastomer 3 (herein, the two opposite side faces 3a in the same direction as the longitudinal direction of the semiconductor chip 1) are exposed to the outside, so water vapor produced during reflow can disperse to the outside through the elastomer 3.

Reflow tolerance is therefore improved.

Next, a mark 32 (FIG. 4) for marking a number of the product (CSP11) is performed.

Subsequently, a cutting 33 shown in FIG. 4 is performed at a cutting position 8 shown in FIG. 10 so as to obtain different CSP11 of desired sizes.

Embodiment 2

Figure 14:
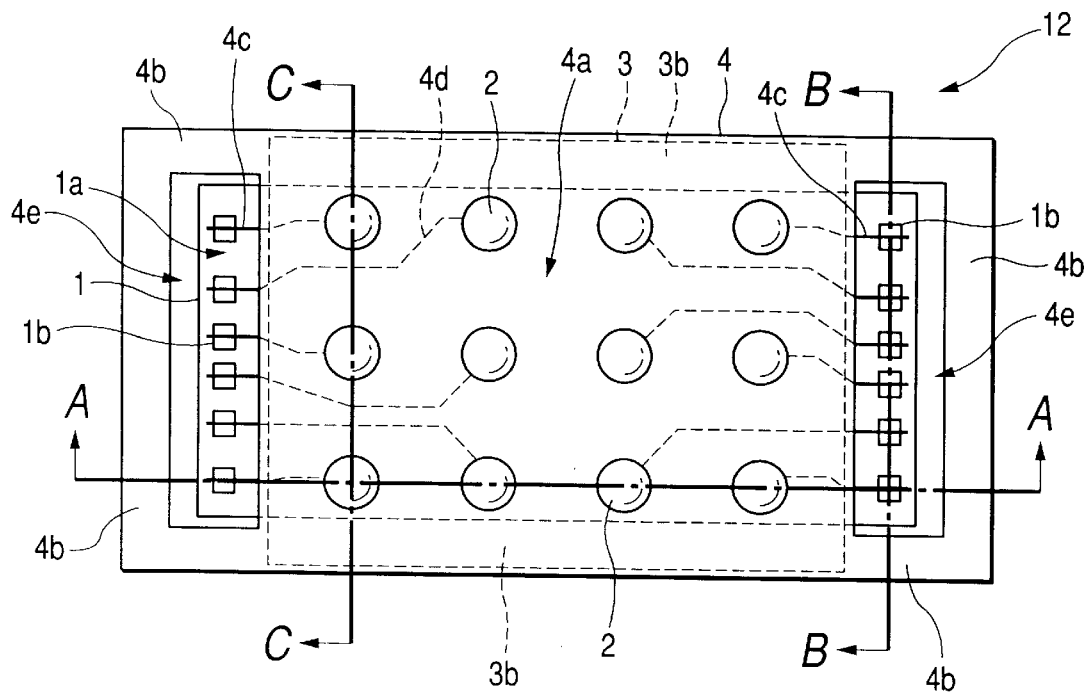
FIG. 14 is a plan view showing an example of a structure of a semiconductor device (CSP) according to a second embodiment of this invention through the sealing parts.
Figure 15A:
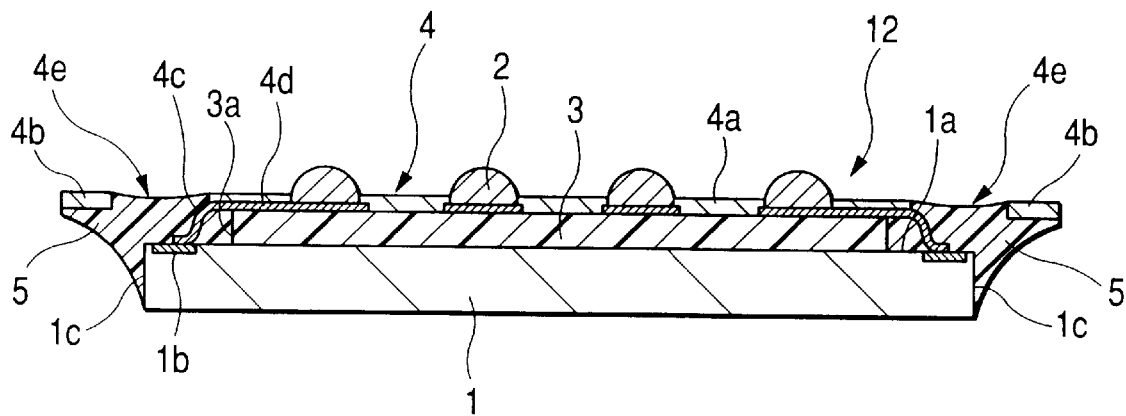
Figure 15B:
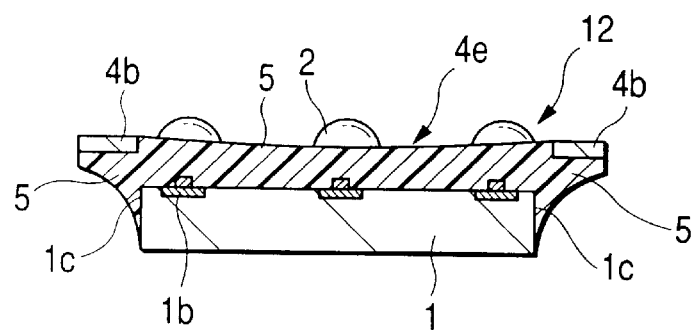
Figure 15C:
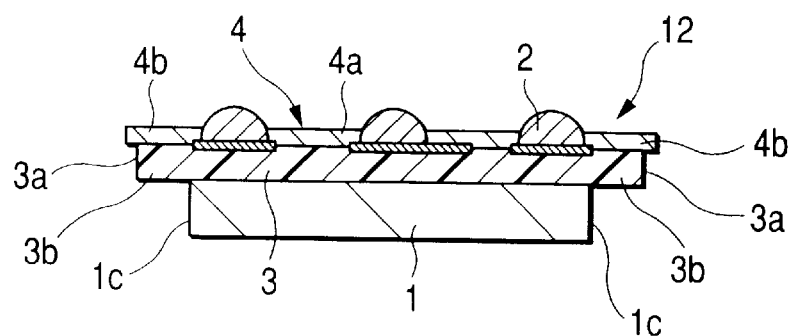

FIG. 14 is a plan view through the sealing parts of a typical structure of a semiconductor device (CSP) according to a second embodiment of this invention. FIGS. 15(a) to 15(c) are diagrams showing the structure of the semiconductor device shown in FIG. 14. FIG. 15(a) is a cross-sectional view through a line A—A in FIG. 14, FIG. 15(b) is a cross-sectional view through a line B—B in FIG. 14, FIG. 15(c) is a cross-sectional view through a line C—C in FIG. 14.

A CSP12 (semiconductor device) according to the second embodiment is a peripheral pad fan-in CSP as is the CSP11 of the first embodiment shown in FIG. 1. It has a substantially identical structure to that of the CSP11, however a difference from the CSP11 of the first embodiment is that in the cutting step 33 after the bump forming 31 shown in FIG. 4, in the regions of the sealing parts 5 formed in the protruding part 4b, the substrate protruding parts 4b and the sealing parts 5 are simultaneously cut to a desired size. In this way, the CSP12 can be made even more compact than the CSP11 shown in FIG. 1.

To implement this, a low silica sealing resin having a low proportion of silica must be used as sealing resin.

Specifically, the proportion of silica (filler) in the sealing resin must lie within the range of 0 to 50 weight percent, and it is preferably 0 weight percent.

The silica mentioned herein is extremely hard, but it lowers the residual stress of the sealing resin in the sealing material cure bake shown in FIG. 4.

The remaining features of the construction of the CSP12 according to the second embodiment and of its method of manufacture are identical to those of the CSP11 of the first embodiment, so their description will not be repeated.

The advantages of the CSP12 of the second embodiment and its method of manufacture are as follows.

First, in the region of the sealing parts 5 formed in the substrate protruding parts 4b, the substrate protruding parts 4b and sealing parts 5 are simultaneously cut to a desired size. As this cutting is performed regardless of the extent to which sealing resin has spread in the substrate protruding parts 4b (size of the sealing parts 5 formed in the substrate protruding parts 4b), the CSP12 can be made compact.

As the proportion of silica in the sealing resin is low, the hardness of the sealing parts 5 after the sealing resin has hardened can be lowered, so the life of the cutting die used to cut the substrate protruding parts 4b and sealing parts 5 can be lengthened.

The remaining advantages of the CSP12 according to the second embodiment and of its method of manufacture are identical to those of the CSP11 of the first embodiment, so their description will not be repeated.

Embodiment 3

Figure 16:
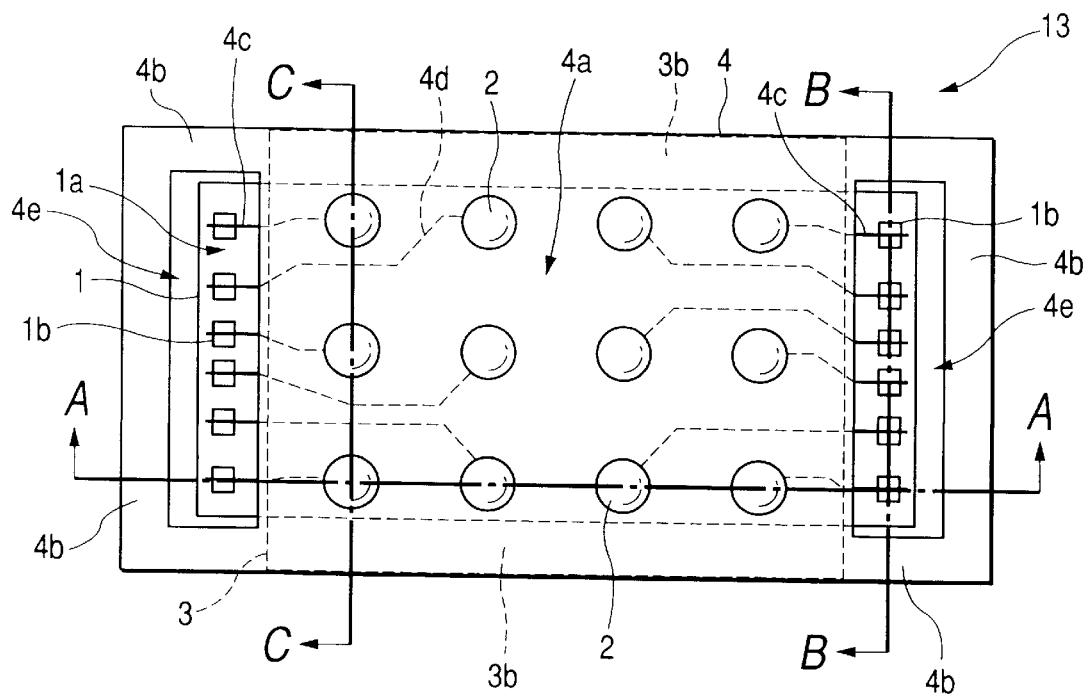
FIG. 16 is a plan view showing an example of a structure of a semiconductor device (CSP) according to a third embodiment of this invention through the sealing parts.
Figure 17A:
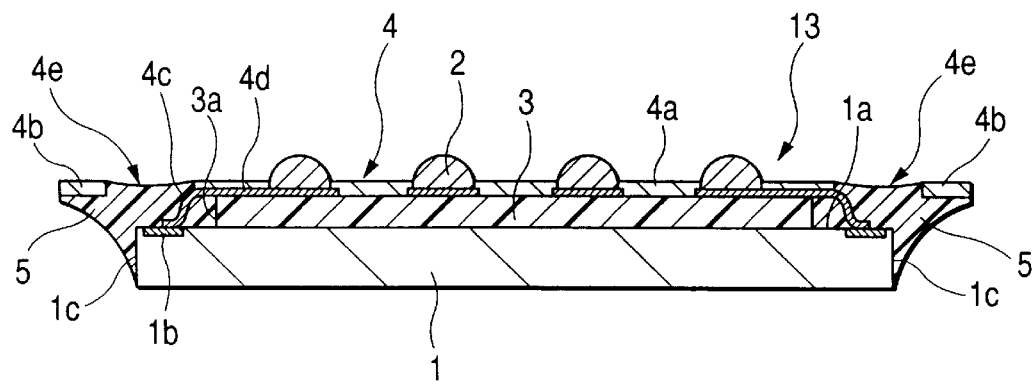
Figure 17B:
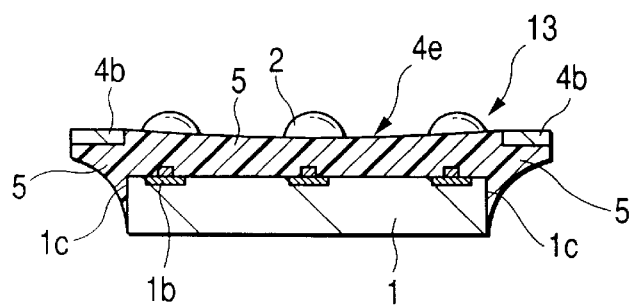
Figure 17C:
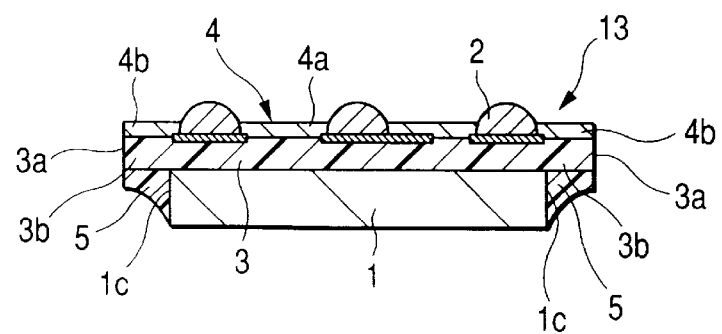

FIG. 16 is a plan view through the sealing parts of a typical structure of a semiconductor device (CSP) according to a third embodiment of this invention. FIGS. 17(a) to 17(c) are diagrams showing the structure of the semiconductor device shown in FIG. 16. FIG. 17(a) is a cross-sectional view through a line A—A in FIG. 16, FIG. 17(b) is a cross-sectional view through a line B—B in FIG. 16, FIG. 17(c) is a cross-sectional view through a line C—C in FIG. 16.

A CSP13 (semiconductor device) according to the third embodiment is a peripheral pad fan-in CSP as is the CSP12 of the second embodiment shown in FIG. 14 and FIG. 15. It has a substantially identical structure to that of the CSP12, however a difference from the CSP12 of the second embodiment is that in the resin sealing step 28 shown in FIG. 4, the resin sealing 28 is performed on the two opposite side faces 1c in the longitudinal direction of the semiconductor chip 1 as shown in FIG. 17(c) as well as the resin sealing 28 of the first embodiment.

During the resin sealing 28 performed on the two opposite side faces 1c in the longitudinal direction of the semiconductor chip 1, after the sealing material cure bake 29 of the first embodiment, the CSP13 is temporarily turned over with its top surface and under sides reversed.

Sealing resin is then applied again to the two opposite side faces 1c in the longitudinal direction of the semiconductor chip 1 and the adjacent substrate protruding parts 4b from the under surface (reverse side to the main face 1a) of the semiconductor chip 1 so as to repeat the resin sealing 28.

Subsequently, in the cutting step 33 shown in FIG. 4, the substrate protruding parts 4b, elastomer protruding parts 3b of the elastomer 3 and the sealing parts 5 formed therein are simultaneously cut to the desired size.

As a result, in the CSP13 of the third embodiment, the resin sealing 28 is performed over all the four side faces 1c of the semiconductor chip 1 as shown in FIG. 17, and the sealing parts 5 are thereby formed on all the four side faces 1c of the semiconductor chip 1.

The remaining features of the construction of the CSP13 according to the third embodiment and of its method of manufacture are identical to those of the CSP12 of the first embodiment, so their description will not be repeated.

The advantages of the CSP13 of the third embodiment and its method of manufacture are as follows.

In the CSP13, all of the four side faces 1c of the semiconductor chip 1 are covered by sealing resin, so the seal properties (herein, humidity resistance) of the semiconductor chip 1 are improved.

As a result, a compact, highly reliable CSP13 can be obtained.

The remaining advantages of the CSP13 according to the third embodiment and of its method of manufacture are identical to those of the CSP12 of the second embodiment, so their description will not be repeated.

Embodiment 4

Figure 18:
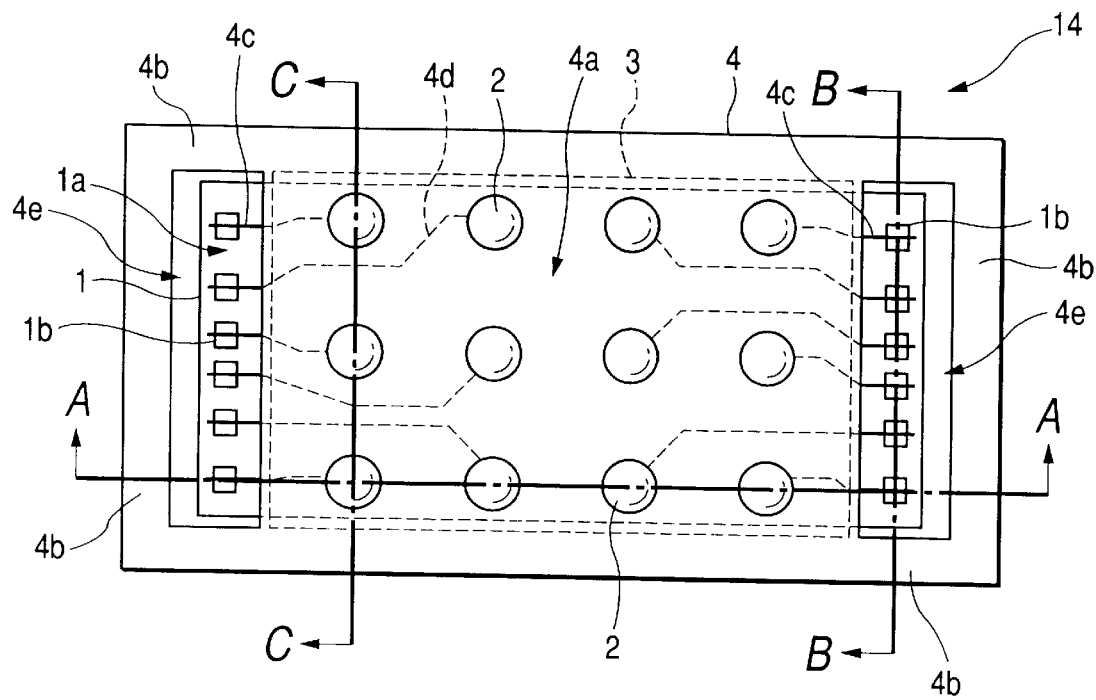
FIG. 18 is a plan view showing an example of a structure of a semiconductor device (CSP) according to a fourth embodiment of this invention through the sealing parts.
Figure 19A:
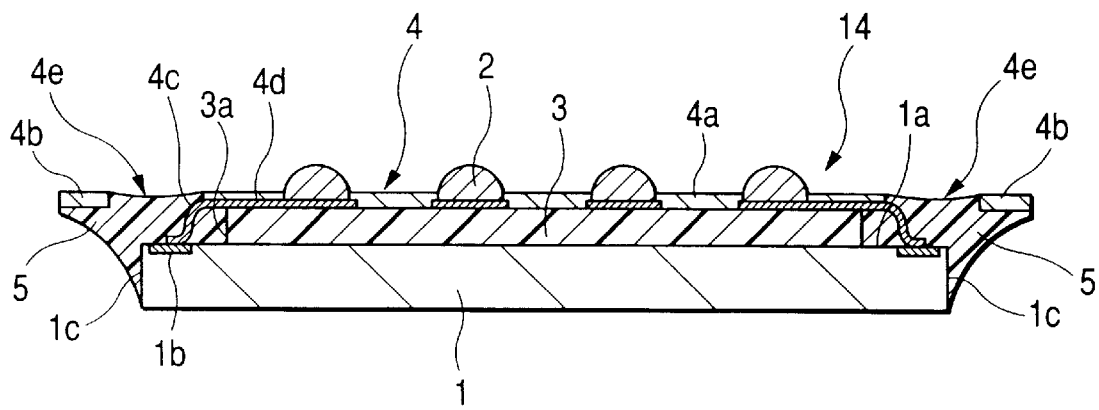
Figure 19B:
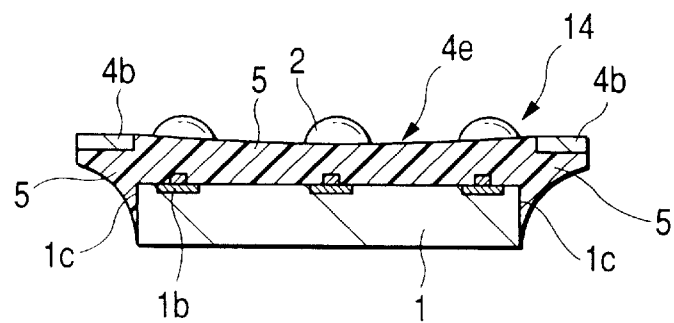
Figure 19C:
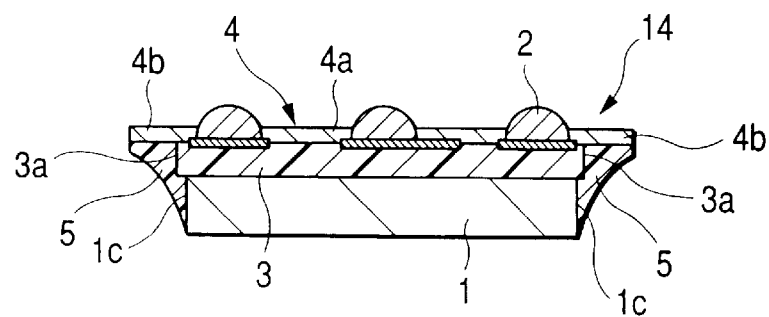

FIG. 18 is a plan view through the sealing parts of a typical structure of a semiconductor device (CSP) according to a third embodiment of this invention. FIGS. 19(a) to 19(c) are diagrams showing the structure of the semiconductor device shown in FIG. 18. FIG. 19(a) is a cross-sectional view through a line A—A in FIG. 18, FIG. 19(b) is a cross-sectional view through a line B—B in FIG. 18, FIG. 19(c) is a cross-sectional view through a line C—C in FIG. 18.

A CSP14 (semiconductor device) according to the fourth embodiment is a peripheral pad fan-in CSP as is the CSP13 of the third embodiment shown in FIG. 16 and FIG. 17. It has a substantially identical structure to that of the CSP13, however a difference from the CSP13 of the third embodiment is that the elastomer 3 and the substrate body 4a of the thin film wiring substrate 4 are formed with substantially the same size, as shown in FIG. 18.

In other words, the elastomer 3 in the CSP14 of the fourth embodiment does not comprise the elastomer protruding parts 3b shown in the first to third embodiments.

Therefore, when the resin sealing 28 is performed by the same method as the resin sealing 28 of the third embodiment, all of the four side faces 3a of the elastomer 3 are covered by sealing resin as well as the all of the four side faces 1c of the semiconductor chip 1.

Consequently, all of the outer side faces 1c, 3a of the semiconductor chip 1 and elastomer 3 are covered together to form the sealing parts 5, and the sealing parts 5 covering all of the outer side faces 1c, 3a are also directly joined to the substrate protruding parts 4b of the thin film wiring substrate 4.

Moreover, all of the surfaces of the elastomer 3 are covered by the sealing parts 5, substrate body 4a and semiconductor chip 1.

The remaining features of the construction of the CSP14 according to the fourth embodiment and of its method of manufacture are identical to those of the CSP13 of the third embodiment, so their description will not be repeated.

The advantages of the CSP14 of the fourth embodiment and its method of manufacture are as follows.

In the CSP14, as all of the surfaces of the elastomer 3 are covered, the same advantages as when the side faces 3a of the elastomer 3 are exposed cannot be obtained. However as all of the side faces 1c, 3a of the semiconductor chip 1 and elastomer 3 are covered so as to form the sealing parts 5, and all of the peripheral sealing parts 5 are directly joined to the substrate protruding parts 4b of the thin film wiring substrate 4, the seal properties (humidity resistance) of the semiconductor chip 1 are further improved.

The remaining advantages of the CSP14 according to the fourth embodiment and of its method of manufacture are identical to those of the CSP13 of the third embodiment, so their description will not be repeated.

Embodiment 5

Figure 20:
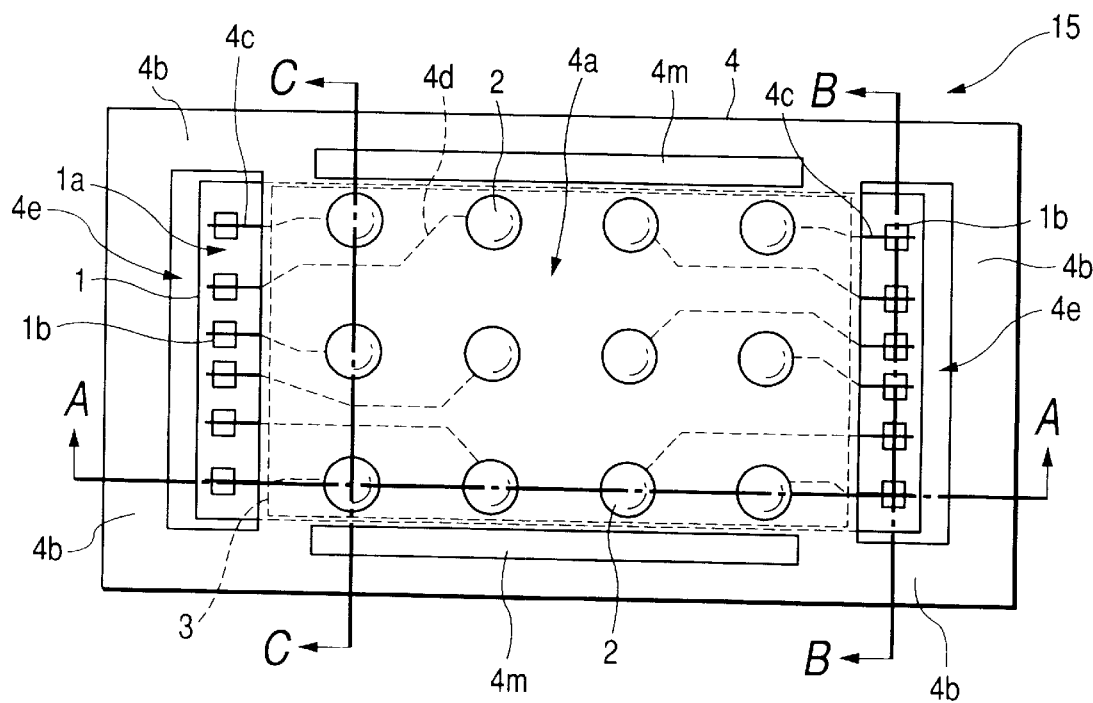
FIG. 20 is a plan view showing an example of a structure of a semiconductor device (CSP) according to a fifth embodiment of this invention through the sealing parts.
Figure 21A:
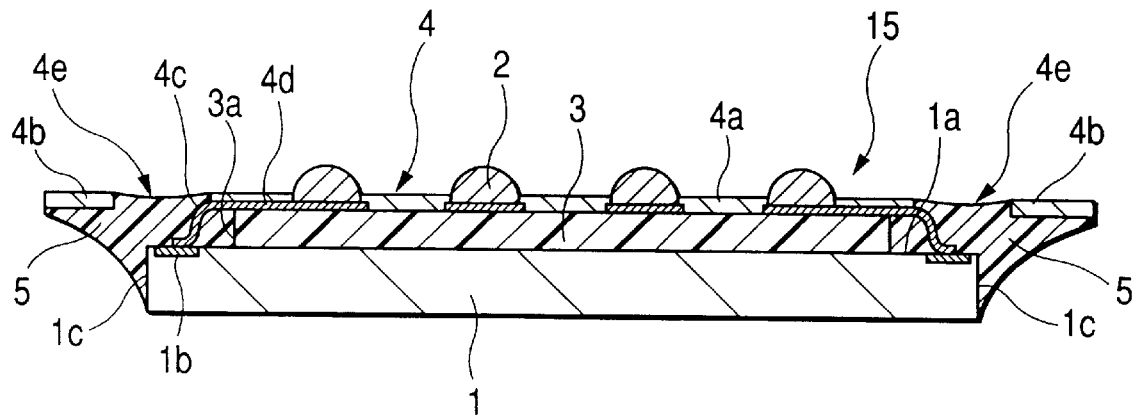
Figure 21B:
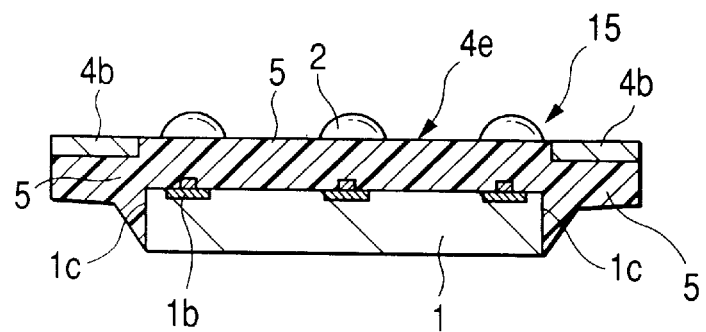
Figure 21C:
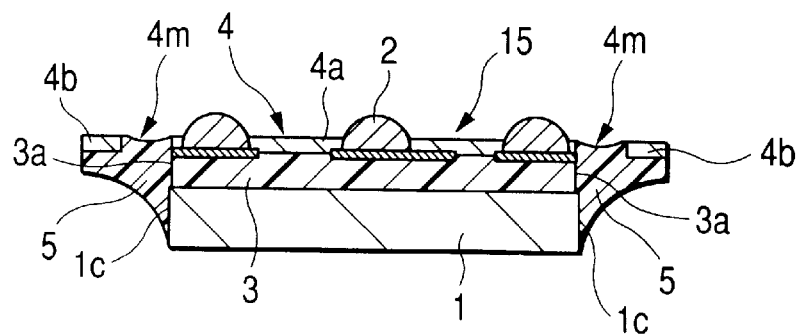

FIG. 20 is a plan view through the sealing parts of a typical structure of a semiconductor device (CSP) according to a fifth embodiment of this invention. FIGS. 21(a) to 21(c) are diagrams showing the structure of the semiconductor device shown in FIG. 20. FIG. 21(a) is a cross-sectional view through a line A—A in FIG. 20, FIG. 21(b) is a cross-sectional view through a line B—B in FIG. 20, FIG. 21(c) is a cross-sectional view through a line C—C in FIG. 20.

A CSP15 (semiconductor device) according to the fifth embodiment is a peripheral pad fan-in CSP as is the CSP14 of the fourth embodiment shown in FIG. 18 and FIG. 19. It has a substantially identical structure to that of the CSP14, however a difference from the CSP14 of the fourth embodiment is that seal openings 4m are provided at positions corresponding to the two opposite side faces 1c in the longitudinal direction of the semiconductor chip 1 (FIG. 21(c)) in the substrate protruding parts 4b of the thin film wiring substrate 4 in addition to the openings 4e exposing the electrode pads 1b, as shown in FIG. 20.

Specifically, the two openings 4e are provided at positions exposing the electrode pads 1b on both sides of the semiconductor chip 1, and the two opposite seal openings 4m are provided in a direction at right angles to them, in the thin film wiring substrate 4 of the CSP14 according to the fourth embodiment.

Hence, when the resin sealing 28 shown in FIG. 4 is performed, sealing resin can be applied through the openings 4e and the seal openings 4m from the top surface of the thin film wiring substrate 4.

Therefore, the four side faces 1c of the semiconductor chip 1 can be covered by sealing resin by this bonding method.

The remaining features of the construction of the CSP15 according to the fifth embodiment and of its method of manufacture are identical to those of the CSP14 of the fourth embodiment, so their description will not be repeated.

The advantages of the CSP15 of the fifth embodiment and of its method of manufacture are as follows.

In the CSP15, as the resin sealing 28 is performed by applying sealing resin through the openings 4e and the seal openings 4m from the top surface (one side) of the thin film wiring substrate 4, there is no need to turn the CSP15 over during the resin sealing step, so productivity is improved.

The remaining advantages of the CSP14 according to the fourth embodiment and of its method of manufacture are identical to those of the CSP13 of the third embodiment, so their description will not be repeated.

Embodiment 6

Figure 22:
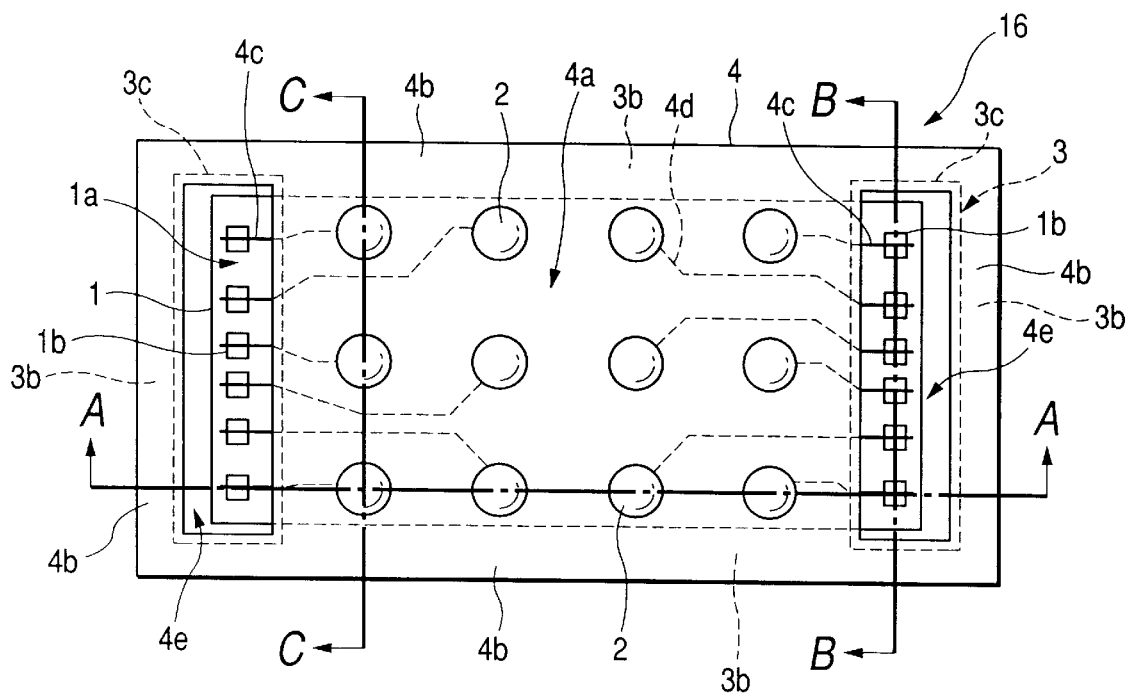
FIG. 22 is a plan view showing an example of a structure of a semiconductor device (CSP) according to a sixth embodiment of this invention through the sealing parts.
Figure 23A:
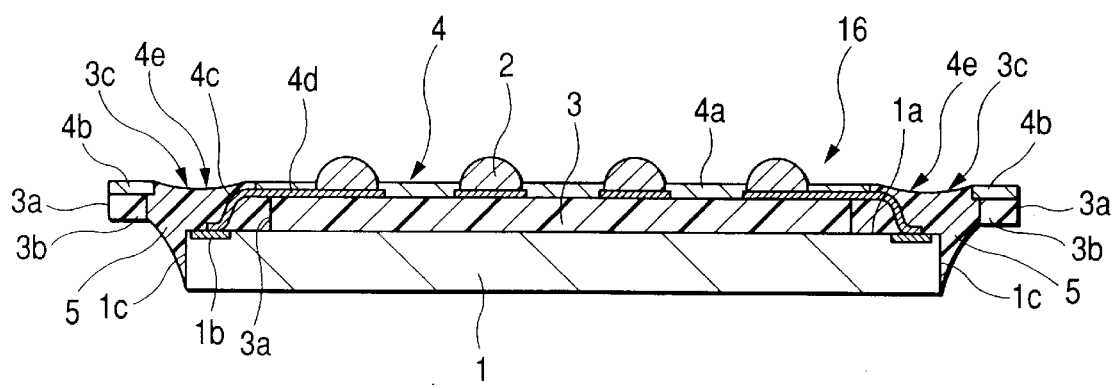
Figure 23B:
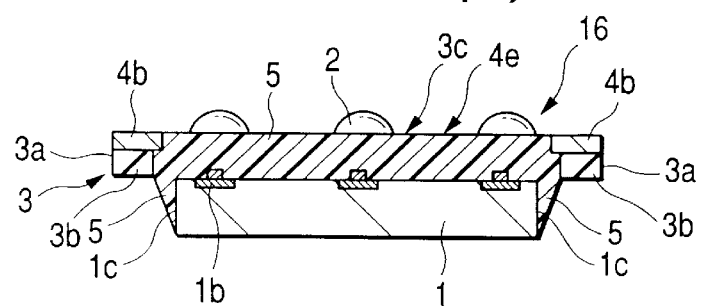
Figure 23C:
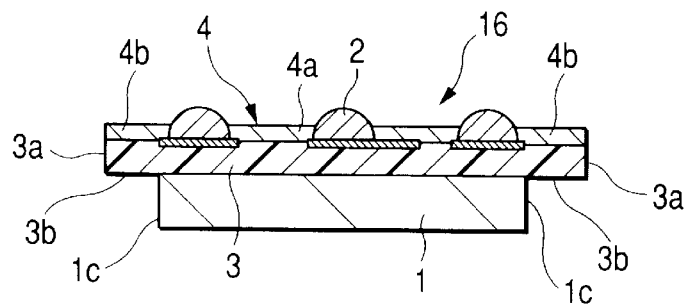

FIG. 22 is a plan view through the sealing parts of a typical structure of a semiconductor device (CSP) according to a sixth embodiment of this invention. FIGS. 23(a) to 23(c) are diagrams showing the structure of the semiconductor device shown in FIG. 22. FIG. 23(a) is a cross-sectional view through a line A—A in FIG. 22, FIG. 23(b) is a cross-sectional view through a line B—B in FIG. 22, FIG. 23(c) is a cross-sectional view through a line C—C in FIG. 22.

A CSP16 (semiconductor device) according to the sixth embodiment is a peripheral pad fan-in CSP as is the CSP12 of the second embodiment shown in FIG. 14 and FIG. 15. It has a substantially identical structure to that of the CSP12, however a difference from the CSP12 of the second embodiment is that openings 3c to those in the thin film wiring substrate 4 are provided also in the elastomer 3 to expose the electrode pads 1b of the semiconductor chip 1, as shown in FIG. 22.

Specifically, the elastomer 3 in the CSP16 comprises the two openings 3c exposing the electrode pads 1b, and elastomer protruding parts 3b (elastic structure protruding parts) which protrude beyond these openings 3c and the semiconductor chip Hence, when the elastomer 3 is attached to the thin film wiring substrate 4, the positions of the two openings 4e and 3c in these members can be aligned.

The elastomer protruding parts 3b of the sixth embodiment are provided around the whole periphery of the elastomer 3.

The resin sealing 28 (FIG. 4) in the CSP16 according to the sixth embodiment is identical to the resin sealing 28 according to the second embodiment.

The elastomer protruding parts 3b which are provided in the elastomer 3 beyond the openings 3c have the additional effect of a dam preventing flow of sealing resin.

Therefore in the CSP16 according to the sixth embodiment, the substrate protruding parts 4b of the thin film wiring substrate 4 and the elastomer protruding parts 3b laminated on them may be simultaneously cut in the cutting step 33 shown in FIG. 4, so the chip package may be made compact.

Specifically, the contour of the thin film wiring substrate 4 and elastomer 3 are cut to effectively the same size in the cutting step 33.

Further in the CSP16, as the sealing parts 5 formed by the resin sealing 28 are not cut in the cutting step 33, a sealing resin comprising 50 weight percent or more of silica may be used.

The remaining features of the construction of the CSP16 according to the sixth embodiment and of its method of manufacture are identical to those of the CSP12 of the second embodiment, so their description will not be repeated.

The advantages of the CSP16 of the sixth embodiment and its method of manufacture are as follows.

In the CSP16, leakage of sealing resin during the resin sealing step 28 is prevented by the elastomer protruding parts 3b provided in the elastomer 3.

As the elastomer protruding parts 3b are provided around the whole periphery of the elastomer 3, leakage of sealing resin may be prevented over the whole of the substrate protruding parts 4b of the thin film wiring substrate 4.

There is therefore no need to cut the sealing resin in the cutting step 33, and the contour of the CSP16 may be made compact.

Further as sealing resin is not cut in the cutting step 133, a sealing resin comprising 50 weight percent or more of silica may be used.

The contraction factor of the sealing resin in the resin material cure bake 29 shown in FIG. 4 is thereby reduced, and residual stress in the sealing resin is reduced.

The remaining advantages of the CSP16 according to the sixth embodiment and of its method of manufacture are identical to those of the CSP12 of the second embodiment, so their description will not be repeated.

Embodiment 7

Figure 24:
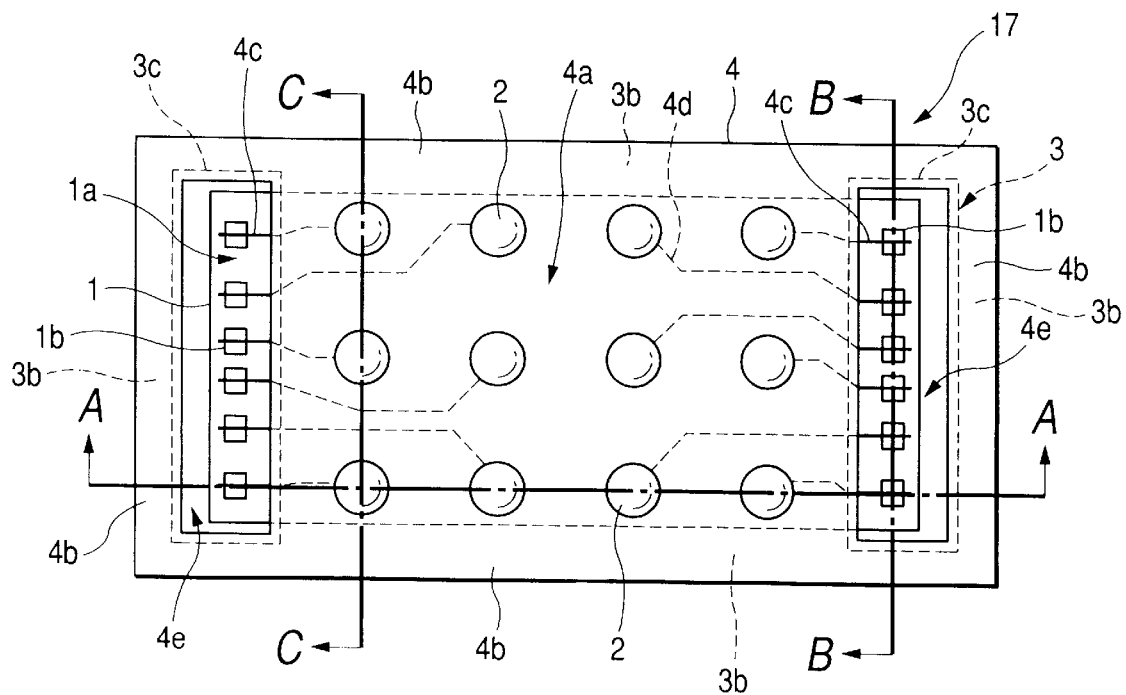
FIG. 24 is a plan view showing an example of a structure of a semiconductor device (CSP) according to a seventh embodiment of this invention through the sealing parts.
Figure 25A:
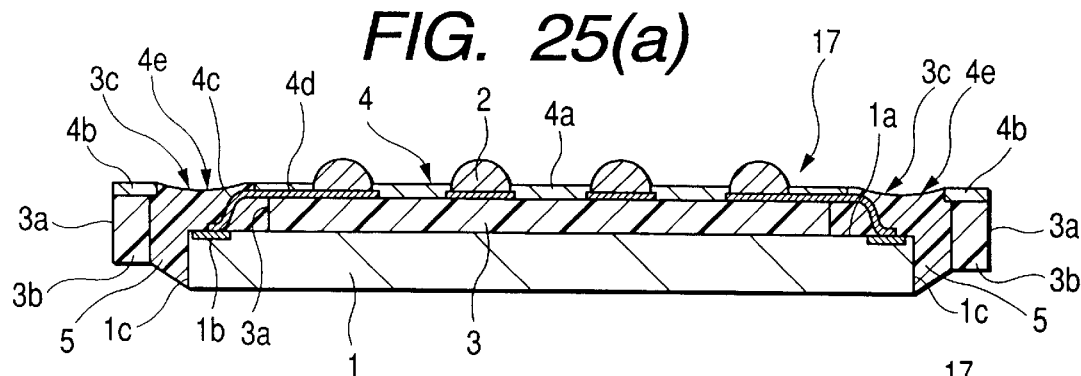
Figure 25B:
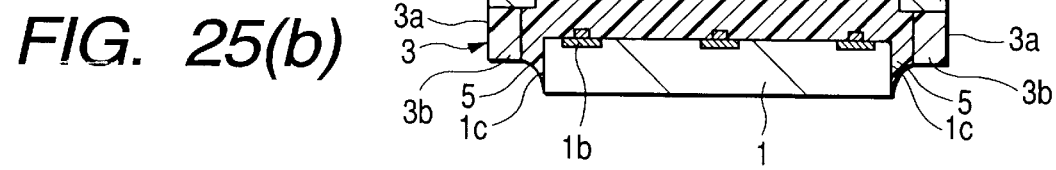
Figure 25C:
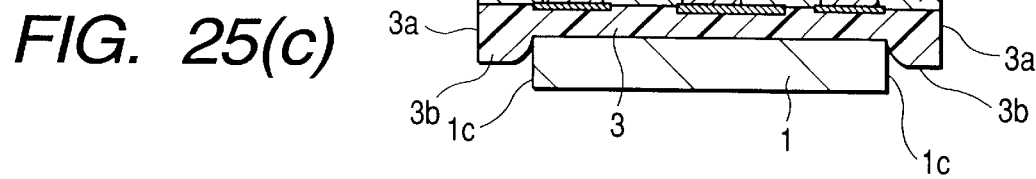
Figure 25D:
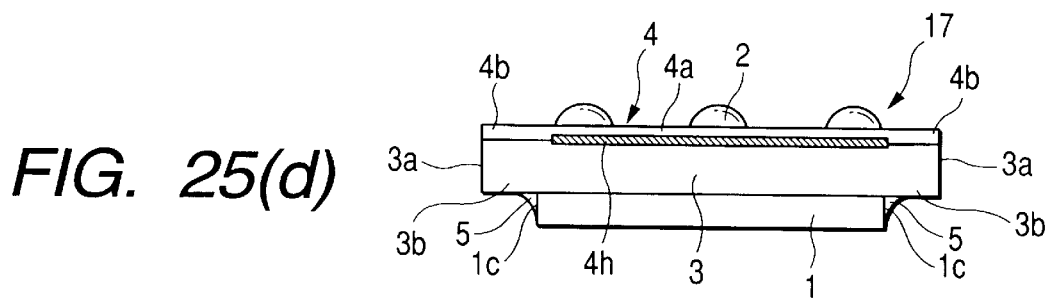
FIG. 25(d) is the front view of the structure of the semiconductor device shown in FIG.24.
Figure 25E:
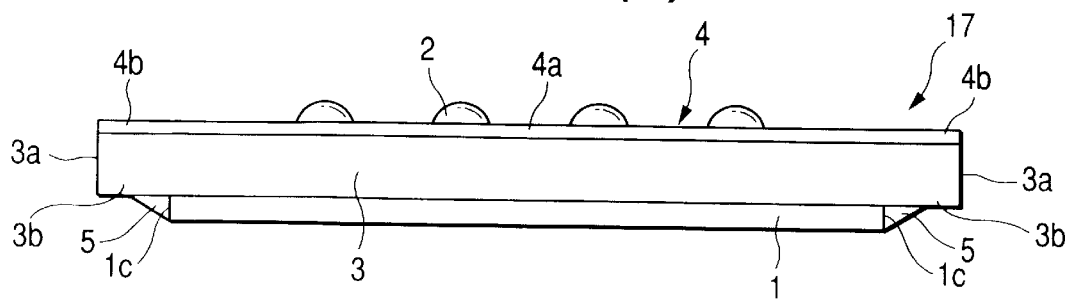
FIG. 25(e) is the side view of the structure of the semiconductor device shown in FIG.24.

FIG. 24 is a plan view through the sealing parts of a typical structure of a semiconductor device (CSP) according to a seventh embodiment of this invention. FIGS. 25(a) to 25(c) are diagrams showing the structure of the semiconductor device shown in FIG. 24. FIG. 25(a) is a cross-sectional view through a line A—A in FIG. 24, FIG. 25(b) is a cross-sectional view through a line B—B in FIG. 24, FIG. 25(c) is a cross-sectional view through a line C—C in FIG. 24.

A CSP17 (semiconductor device) according to the seventh embodiment is a peripheral pad fan-in CSP as is the CSP16 of the sixth embodiment shown in FIG. 22 and FIG. 23. It has a substantially identical structure to that of the CSP16, however a difference from the CSP16 of the third embodiment is that the elastomer 3 is made sufficiently thick when the CSP17 is assembled that the four side walls 1c of the semiconductor chip 1 are surrounded by the elastomer protruding parts 3c of the elastomer 3, as shown in FIGS. 25(a), 25(b), 25(c).

In the CSP17, as the elastomer 3 is made thick, the elastomer 3 can be formed of a porous fluoride resin.

Therefore in the CSP17 according to the seventh embodiment, the semiconductor chip 1 is attached so that the peripheral side faces 1c are surrounded only by the elastomer protruding parts 3b (elastic structure protruding parts) of the elastomer 3, as shown in FIG. 25(c).

Figure 26:
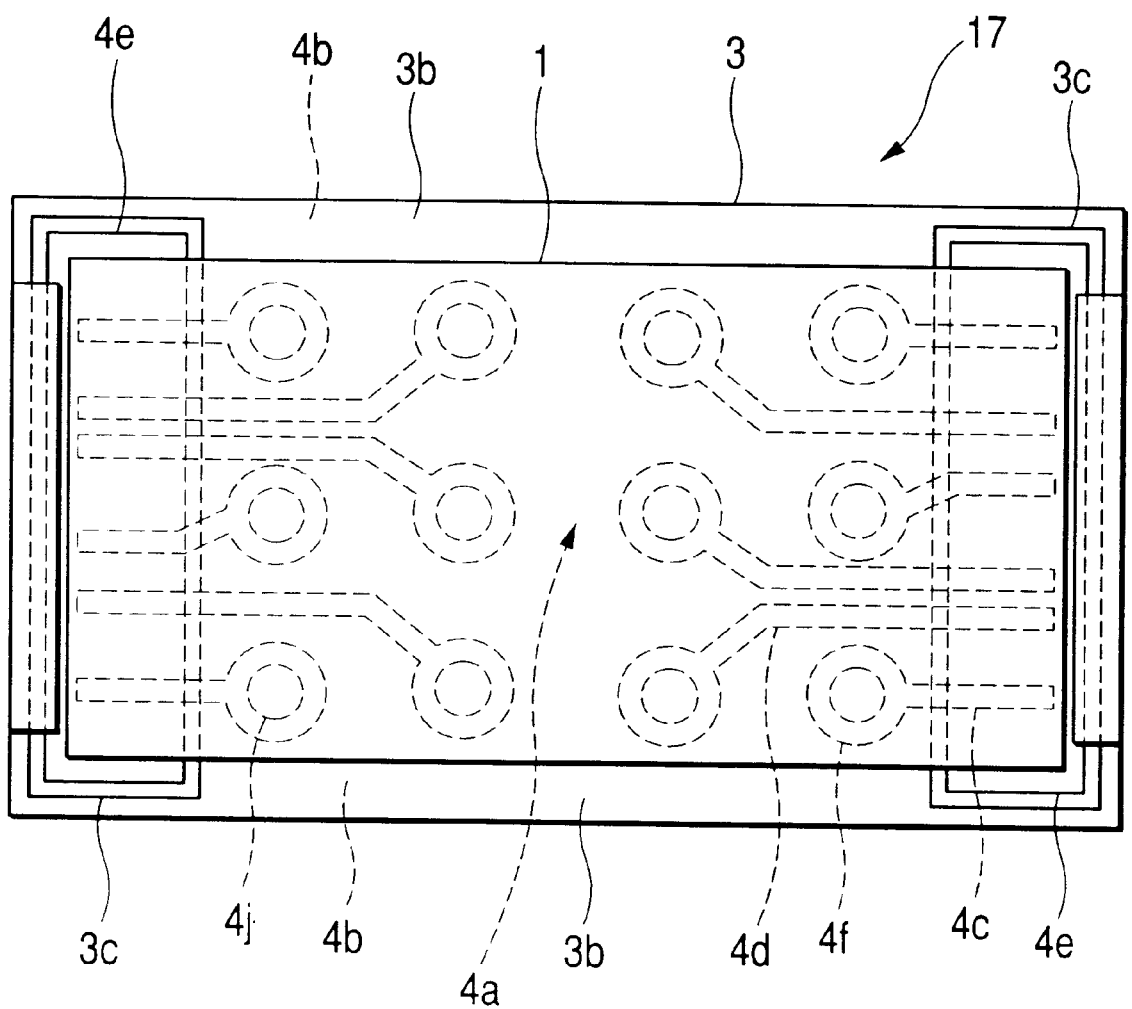
FIG. 26 is a view of a base surface showing the under surface of the semiconductor device (CSP) shown in FIG. 24.

FIG. 26 shows the layout of the wiring 4d in the CSP17.

The method of attaching (fixing) the semiconductor chip 1 shown in FIG. 25(c) will now be described.

To perform the chip attachment 24 shown in FIG. 4, the semiconductor chip 1 is pushed into the elastomer 3 by making use of the fact that the elastomer 3 is a porous fluoride resin.

As the elastomer 3 is a porous fluoride resin, it can be easily depressed under a comparatively small load.

The thickness of the elastomer 3 directly underneath the semiconductor chip 1 can therefore be made much smaller than the thickness of the outer periphery of the semiconductor chip 1.

As a result, the semiconductor chip 1 can be formed into a structure wherein the side faces 1c on the outer periphery are surrounded by the elastomer protruding parts 3b formed all around the periphery.

Sealing resin is then applied through the openings 4e of the thin film wiring substrate 4 and the openings 3c of the elastomer 3 so as to form the sealing parts 5 at both ends of the semiconductor chip 1.

Therefore in the CSP17, by pressing the semiconductor chip 1 into the elastomer 3, the region near the center of the opposite side faces 1c in the longitudinal direction of the semiconductor chip 1 is covered by the elastomer protruding parts 3b of the elastomer 3 without sealing using sealing resin, as shown in FIG. 25(c).

The remaining features of the construction of the CSP17 according to the seventh embodiment and of its method of manufacture are identical to those of the CSP16 of the sixth embodiment, so their description will not be repeated.

The advantages of the CSP17 of the seventh embodiment and its method of manufacture are as follows.

In the CSP17, as the elastomer 3 is a porous fluoride resin, and as the thickness of the elastomer 3 directly underneath the semiconductor chip 1 can be made much smaller than that of the outer periphery of the semiconductor chip 1, the semiconductor chip 1 can be attached so that the side faces 1c on the outer periphery of the semiconductor chip 1 are surrounded by the elastomer protruding parts 3b.

Hence, flow of sealing resin to the outside during the resin sealing step 28 of FIG. 4 is prevented by the elastomer protruding parts 3b and it is unnecessary to cut the sealing resin, so the CSP17 may be made compact.

The remaining advantages of the CSP17 according to the seventh embodiment and its method of manufacture are identical to those of the CSP16 of the sixth embodiment, so their description will not be repeated.

Embodiment 8

Figure 28:
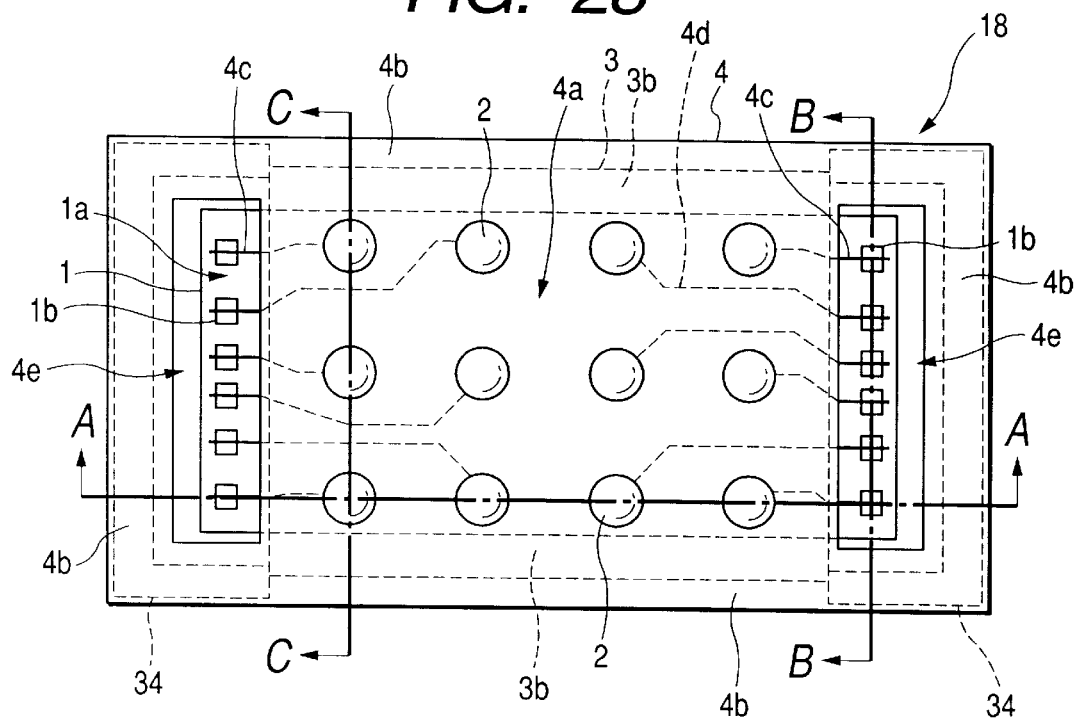
FIG. 28 is a plan view showing an example of a structure of a semiconductor device (CSP) according to an eighth embodiment of this invention through the sealing parts.
Figure 29A:
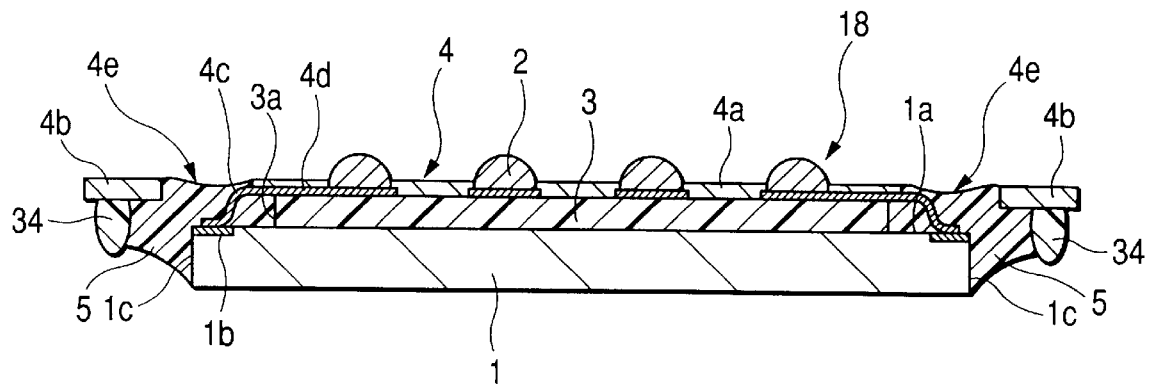
Figure 29B:
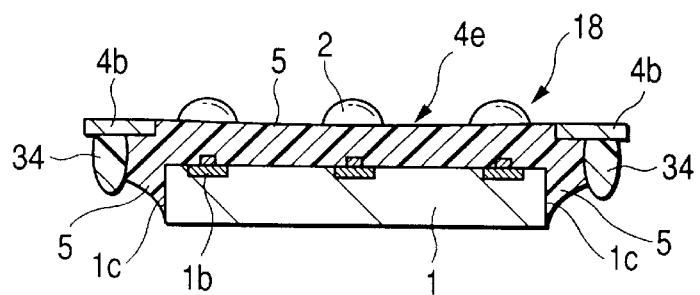
Figure 29C:
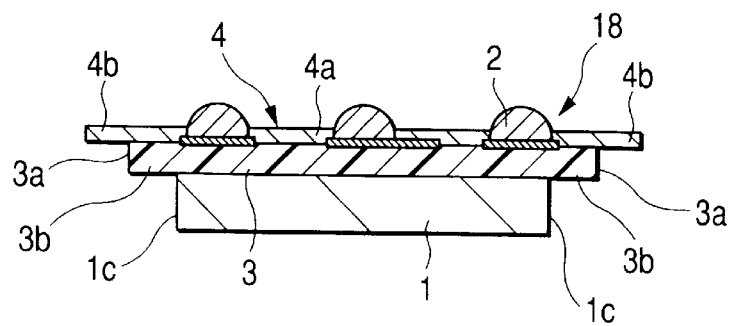

FIG. 28 is a plan view through the sealing parts of a typical structure of a semiconductor device (CSP) according to an eighth embodiment of this invention. FIGS. 29(a) to 29(c) are diagrams showing the structure of the semiconductor device shown in FIG. 28. FIG. 29(a) is a cross-sectional view through a line A—A in FIG. 28, FIG. 29(b) is a cross-sectional view through a line B—B in FIG. 28, FIG. 29(c) is a cross-sectional view through a line C—C in FIG. 28.

A CSP18 (semiconductor device) according to the eighth embodiment is a peripheral pad fan-in CSP as is the CSP12 of the second embodiment shown in FIG. 14. It has a substantially identical structure to that of the CSP12, however a difference from the CSP12 of the second embodiment is that open rectangular dam pieces 34 are provided around the openings 4e on the surfaces of the substrate protruding parts 4b of the thin film wiring substrate 4 on the chip mounting side to prevent leakage of sealing resin in the resin sealing step 28 (FIG. 4).

These dam pieces 34 are formed by hardening an epoxy coating resin or the like.

In the CSP18, as the sealing parts 5 formed in the resin sealing step 28 are not cut during the cutting 33 (FIG. 4), a sealing resin comprising 50 weight percent or more of silica can be used as sealing material.

Also, in the CSP18, the two opposite side faces 1c parallel to the longitudinal direction of the semiconductor chip 1 are not sealed and are exposed.

The remaining features of the construction of the CSP18 according to the eighth embodiment and of its method of manufacture are identical to those of the CSP12 of the second embodiment, so their description will not be repeated.

The advantages of the CSP18 of the eighth embodiment and its method of manufacture are as follows.

In the CSP18, as the dam pieces 34 are provided in the substrate protruding parts 4b of the thin film wiring substrate 4 to prevent leakage of sealing resin in the resin sealing step 28, the sealing resin need not be cut, and the contour of the CSP18 can be made compact.

Further, as sealing resin is not cut in the cutting step 33, a sealing resin comprising 50 weight percent or more of silica may be used.

The contraction factor of the sealing resin in the resin material cure bake 29 shown in FIG. 4 is thereby reduced, and residual stress in the sealing resin is reduced.

The remaining advantages of the CSP18 according to the eighth embodiment and its method of manufacture are identical to those of the CSP12 of the second embodiment, so their description will not be repeated.

Embodiment 9

Figure 30:
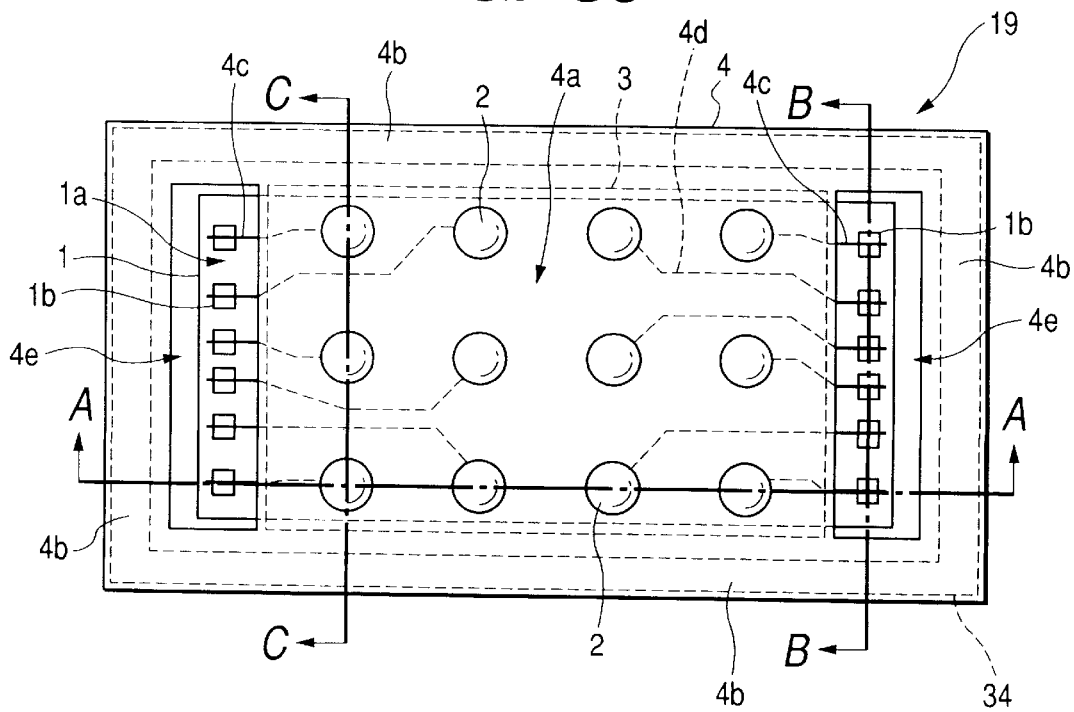
FIG. 30 is a plan view showing an example of a structure of a semiconductor device (CSP) according to a ninth embodiment of this invention through the sealing parts.
Figure 31A:
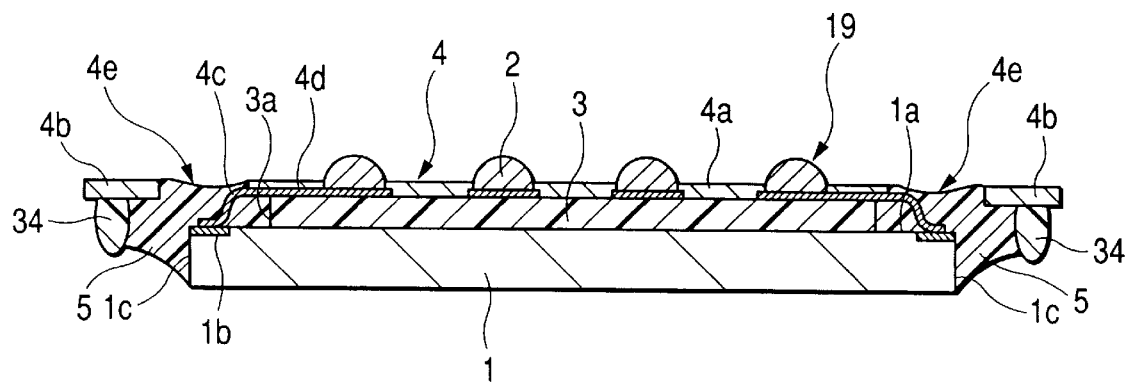
Figure 31B:
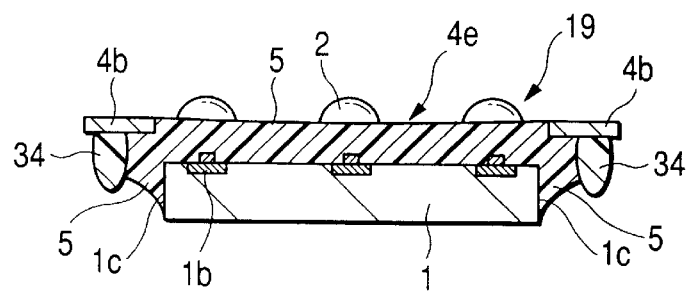
Figure 31C:
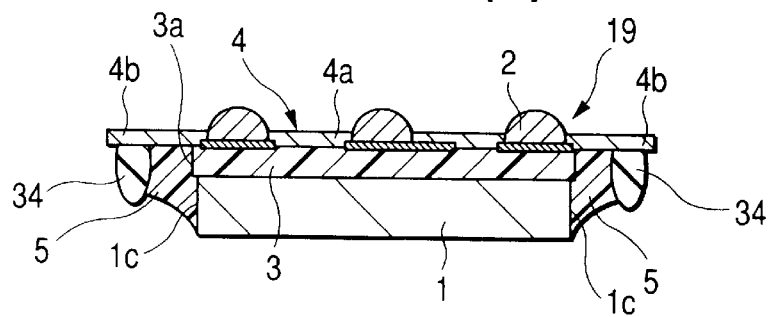

FIG. 30 is a plan view through the sealing parts of a typical structure of a semiconductor device (CSP) according to a ninth embodiment of this invention. FIGS. 31(a) to 31(c) are diagrams showing the structure of the semiconductor device shown in FIG. 30. FIG. 31(a) is a cross-sectional view through a line A—A in FIG. 30, FIG. 31(b) is a cross-sectional view through a line B—B in FIG. 30, FIG. 31(c) is a cross-sectional view through a line C—C in FIG. 30.

A CSP19 (semiconductor device) according to the ninth embodiment is a peripheral pad fan-in CSP as is the CSP18 of the eighth embodiment shown in FIG. 28. It has a substantially identical structure to that of the CSP18, however a difference from the CSP18 of the eighth embodiment is that the dam pieces 34 provided on the surfaces of the substrate protruding parts 4b of the thin film wiring substrate 4 on the chip mounting side, are formed in the shape of a frame surrounding the entire periphery of the substrate protruding parts 4b.

The elastomer 3 in the CSP19 according to the ninth embodiment does not therefore comprise the elastomer protruding parts 3b (FIG. 28).

As the dam pieces 34 are formed in the shape of a frame over the whole outer periphery of the substrate protruding parts 4b, in the CSP19 according to the ninth embodiment, the resin sealing 28 is performed over all the four side faces 1c of the semiconductor chip 1.

The remaining features of the construction of the CSP14 according to the fourth embodiment and of its method of manufacture are identical to those of the CSP13 of the third embodiment, so their description will not be repeated.

The advantages of the CSP14 of the fourth embodiment and its method of manufacture are as follows.

In the CSP19, as all of the surfaces of the elastomer 3 are covered, the same advantages as when the side faces 3a of the elastomer 3 are exposed cannot be obtained. However as all of the side faces 1c, 3a of the semiconductor chip 1 and elastomer 3 are covered so as to form the sealing parts 5, and all of the peripheral sealing parts 5 are directly joined to the substrate protruding parts 4b of the thin film wiring substrate 4, the seal properties (humidity resistance) of the semiconductor chip 1 are improved.

The remaining advantages of the CSP19 according to the ninth embodiment and its method of manufacture are identical to those of the CSP18 of the eighth embodiment, so their description will not be repeated.

Embodiment 10

Figure 32:
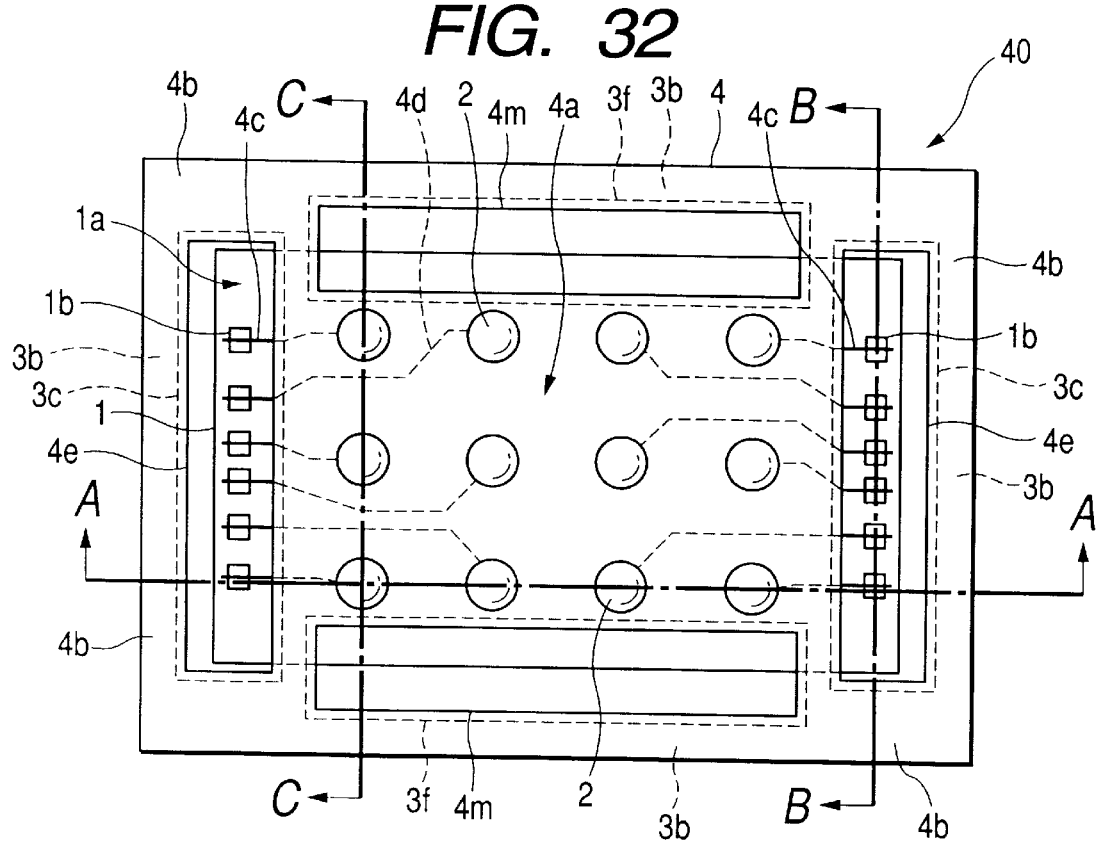
FIG. 32 is a plan view showing an example of a structure of a semiconductor device (CSP) according to a tenth embodiment of this invention through the sealing parts.
Figure 33A:
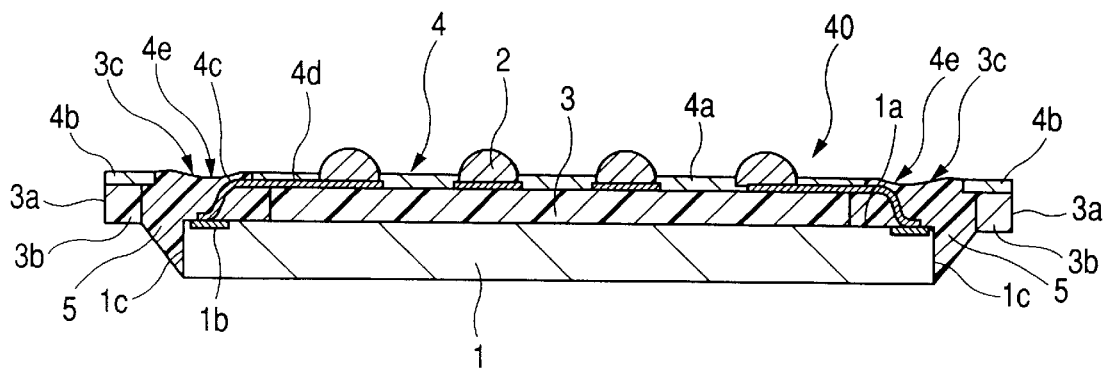
Figure 33B:
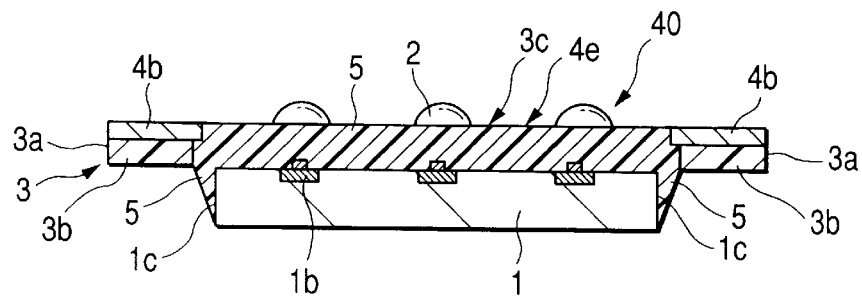
Figure 33C:
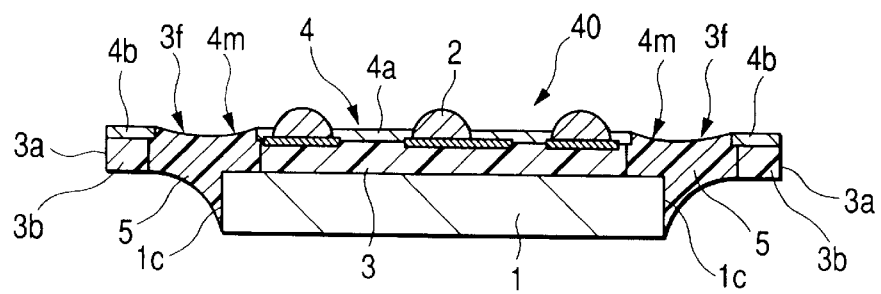

FIG. 32 is a plan view through the sealing parts of a typical structure of a semiconductor device (CSP) according to a tenth embodiment of this invention. FIGS. 33(a) to 33(c) are diagrams showing the structure of the semiconductor device shown in FIG. 32. FIG. 33(a) is a cross-sectional view through a line A—A in FIG. 32, FIG. 33(b) is a cross-sectional view through a line B—B in FIG. 32, FIG. 33(c) is a cross-sectional view through a line C—C in FIG. 32.

A CSP40 (semiconductor device) according to the tenth embodiment is a peripheral pad fan-in CSP as is the CSP16 of the sixth embodiment shown in FIG. 22. It has a substantially identical structure to that of the CSP16, however a difference from the CSP16 of the sixth embodiment is that seal openings 4m, 3f are provided at positions corresponding to the two opposite side faces 1c in the longitudinal direction of the semiconductor chip 1 (FIG. 33(c)) in the substrate protruding parts 4b of the thin film wiring substrate 4 and in the elastomer protruding parts 3b of the elastomer 3 in addition to the openings 4e exposing the electrode pads 1b, as shown in FIG. 32.

Specifically, the two opposite openings 4e and the two opposite openings 3c are provided at positions exposing the electrode pads 1b on both sides of the semiconductor chip 1, the two seal openings 4m and the two seal openings 3f are provided at opposite positions in a direction at right angles to the openings 4e, 3c, and the thin film wiring substrate 4 and elastomer 3 are formed in substantially the same shape.

Hence, when the resin sealing 28 shown in FIG. 4 is performed, sealing resin can be applied through the openings 4e, the openings 3c, the seal openings 4m and the seal openings 3f from the top surface of the thin film wiring substrate 4.

Therefore, the four side faces 1c of the semiconductor chip 1 can be covered by sealing resin by this bonding method.

Further, as the elastomer 3 comprises the elastomer protruding parts 3b which protrude beyond the four sides of the semiconductor chip 1, the resin sealing 28 can be performed on all the four side faces 1c of the semiconductor chip 1.

The remaining features of the construction of the CSP40 according to the tenth embodiment and of its method of manufacture are identical to those of the CSP16 of the sixth embodiment, so their description will not be repeated.

The advantages of the CSP40 of the tenth embodiment and of its method of manufacture are as follows.

In the CSP40, as all the four side faces 1c of the semiconductor chip 1 are sealed, the seal properties (humidity resistance) of the semiconductor chip 1 are improved.

Also, as leakage of sealing resin in the resin sealing step 28 is prevented by the elastomer protruding parts 3b, sealing resin is not cut in the cutting step 33, and the contour of the CSP40 can be made compact.

As sealing resin can be applied to four positions, i.e. one of the openings 3c, one of the openings 4e, the seal opening 3f and the seal opening 4m, from the same direction, the sealing step is made easier and productivity is improved.

The remaining advantages of the CSP40 according to the tenth embodiment and of its method of manufacture are identical to those of the CSP16 of the sixth embodiment, so their description will not be repeated.

Embodiment 11

Figure 34:
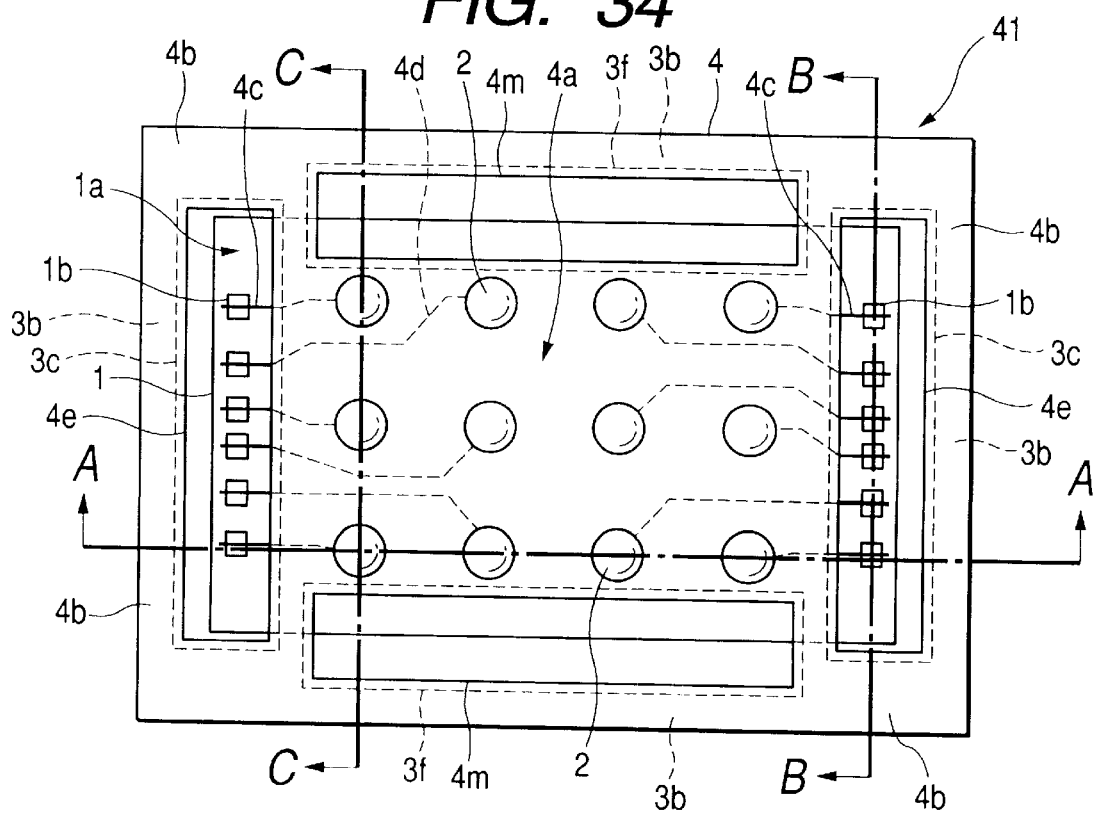
FIG. 34 is a plan view showing an example of a structure of a semiconductor device (CSP) according to an eleventh embodiment of this invention through the sealing parts.
Figure 35A:
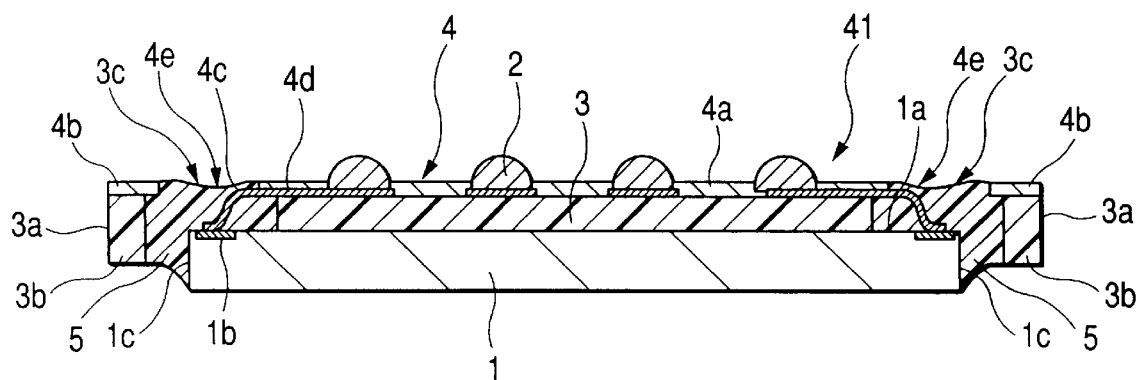
Figure 35B:
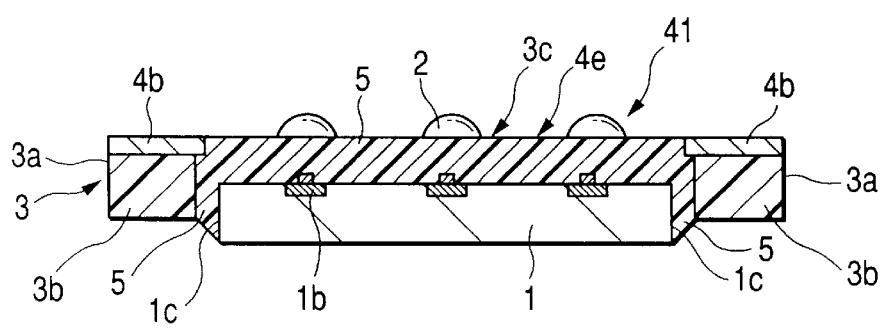
Figure 35C:
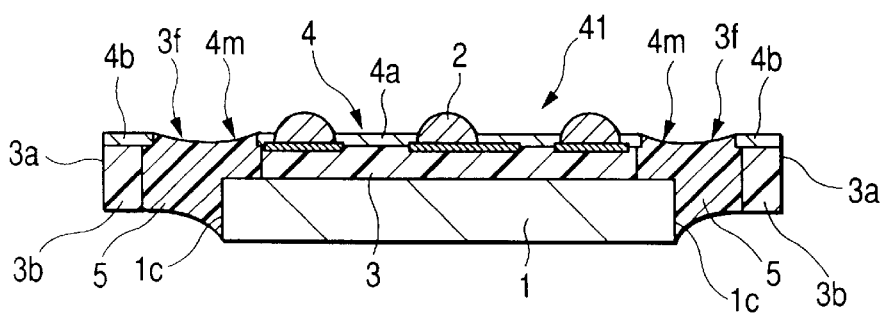

FIG. 34 is a plan view through the sealing parts of a typical structure of a semiconductor device (CSP) according to an eleventh embodiment of this invention. FIGS. 35(a) to 35(c) are diagrams showing the structure of the semiconductor device shown in FIG. 34. FIG. 35(a) is a cross-sectional view through a line A—A in FIG. 34, FIG. 35(b) is a cross-sectional view through a line B—B in FIG. 34, FIG. 35(c) is a cross-sectional view through a line C—C in FIG. 34.

A CSP41 (semiconductor device) according to the eleventh embodiment is a peripheral pad fan-in CSP as is the CSP40 of the tenth embodiment shown in FIG. 32. It has a substantially identical structure to that of the CSP40, however a difference from the CSP40 of the tenth embodiment is that when the CSP41 is assembled, the elastomer 3 is formed sufficiently thicker than the elastomer 3 of the CSP40 to the extent that the four side faces 1c of the semiconductor chip 1 are surrounded by the protruding parts 3b of the elastomer 3 via the sealing parts 5, as shown in FIG. 35.

In the CSP41, the elastomer 3 is formed of a porous fluoride resin so that it can be formed thick.

Hence, in the CSP41 of the eleventh embodiment, the semiconductor chip 1 is attached so that the outer side faces 1c on its outer periphery are surrounded by the elastomer protruding parts 3b of the elastomer 3 via the sealing parts 5, as shown in FIG. 35(c).

Herein, the method of attaching (fixing) the semiconductor chip 1 shown in FIG. 35(c) will be described.

To perform the chip attachment 24 shown in FIG. 4, the semiconductor chip 1 is pushed into the elastomer 3 by making use of the fact that the elastomer 3 is a porous fluoride resin.

As the elastomer 3 is a porous fluoride resin, it can be easily depressed under a comparatively small load.

The thickness of the elastomer 3 directly underneath the semiconductor chip 1 can therefore be made much smaller than the thickness of the outer periphery of the semiconductor chip 1.

As a result, the semiconductor chip 1 can be formed into a structure wherein the side faces 1c on the outer periphery are surrounded by the elastomer protruding parts 3b formed all around the periphery.

Sealing resin is then applied through the openings 4e of the thin film wiring substrate 4 and the openings 3c of the elastomer 3, and through the seal openings 4m of the thin film wiring substrate 4 and the seal openings 3f of the elastomer 3.

The sealing parts 5 are thereby formed as a bridge between the periphery of the main surface 1a of the semiconductor chip 1 and the four side faces 1c, and between the substrate protruding parts 4b, elastomer protruding parts 3b and semiconductor chip 1.

The remaining features of the construction of the CSP41 according to the eleventh embodiment and of its method of manufacture are identical to those of the CSP40 of the tenth embodiment, so their description will not be repeated.

The advantages of the CSP41 of the eleventh embodiment and its method of manufacture are as follows.

In the CSP41, as the elastomer 3 is a porous fluoride resin, and as the thickness of the elastomer 3 directly underneath the semiconductor chip 1 can be made much smaller than that of the outer periphery of the semiconductor chip 1, the semiconductor chip 1 can be attached so that the side faces 1c on the outer periphery of the semiconductor chip 1 are surrounded by the elastomer protruding parts 3b.

Hence, flow of sealing resin to the outside during the resin sealing step 28 of FIG. 4 is prevented by the elastomer protruding parts 3b and it is unnecessary to cut the sealing resin, so the CSP41 may be made compact.

The remaining advantages of the CSP41 according to the eleventh embodiment and its method of manufacture are identical to those of the CSP40 of the tenth embodiment, so their description will not be repeated.

Embodiment 12

Figure 36:
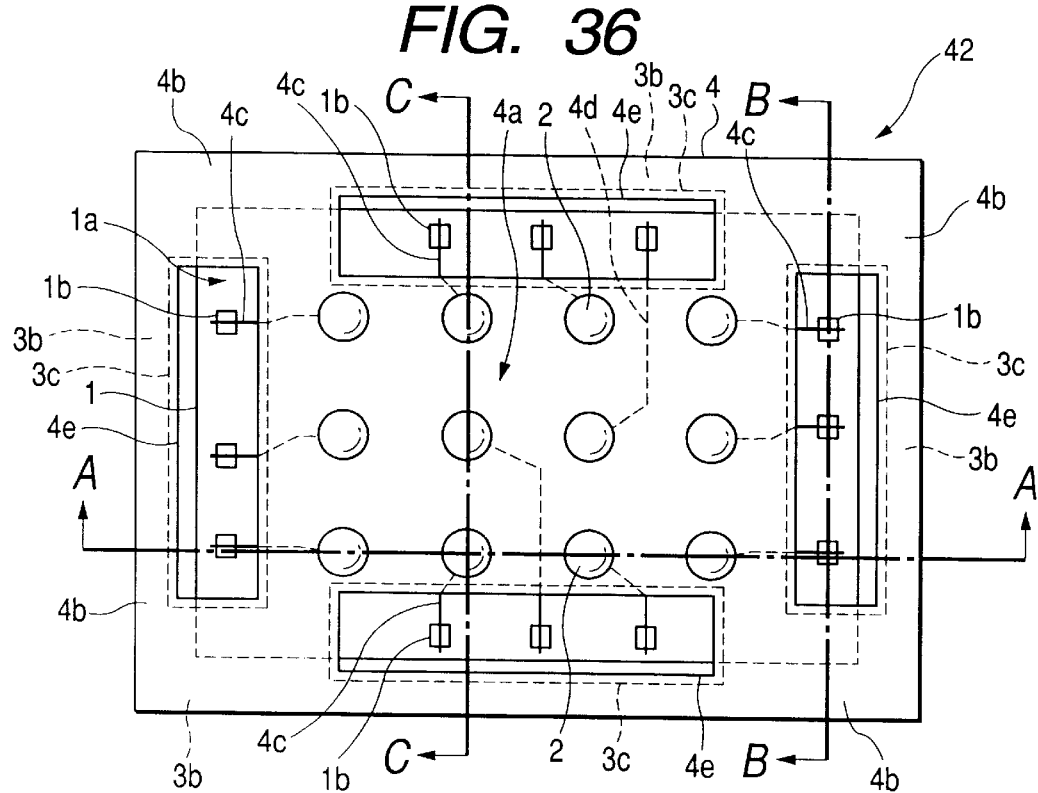
FIG. 36 is a plan view showing an example of a structure of a semiconductor device (CSP) according to a twelfth embodiment of this invention through the sealing parts.
Figure 37A:
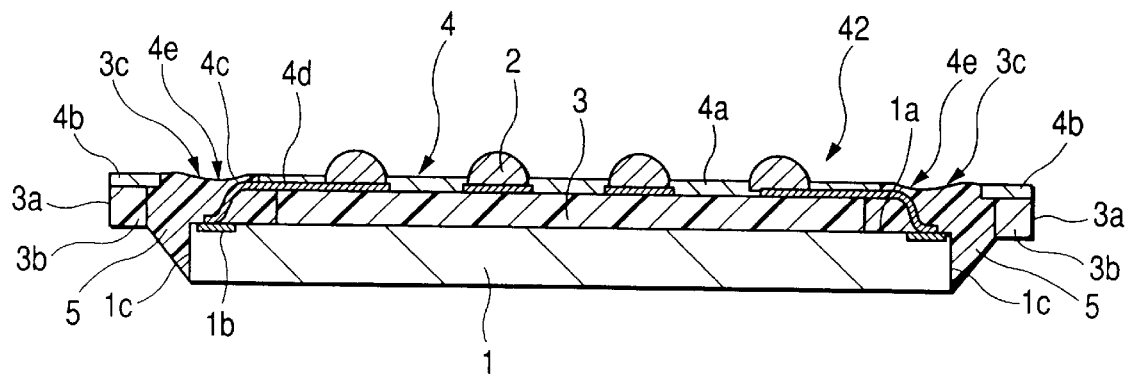
Figure 37B:
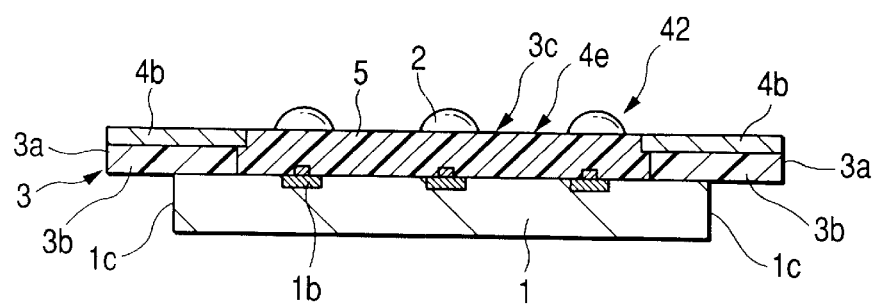
Figure 37C:
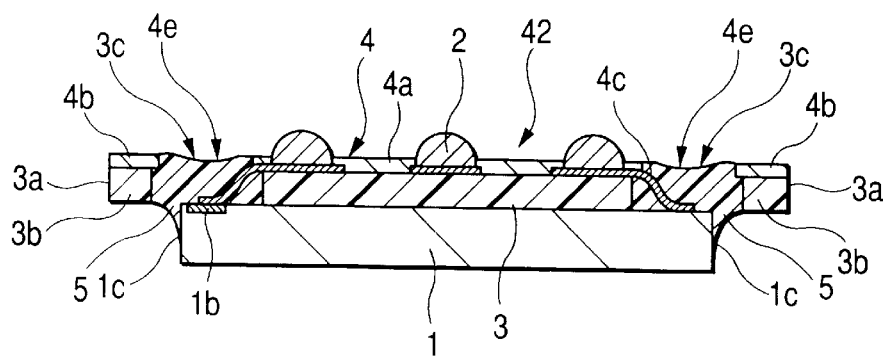

FIG. 36 is a plan view through the sealing parts of a typical structure of a semiconductor device (CSP) according to a twelfth embodiment of this invention. FIGS. 37(a) to 37(c) are diagrams showing the structure of the semiconductor device shown in FIG. 36. FIG. 37(a) is a cross-sectional view through a line A—A in FIG. 36, FIG. 37(b) is a cross-sectional view through a line B—B in FIG. 36, FIG. 37(c) is a cross-sectional view through a line C—C in FIG. 36.

A CSP42 (semiconductor device) according to the twelfth embodiment is a peripheral pad fan-in CSP as is the CSP40 of the tenth embodiment shown in FIG. 32. It has a substantially identical structure to that of the CSP40, however a difference from the CSP40 of the tenth embodiment is that the electrode pads 1b are formed on the periphery of the four sides of the main surface 1a of the semiconductor chip 1.

As the four openings 4e and four openings 3c are respectively formed in the thin film wiring substrate 4 and elastomer 3 at corresponding identical positions, the electrode pads 1b on the four sides of the semiconductor chip 1 can be exposed by these openings 4e, 3c.

Sealing resin is applied through these four holes 4e, 3c in the resin sealing step 28 so as to form the sealing parts 5 around the four openings 4e, 3c.

The remaining features of the construction of the CSP42 according to the twelfth embodiment and of its method of manufacture are identical to those of the CSP40 of the tenth embodiment, so their description will not be repeated.

The advantages of the CSP42 of the twelfth embodiment and its method of manufacture are as follows.

In the CSP42, even when the electrode pads 1b are provided on the periphery of the four sides of the main surface 1a of the semiconductor chip 1, the four openings 4e and the four openings 3c are respectively formed in the thin film wiring substrate 4 and elastomer 3. Therefore, by performing the resin sealing 28 through the four openings 4e and the four openings 3c, the humidity resistance is made more reliable, and a compact CSP42 can be obtained.

The remaining advantages of the CSP42 according to the twelfth embodiment and its method of manufacture are identical to those of the CSP40 of the tenth embodiment, so their description will not be repeated.

Embodiment 13

Figure 38:
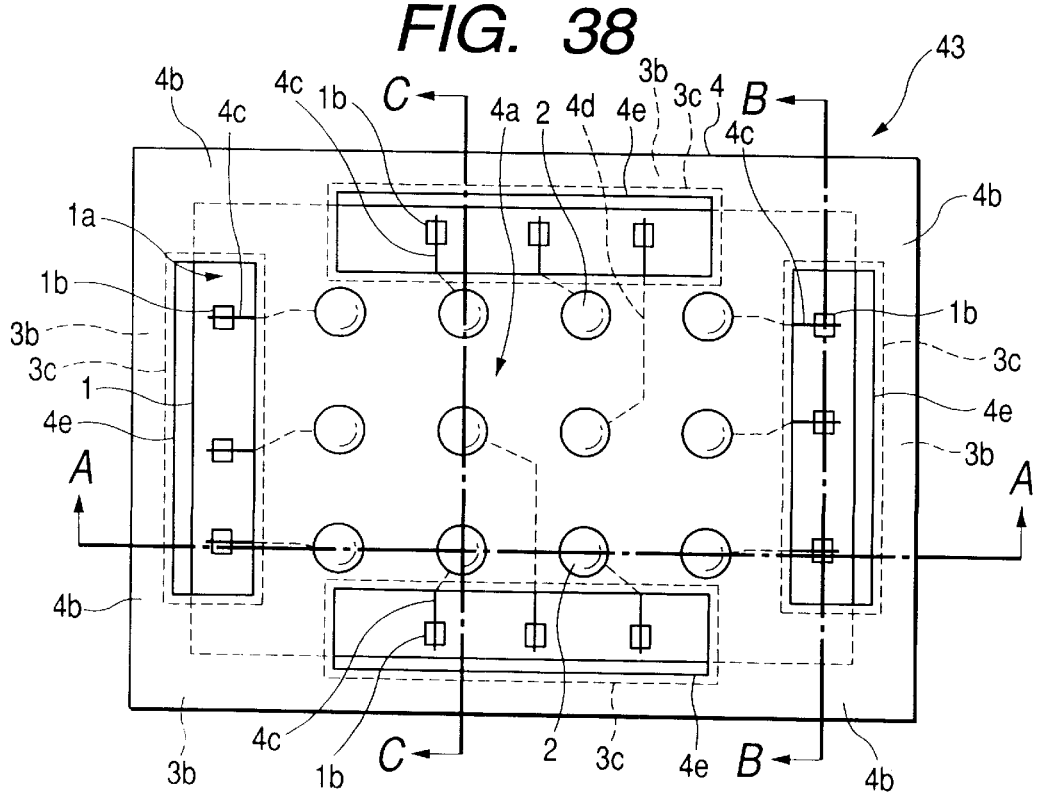
FIG. 38 is a plan view showing an example of a structure of a semiconductor device (CSP) according to a thirteenth embodiment of this invention through the sealing parts.
Figure 39A:
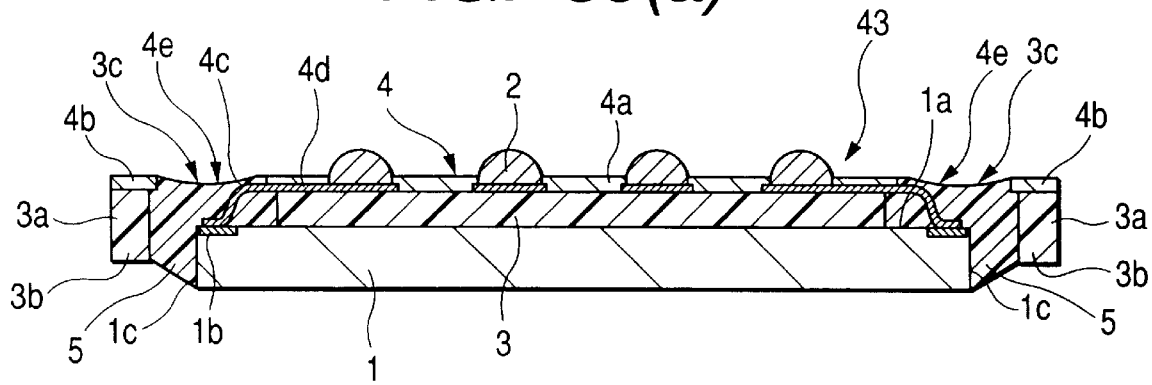
Figure 39B:
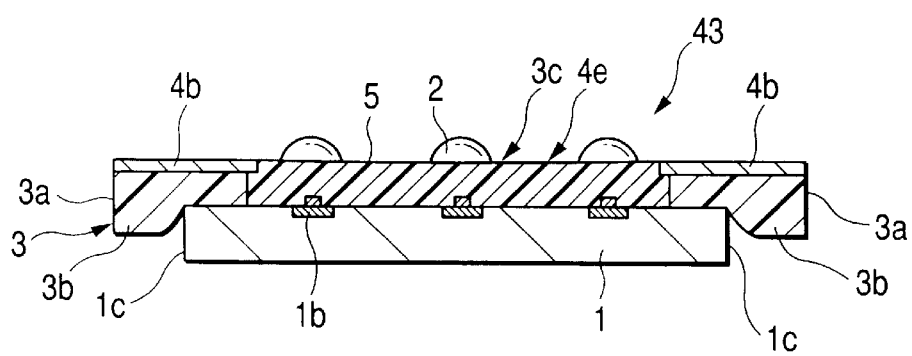
Figure 39C:
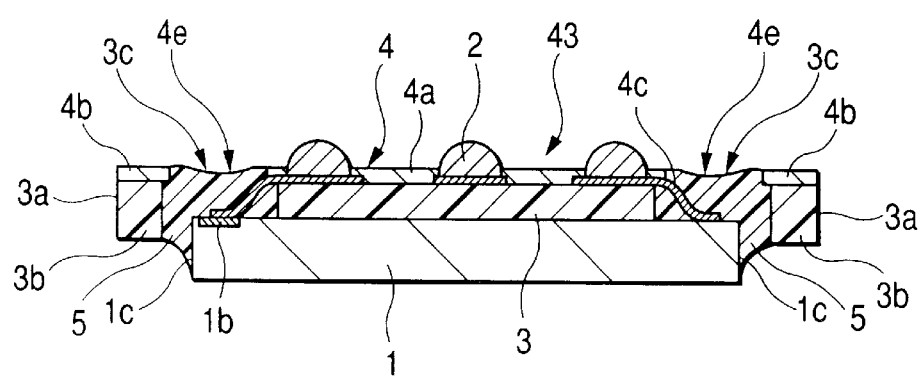

FIG. 38 is a plan view through the sealing parts of a typical structure of a semiconductor device (CSP) according to a thirteenth embodiment of this invention. FIGS. 39(a) to 39(c) are diagrams showing the structure of the semiconductor device shown in FIG. 38. FIG. 39(a) is a cross-sectional view through a line A—A in FIG. 38, FIG. 39(b) is a cross-sectional view through a line B—B in FIG. 38, FIG. 39(c) is a cross-sectional view through a line C—C in FIG. 38.

A CSP43 (semiconductor device) according to the thirteenth embodiment is a peripheral pad fan-in CSP as is the CSP17 of the seventh embodiment shown in FIG. 24. It has a substantially identical structure to that of the CSP17, however a difference from the CSP17 of the seventh embodiment is that the electrode pads 1b are provided on the peripheries of the four sides of the main surface 1a of the semiconductor chip 1.

Therefore, the four openings 4e and the four openings 3c are formed at corresponding positions in the thin film wiring substrate 4 and the elastomer 3 so that the electrode pads 1b on the four sides of the semiconductor chip 1 are exposed.

Sealing resin is then applied via the four openings 4e and the four openings 3c in the resin sealing step 28 so as to form the sealing parts 5 in the four openings 4e, 3c.

The remaining features of the construction of the CSP43 according to the thirteenth embodiment and of its method of manufacture are identical to those of the CSP17 of the seventh embodiment, so their description will not be repeated.

The advantages of the CSP43 of the thirteenth embodiment and of its method of manufacture are as follows.

In the CSP43, by forming the four openings 4e and the four openings 3c respectively in the thin film wiring substrate 4 and the elastomer 3, a compact CSP43 having improved humidity resistance can be obtained even if the electrode pads 1b are provided on the peripheries of the four sides of the main surface 1a of the semiconductor chip 1.

As the sealing resin can be applied to all of the four openings 4e, 3c from the same direction in the resin sealing step 28, the sealing step is made easier and productivity is improved.

Further, as the four side faces 1c of the semiconductor chip 1 are sealed by the elastomer protruding parts 3b or the sealing parts 5, the seal properties (humidity resistance) of the semiconductor chip 1 are improved.

The remaining advantages of the CSP43 according to the thirteenth embodiment and of its method of manufacture are identical to those of the CSP17 of the seventh embodiment, so their description will not be repeated.

Embodiment 14

FIGS. 40(a) to 40(c) are diagrams of a typical structure of the unconnected lead of a semiconductor device according to a fourteenth embodiment of this invention. FIG. 40(a) is a cross-sectional view when the unconnected lead is bent, FIG. 40(b) and FIG. 40(c) are cross-sectional views when the unconnected lead is not bent.

According to the fourteenth embodiment, the semiconductor device (CSP) shown in Embodiments 1 to 13 has an unconnected lead 35 (one of the leads 4c which is not connected to the electrode pads 1b of the semiconductor chip 1). This unconnected lead 35 may or may not be bent.

Due to the unconnected lead 35, the mode of the CSP can be changed over to change over functions, and different wiring configurations 4d can be set up by selecting connection or no connection for each of the leads 4c for the same wiring pattern.

Therefore if no connection is selected for the lead 4c, i.e. for the unconnected lead 35, no connection of any kind is performed by the bonding tool (FIG. 13) in the bonding step.

The CSP17 shown in Embodiment 7 will be taken as an example to describe the unconnected lead 35 shown in FIG. 40.

It will however be understood that the same features can be applied not only to the seventh embodiment, but to any of the first to thirteenth embodiments.

In the CSP17 shown in FIG. 40(a), the unconnected lead 35 is bent towards the electrode pad 1b of the semiconductor chip 1.

In this process, instead of making a connection with the bonding tool 7 in the bonding step, the lead 4c is pressed down by the bonding tool 7 (i.e. in the direction of the main surface 1a of the semiconductor chip 1) to the extent that it does not touch the electrode pad 1b.

In both FIGS. 40(b) and (c), the unconnected lead 35 is not bent.

The CSP17 shown in FIG. 40(b) represents a state where the unconnected lead 35 which is not bent is enclosed inside the sealing part 5.

The CSP17 shown in FIG. 40(c) represents a state where the tip of the unconnected lead 35 which is not bent protrudes beyond the sealing part 5. As the surface of the sealing part 5 is somewhat depressed when the sealing resin is cured, the unconnected lead 35 is left projecting.

From the viewpoint of sealing properties, when the semiconductor device (CSP) comprises the unconnected lead 35, it is desirable that the unconnected lead 35 is bent in the direction of the main surface of the semiconductor chip 1 as shown in FIG. 40(a), but it is not absolutely necessary to bend it and it may be unbent as shown in FIGS. 40(b), 40(c).

The remaining features of the construction of the semiconductor device (CSP) according to the fourteenth embodiment are identical to those of the first-thirteenth embodiments, so their description will not be repeated.

The CSP does not necessarily comprise the unconnected lead 35 described in the fourteenth embodiment, this unconnected lead 35 being used depending on the function of the CSP.

It will be understood that the unconnected lead can also be used not only in the seventh embodiment, but also in any of the first-thirteenth embodiments.

Next, the effect obtained by the semiconductor device (CSP) according to the fourteenth embodiment will be described.

In the CSP, a desired circuit can be constructed by selecting the connected/unconnected leads 4c using a common pattern, so it is unnecessary to provide separate wiring patterns for each product.

Hence common parts may be used for different CSP, and as a result, the CSP can be manufactured at lower cost.

When the CSP has the unconnected lead 35, by bending the unconnected lead 35 towards the electrode pad 1b of the semiconductor chip 1, the unconnected lead 35 is not left exposed outside the sealing part 5 after resin sealing, so humidity resistance is improved.

Also, by bending the unconnected lead 35 towards the electrode pad 1b of the semiconductor chip 1, the unconnected lead 35 can be firmly sealed inside the sealing part 5 even when the surface of the sealing part 5 is depressed.

This reduces the limitations on the sealing resin and increases the number of sealing resins that can be used.

Embodiment 15

Figure 41A:
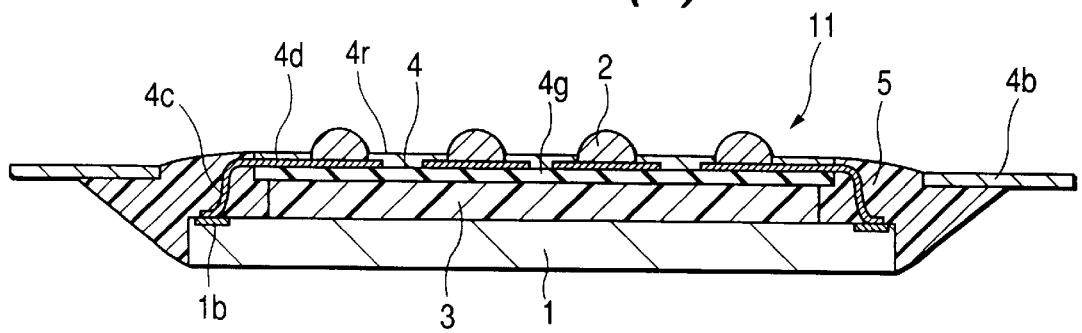
FIGS. 41(a), 41(b), 41(c) are cross-sections each showing a typical structure using a single-layer surface-wired thin film wiring substrate in the semiconductor device according to the fifteenth embodiment of this invention.
Figure 41B:
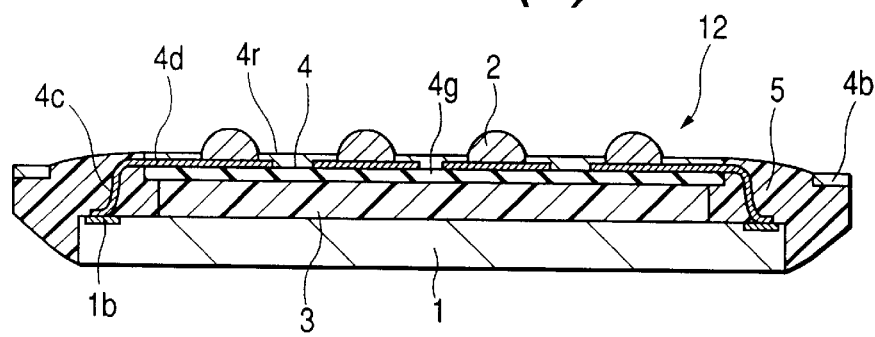
Figure 41C:
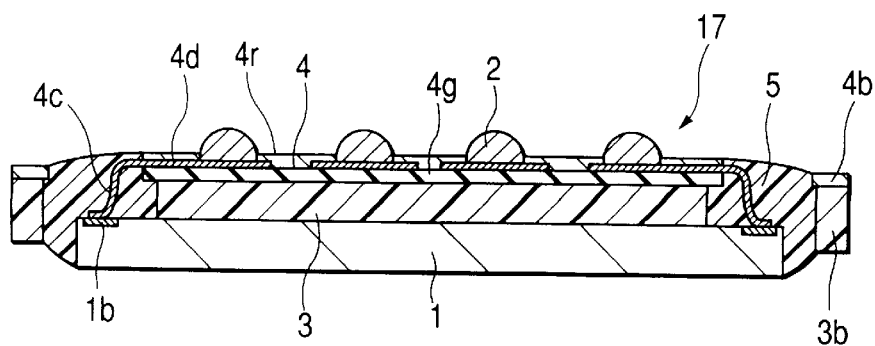
Figure 42A:
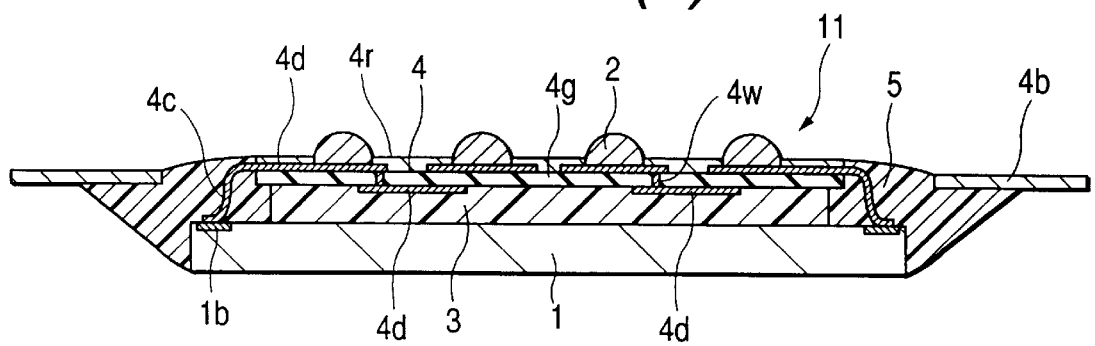
FIGS. 42(a), 42(b), 42(c) are cross-sections each showing a typical structure using a two-layer thin film wiring substrate in the semiconductor device according to the fifteenth embodiment of this invention.
Figure 42B:
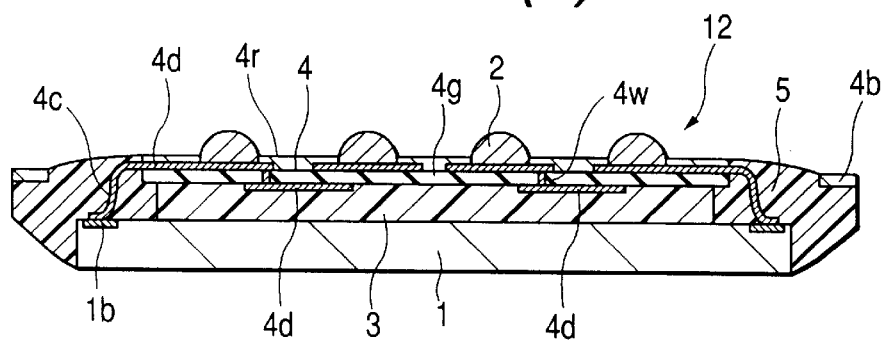
Figure 42C:
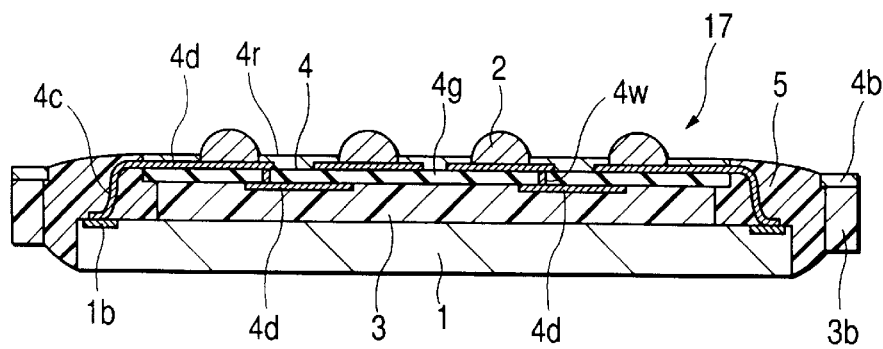

FIGS. 41(a), 41(b), 41(c) are cross-sectional views showing a typical structure using a single layer surface wiring thin film wiring substrate in a semiconductor device according to a fifteenth embodiment of this invention, and FIGS. 42(a), 42(b), 42(c) are cross-sectional views using a two-layer wiring thin film wiring substrate in a semiconductor device according to the fifteenth embodiment of this invention.

First, whereas the wiring 4d of the thin film wiring substrate 4 in the semiconductor device (CSP) according to the first-fourteenth embodiments was single layer wiring formed only on the reverse side of the tape base material (elastomer side), according to the fifteenth embodiment the thin film wiring substrate 4 is either single layer surface wiring wherein the wiring is formed only on the surface side of the tape (bump electrode side), or two layer wiring. This will now be described using the first embodiment (CSP11), second embodiment (CSP12) and seventh embodiment (CSP17) as examples.

First, FIG. 41 shows the case where the thin film wiring substrate 4 is single layer surface wired. FIG. 41(a) shows the case where the external structure of the semiconductor device is that of the tape (e.g. the CSP11 of the first embodiment). FIG. 41(b) shows the case where the external structure of the semiconductor device is that of a sealed contour (e.g. the CSP12 of the second embodiment). FIG. 41(c) shows the case where the external structure of the semiconductor device is that of the elastomer (e.g. the CSP17 of the seventh embodiment).

Herein, the single layer surface wiring is the wiring 4d formed on the top surface of the tape base material 4g of the thin film wiring substrate 4, and a solder resist 4r which is an insulating coating of approximately 10 to 30 μm thickness is formed at points excluding the bump lands 4f on the tape base material 4g (FIG. 27).

By using this single layer surface wiring, as the thickness of the solder resist 4r is only 10 to 30 μm which is relatively thin, solder corrosion in the region of the joins of the bump lands of the bump electrodes 2 is suppressed, and unevenness in the attachment height of the bump electrodes 2 is reduced.

FIG. 42 shows the case where the thin film wiring substrate 4 has two layer wiring. FIG. 41(a) shows the case where the external structure of the semiconductor device is that of the tape (e.g. the CSP11 of the first embodiment). FIG. 41(b) shows the case where the external structure of the semiconductor device is that of a sealed contour (e.g. the CSP12 of the second embodiment). FIG. 41(c) shows the case where the external structure of the semiconductor device is that of the elastomer (e.g. the CSP17 of the seventh embodiment).

In the case of two layer wiring, the wiring 4d is formed on the top surface and reverse side of the tape base material 4g of the thin film wiring substrate. The wiring 4d of the top and reverse sides is electrically connected by through holes 4w, and a solder resist 4r which is an insulating coating of approximately 10 to 30 μm thickness is formed at points excluding the bump lands 4f on the top surface of the tape base material 4g.

The remaining features of the construction of the semiconductor device (CSP) according to the fifteenth embodiment are identical to those of the first to fourteenth embodiments, so their description will not be repeated.

The CSP does not necessarily have both the single layer surface wiring and the two-layer wiring described in the fifteenth embodiment, and may have only the single layer surface wiring. Also, it is understood that these features may be applied not only to the first, second and seventh embodiments, but to any of the first to fourteenth embodiments.

According to the fifteenth embodiment, even when the number of bump electrodes 2 increases and complex wiring has to be performed, the wiring 4d is formed on the both the top and reverse sides of the tape base material 4g via the through holes 4w so that the complex wiring is possible.

As a result, the CSP can be manufactured even when the number of bump electrodes 2 increases.

Embodiment 16

Figure 43A:
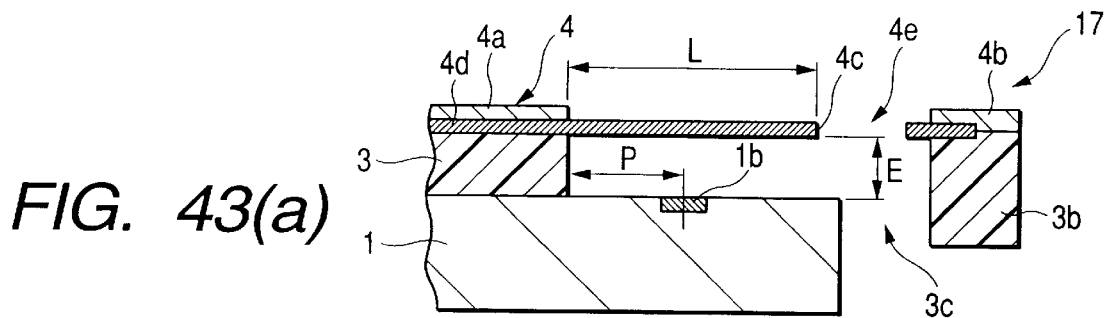
FIGS. 43(a), 43(b), 43(c), 43(d) are enlarged partial cross-sections each showing an example of a lead tip processing sequence in a method of manufacturing a semiconductor device according to the sixteenth embodiment of this invention.

FIGS. 43(a), 43(b), 43(c), 43(d) are enlarged partial cross-sections showing an example of a lead tip processing sequence in a semiconductor device manufacturing method according to a sixteenth embodiment of this invention, as follows:

FIG. 43(a) before bonding

Figure 43B:
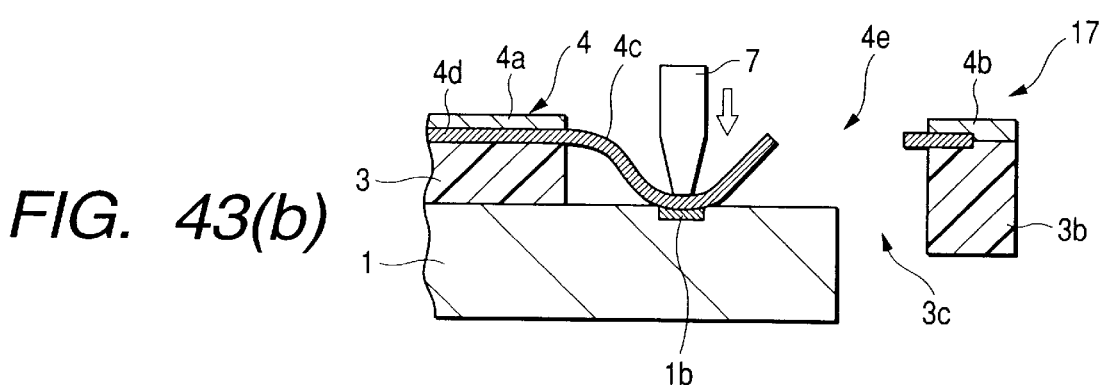

FIG. 43(b) during bonding

Figure 43C:
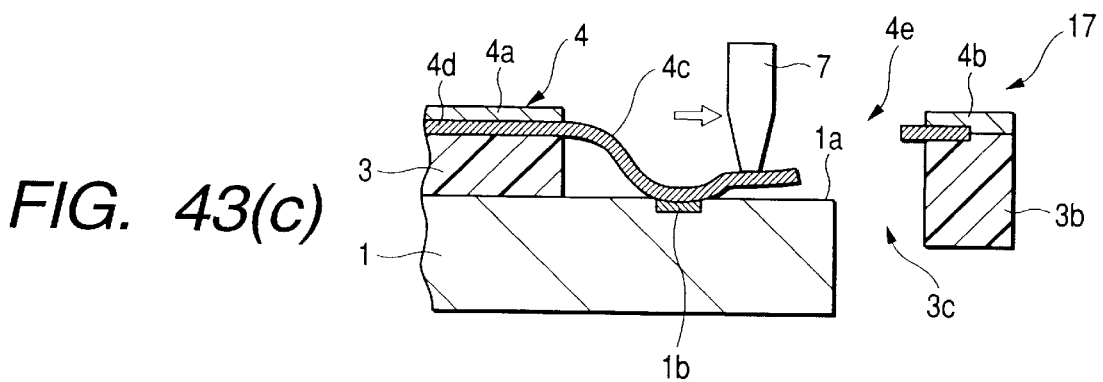

FIG. 43(c) after bonding

Figure 43D:
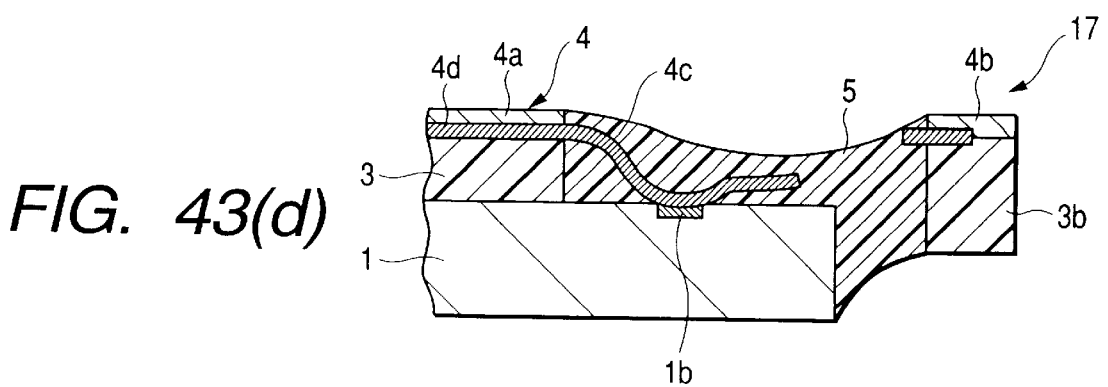

FIG. 43(d) after sealing

FIGS. 44(a) to (c) and FIGS. 45(a) to (c) are enlarged partial cross-sections showing another example of a lead tip processing sequence in a method of manufacturing a semiconductor device for comparison with the lead tip processing shown in FIG. 43.

Figure 44A:
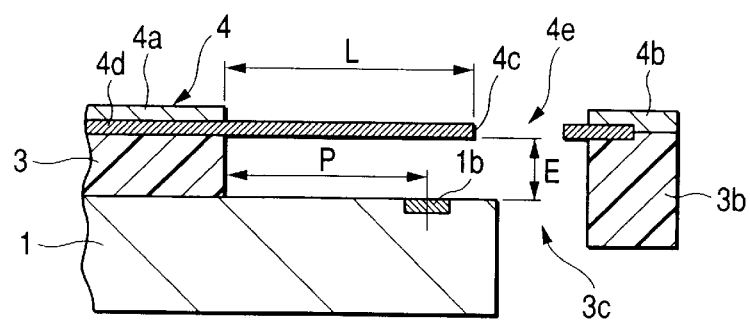
FIGS. 44(a), 44(b), 44(c) are enlarged partial cross-sections showing another example of a lead tip processing sequence in a method of manufacturing a semiconductor device according to the sixteenth embodiment of this invention, for comparison with the lead tip processing sequence of FIG. 43.

FIG. 44(a) before bonding

Figure 44B:
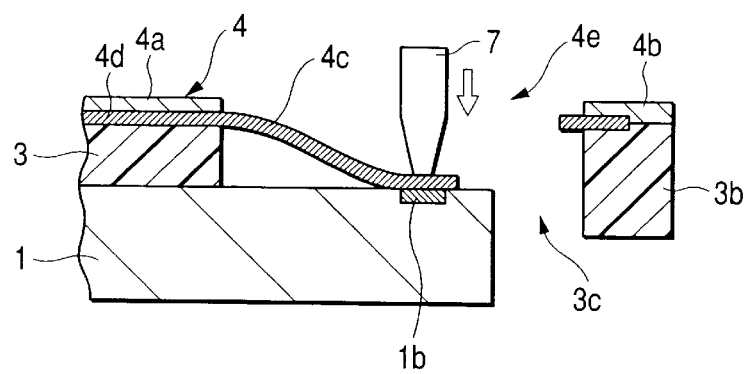

FIG. 44(b) during bonding

Figure 44C:
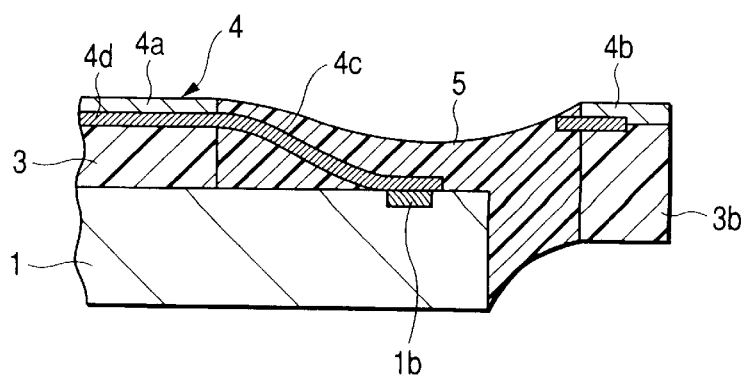

FIG. 44(c) after sealing

Figure 45A:
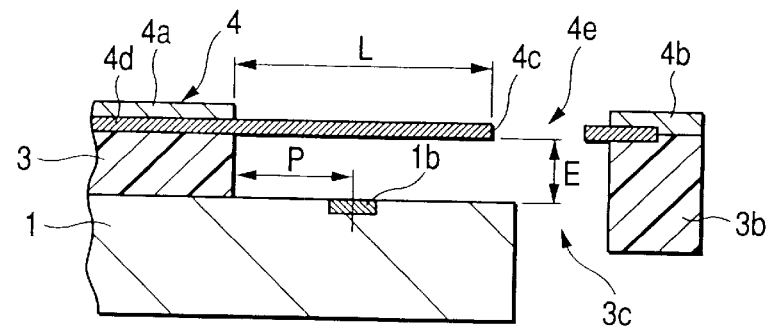
FIGS. 45(a), 45(b), 45(c) are enlarged partial cross-sections showing another example of a lead tip processing sequence in a method of manufacturing a semiconductor device according to the sixteenth embodiment of this invention, for comparison with the lead tip processing sequence of FIG. 43.

FIG. 45(a) before bonding

Figure 45B:
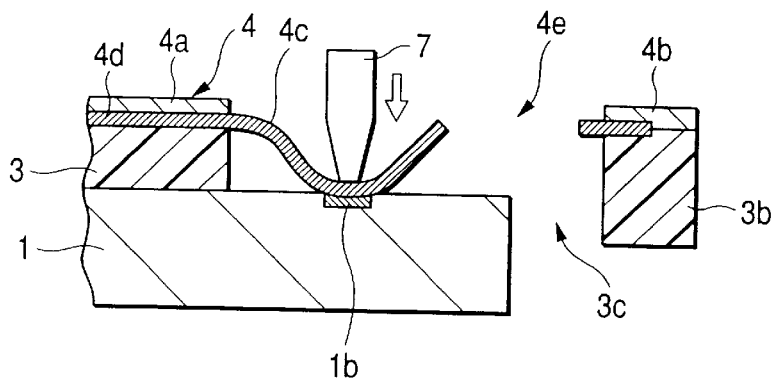

FIG. 45(b) during bonding

Figure 45C:
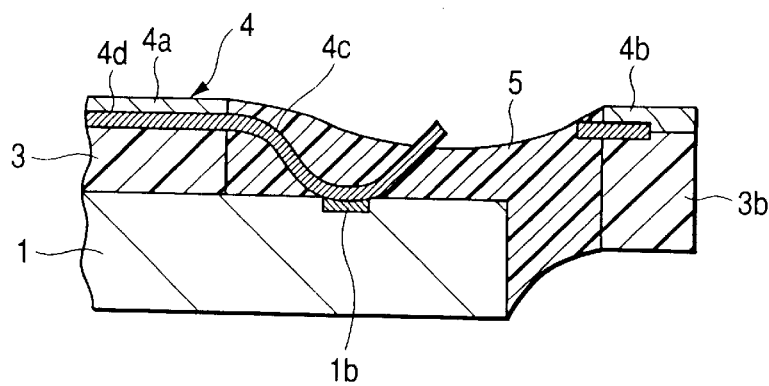
Figure 47A:
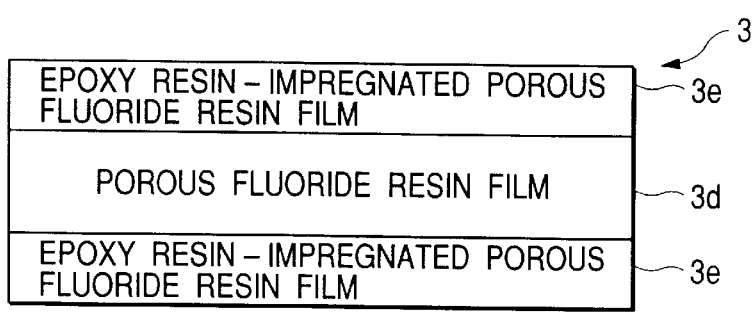
FIGS. 47(a) to 47(h) are diagrams showing typical elastomer compositions in a semiconductor device according to an eighteenth embodiment of this invention.
Figure 47B:
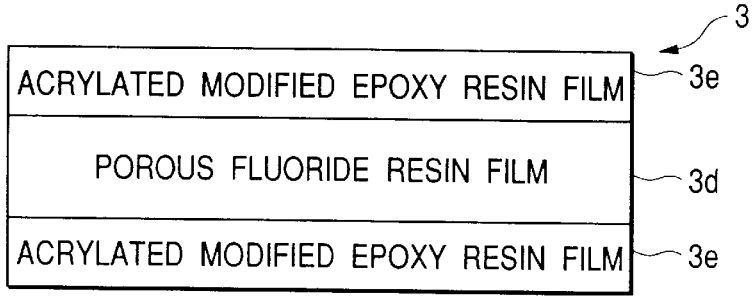
Figure 47C:
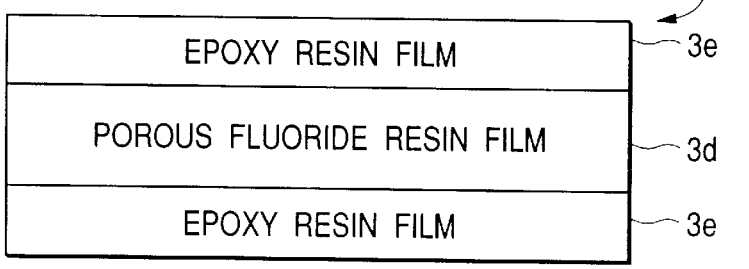
Figure 47D:
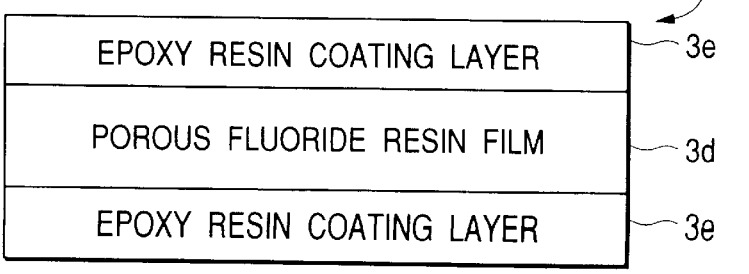
Figure 47E:
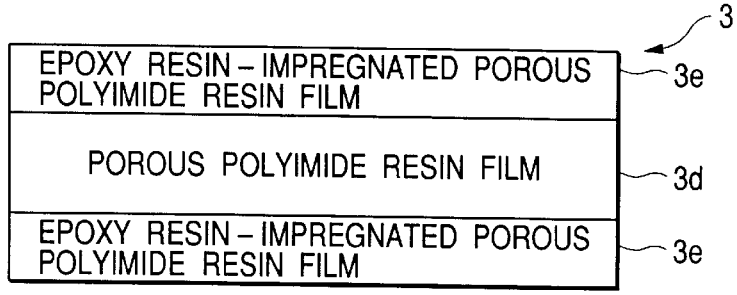
Figure 47F:
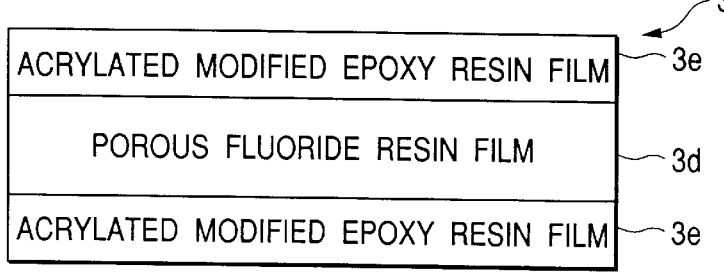
Figure 47G:
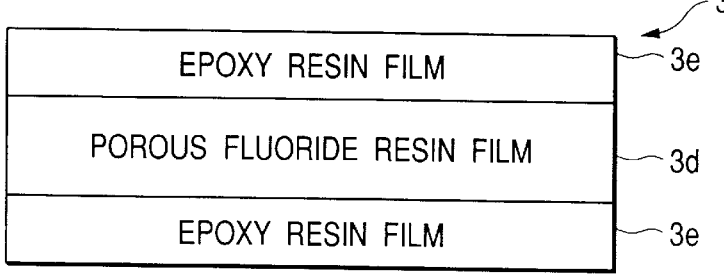
Figure 47H:
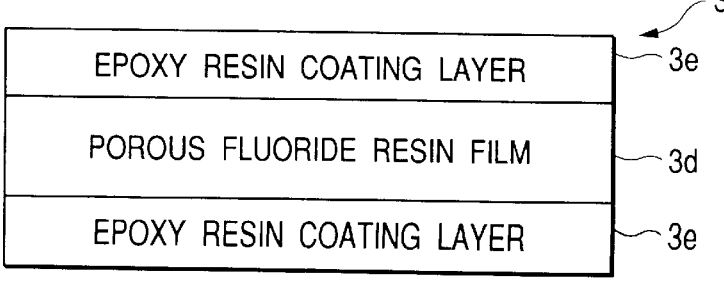

FIG. 45(c) after sealing

The sixteenth embodiment concerns the tip processing of the leads 4c during bonding in the semiconductor device (CSP) shown in the first to fifteenth embodiments.

The sixteenth embodiments will be described using the CSP17 described in the seventh embodiment as an example.

First, in the comparative example shown in FIG. 44, as a distance P shown in FIG. 44(a) is relatively long, the bonding tool 7 is moved (lowered) to perform bonding as shown in FIG. 44(b), and then the resin sealing 28 (FIG. 4) is performed to form the sealing part 5 as shown in FIG. 44(c) without tip processing of the leads 4c.

In this case, as the distance P shown in FIG. 44(a) is relatively long, the whole tip of the lead 4c after bonding is completely enclosed within the sealing part 5 as shown in FIG. 44(c).

In the comparative example shown in FIG. 45, the distance P shown in FIG. 45(a) is relatively short. The bonding tool 7 is moved (lowered) to perform bonding as shown in FIG. 45(b), and the resin sealing 28 (FIG. 4) is performed to form the sealing part 5 as shown in FIG. 44(c) without tip processing of the lead 4c.

In this case, as the distance P shown in FIG. 45(a) is relatively short, tip processing of the lead 4c after bonding is not performed as shown in FIG. 45(b), so the tip of the lead 4c after bonding protrudes beyond the sealing part 5 so that it is exposed as shown in FIG. 45(c).

On the other hand, in the CSP17 of the sixteenth embodiment shown in FIG. 43, the bonding tool 7 is lowered straight down toward the electrode pad 1b of the semiconductor chip 1, and the electrode pad 1b and the lead 4c of the thin film wiring substrate 4 are then electrically connected by the pressing action of the bonding tool 7, as shown in FIG. 43(b). The bonding tool 7 is then moved in the direction of the tip of the lead 4c (horizontal displacement) effectively parallel to the main surface 1a of the semiconductor chip 1, as shown in FIG. 43(c).

Specifically, after bonding, the pressure of the bonding tool 7 is removed, and the tip of the bonding tool 7 is displaced by a predetermined amount (e.g. 10 to 300 μm, but preferably 30 to 200 μm) in the direction of the tip of the lead 4c, then the resin sealing step 28 is performed so as to form the sealing part 5 as shown in FIG. 43(d).

The splash angle near the tip of the lead 4c can therefore be made small.

When the tip processing of the lead 4c is performed, the bonding tool 7 may first be raised by a predetermined amount (e.g. 5 to 100 μm, but preferably 10 to 60 μm) at the same time as the pressure of the bonding tool 7 is removed, and then displaced horizontally by the predetermined amount (e.g. 10 to 300 μm, but preferably 30 to 200 μm) in the direction of the tip of the lead 4c.

Regarding the tip processing of the lead 4c, the bonding tool 7 may be moved by the predetermined amount (e.g. 10 to 300 μm, but preferably 30 to 200 μm) in the direction of the tip of the lead 4c only when at least the distance P is relatively short compared to a length L of the projecting lead 4c and a thickness E of the elastomer 3 (e.g. $P \leq L-E$, but preferably $P \leq L-E-100 \mu m$). When the conditions regarding P, L, E shown in FIG. 43(a) are not satisfied, it is not necessary to perform tip processing of the lead 4c.

It will moreover be appreciated that it is not particularly necessary to perform tip processing of the lead 4c regardless of the distance P, length L and thickness E shown in FIG. 43(a).

The remaining features of the construction of the semiconductor device (CSP) according to the sixteenth embodiment are identical to those of the CSP shown in the first-fifteenth embodiments, so their description will not be repeated.

The tip processing of the lead 4c described in the sixteenth embodiment is not indispensable, and may be omitted.

It is understood that these features may be applied not only to the seventh embodiment, but also to any of the first to fifteenth embodiments.

According to the sixteenth embodiment, regarding connection of the lead 4c, the tip of the extra length of the lead 4c is prevented from protrudeing more than is necessary above the top surface (main surface 1a) of the semiconductor chip 1 regardless of the positions of the electrode pad 1b on the semiconductor chip 1 even when a lead 4c that is longer the required length is bonded.

Hence, the tip of the lead 4c is prevented from being exposed outside the sealing part even after the sealing part 5 has been formed by the resin sealing 28 of the lead 4c and electrode pad 1b, and as a result, the humidity resistance of the semiconductor device (CSP17) is more reliable.

Embodiment 17

FIG. 46 shows an elastomer specification showing a typical color specification of the elastomer (elastic structure) used in the semiconductor device (CSP) according to a seventeenth embodiment of this invention.

In this seventeenth embodiment, the case will be described where a colored elastomer is used for the semiconductor device (CSP) shown in the first to sixteenth embodiments.

Specifically, the elastomer 3 of the CSP in the first to sixteenth embodiments is colorless, and it is an effectively transparent body which transmits light.

On the other hand, the elastomer 3 (elastic structure) of the seventeenth embodiment comprises a coloring agent in the adhesive layer 3e formed on both sides of the skeleton layer 3d (FIG. 47 described hereafter).

Specific examples of the specification of the colored elastomer 3 are the specification ① and specification ② shown in FIG. 46. The coloring agent used here is carbon.

In the colored elastomer specifications ① and ② shown in FIG. 46, the adhesive layer 3e on both sides of the skeleton layer 3d contains the coloring agent, however the invention is not limited to this arrangement and the adhesive layer 3e on only one side may contain the coloring agent.

In the specifications ① and ② shown in FIG. 46 of the seventeenth embodiment, the adhesive layers 3e contain the coloring agent, however the intermediate layer which is the skeleton layer 3d may also contain the coloring agent, or both the adhesive layer 3e and the skeleton layer 3d may contain the coloring agent.

In other words, it is sufficient if at least one of the parts comprising the elastomer 3 contains the coloring agent.

In the specifications ① and ② shown in FIG. 46, the coloring agent was carbon particles, however the coloring material is not limited to this and may be another inorganic pigment or organic dye.

In the specification ① and ② shown in FIG. 46, the coloring agent is black carbon, but the coloring agent may be red, blue, green, pink, yellow or another color, or an intermediate color.

The remaining features of the construction of the semiconductor device (CSP) according to the seventeenth embodiment are identical to those of the CSP shown in the first-sixteenth embodiments, so their description will not be repeated.

It should be noted that it is not absolutely necessary for the elastomer 3 in the CSP of the seventeenth embodiment to contain a coloring agent.

However, by arranging for the elastomer 3 to contain a predetermined amount of coloring agent according to the seventeenth embodiment, the transmittance of the elastomer 3 can be lowered without affecting basic properties of the elastomer 3 such as elastic modulus, thermal expansion coefficient, flame-retarding properties and humidity absorption.

In this way, the circuit of the semiconductor chip 1 may be obscured from light.

As a result, ultraviolet radiation, etc. which may cause incorrect operation of the semiconductor chip 1 can be blocked, and stability of the electrical circuit of the CSP is enhanced.

By using carbon as coloring agent, a predetermined light obscuring effect may be obtained by a small addition amount, so deterioration of the basic characteristics of the elastomer 3 may be suppressed to the minimum.

Also, by incorporating the coloring agent in at least one of the adhesive layers 3e rather than the skeleton layer 3d of the elastomer 3, the elastomer 3 can be colored at low cost.

Embodiment 18

Figure 48A:
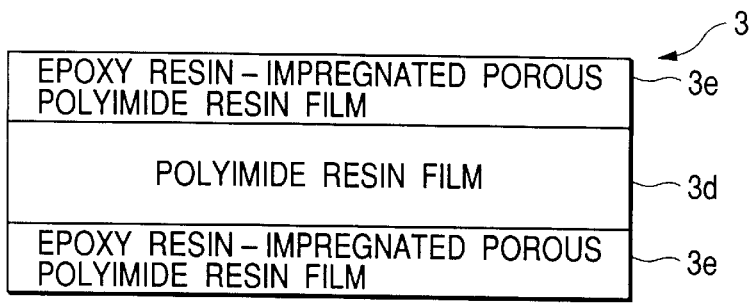
Figure 48B:
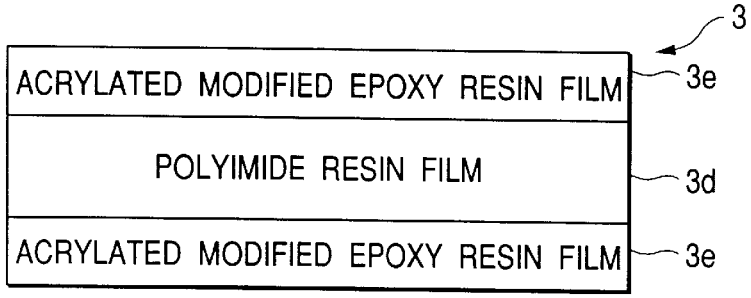
Figure 48C:
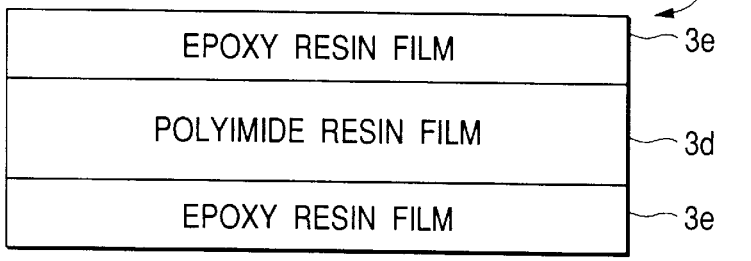
Figure 48D:
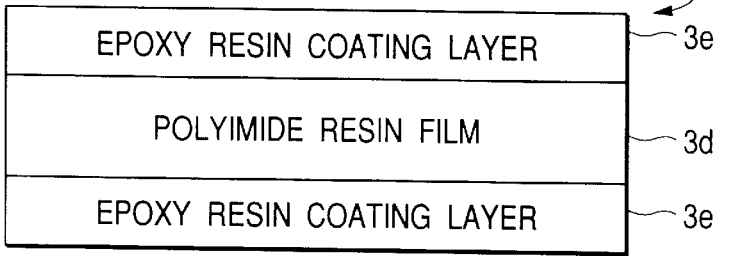
Figure 48E:
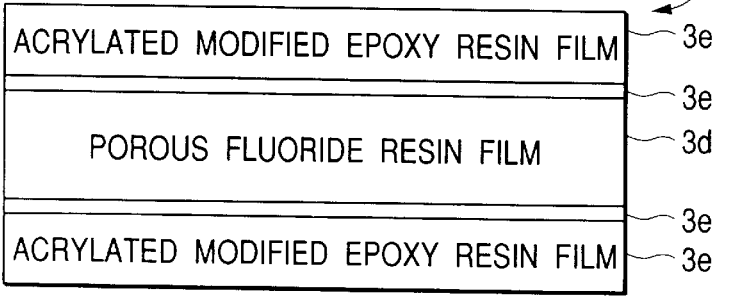

FIGS. 47(a) to 47(h) are component charts showing examples of the detailed composition of an elastomer in a semiconductor device according to an eighteenth embodiment of this invention. FIGS. 48(a) to 48(e) are component charts showing examples of the detailed composition of an elastomer in a semiconductor device according to the eighteenth embodiment of this invention. FIGS. 48(a) to 48(d) show 3-layer structures, and FIG. 48(e) shows a 5-layer structure.

Embodiment 18 concerns specific materials of each component of the elastomer 3 in the semiconductor device (CSP) of the first-seventeenth embodiments.

Herein, FIGS. 47 and 48(a) to 48(d) show the case where the elastomer 3 comprises three layers, and FIG. 48(e) shows the case where the elastomer 3 comprises five layers.

In the five layer structure, other thin adhesive layers 3e are formed between the skeleton layer 3d and the two (outermost) adhesive layers 3e. According to the eighteenth embodiment, a specific example of this five layer structure is shown in FIG. 48(e), but in FIG. 47 and FIG. 48, it is particularly effective to use this five layer structure when film layers are formed on both sides of the skeleton layer 3d instead of coating layers in the elastomer 3.

In an elastomer 3 wherein the outer upper and lower layers are film layers, the use of this five layer structure further reduces the rigidity of the film layers (adhesive layers 3e).

As a result, the rigidity of the elastomer 3 is also reduced, so the elastomer easily molds to the contour of the leads 4c and the contact of the elastomer 3 is improved.

Herein, the materials of each component of the elastomer 3 are not limited to those of the eighteenth embodiment shown in FIG. 47 and FIG. 48, and the elastomer may also be a multi-layer structure wherein the number of layers is not limited to three or five.

It is preferable that a porous material (for detailed structure of this porous material, refer to the first embodiment) comprising a 3-dimensional mesh structure is used for the skeleton layer 3d.

The remaining features of the construction of the semiconductor device (CSP) according to the eighteenth embodiment are identical to those of the CSP shown in the first to seventeenth embodiments, so their description will not be repeated.

Embodiment 19

Figure 49A:
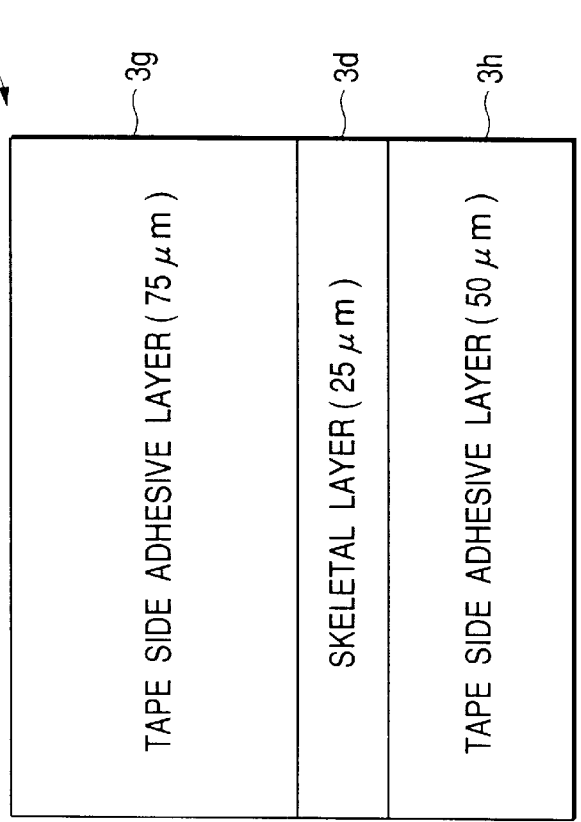
FIGS. 49(a) and 49(b) show example thicknesses of a skeleton layer and adhesive layers of an elastomer according to a nineteenth embodiment of this invention.

FIGS. 49(a), (b) are diagrams showing typical thicknesses of the skeleton layer and adhesive layers in an elastomer of a semiconductor device according to a nineteenth embodiment of this invention.

The nineteenth embodiment concerns the thicknesses of the adhesive layers 3e (FIG. 47 and FIG. 48) and the skeleton layer 3d in the elastomer (elastic structure) of the semiconductor device (CSP) shown in the first to eighteenth embodiments.

FIG. 49 shows the case where the elastomer 3 comprises three layers.

First, in the elastomer 3, the thickness of the tape side adhesive layer 3g is made thicker than the wiring 4d of the tape base material 4g (e.g. at least 1.2 times or at least 1.5 times).

Specifically, when for example the thickness of the wiring 4d is 18 µm, the thickness of the tape side adhesive layer 3g is at least 21.6 µm or preferably at least 27 µm.

Further, when for example the thickness of the wiring 4d is 25 µm, the thickness of the tape side adhesive layer 3g is at least 30 µm or preferably at least 37.5 µm.

FIG. 49(a) shows the case where the tape side adhesive layer 3g (adhesive layer adjacent to thin film wiring substrate) and the chip side adhesive layer 3h have the same thickness. As an example, the thickness of these two layers is 30 µm and the thickness of the skeleton layer 3d which is the intermediate layer is 100 µm.

If for example the thickness of the wiring 4d is 18 µm, as the thickness of the upper and lower adhesive layers 3e (herein, the tape side adhesive layer 3g and chip side adhesive layer 3h) is 30 µm, and the thickness of the skeleton layer 3d is 100 µm, the total thickness of the elastomer 3 is 160 µm.

Figure 49B:
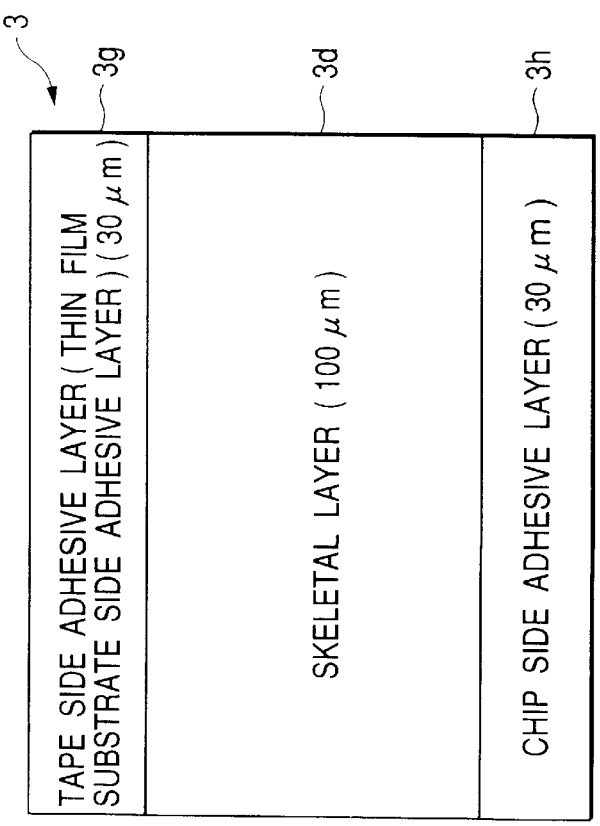

FIG. 49(b) shows the case where the tape side adhesive layer 3g (adhesive layer adjacent to thin film wiring substrate) is thicker than the chip side adhesive layer 3h. As an example, the thickness of the tape side adhesive layer 3g is 75 µm, the thickness of the chip side adhesive layer 3h is 50 µm, and the thickness of the skeleton layer which is the intermediate layer is 25 µm.

If for example the thickness of the wiring 4d is 18 µm, as the thickness of the tape side adhesive layer 3g is 75 µm, the thickness of the chip side adhesive layer 3h is 50 µm and the thickness of the skeleton layer 3d is 25 µm, the total thickness of the elastomer 3 is 150 µm.

It should be noted that the thicknesses given in FIG. 49 are only examples, and the invention is not limited to them.

The remaining features of the construction of the semiconductor device (CSP) according to the nineteenth embodiment are identical to those of the CSP shown in the first to eighteenth embodiments, so their description will not be repeated.

Moreover, the thickness of the tape side adhesive layer 3g and the chip side adhesive layer 3h may be identical or different.

According to the nineteenth embodiment, by arranging the thickness of the tape side adhesive layer 3g to be greater (e.g. at least 1.2 times or at least 1.5 times) than the thickness of the wiring 4d, undulations due to the wiring 4d on the adhesive surface of the tape side base material 4g can be covered, and as a result, the contact of the tape side adhesive layer 3g is improved.

This gives a CSP of high reliability.

Also, by arranging the tape side adhesive layer 3g and chip side adhesive layer 3h to have the same thickness, contact between the tape base material 4g and semiconductor chip 1 is improved, and a high efficiency, low cost elastomer 3 can be manufactured.

Finally, by arranging the thickness of the tape side adhesive layer 3g to be greater than the thickness of the chip side adhesive layer 3h, even better contact can be obtained with the undulations of the tape side adhesive layer 3g due to the wiring 4d within the thickness conditions determined for the elastomer overall. As a result, good adhesion is obtained and a CSP of high reliability can be manufactured.

Embodiment 20

Figure 50:
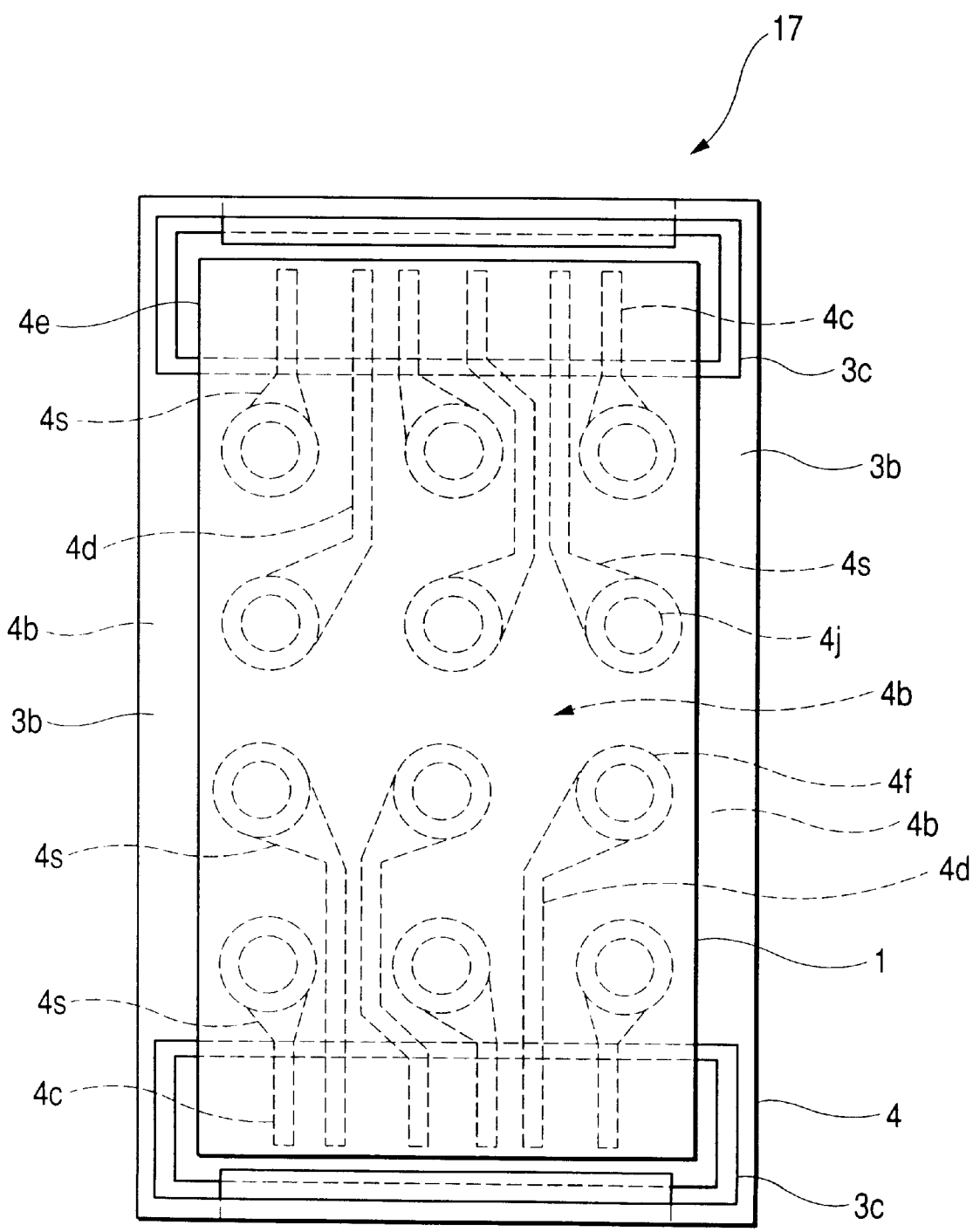
FIG. 50 is a view of a base surface showing the under surface of the semiconductor device (CSP) shown in FIG. 20.

FIG. 50 is a base plane diagram showing the structure of the under surface of a semiconductor device according to a twentieth embodiment of this invention.

The twentieth embodiment concerns the width of the wiring 4d in the thin film wiring substrate 4 in the semiconductor device (CSP) shown in the first to nineteenth embodiments.

The twentieth embodiment will be described taking the CSP17 of the seventh embodiment as an example.

In the CSP17 shown in FIG. 50, the wiring width of connecting parts 4s which connect with the bump lands 4f of the wiring 4d formed in the thin film wiring substrate 4, is formed wider than the wiring width of the wiring 4d at points remote from the connecting parts 4s, and the wiring width of the connecting parts 4s progressively becomes narrower with increasing distance from the bump lands 4f.

Specifically, in the wiring 4d reaching the leads 4c from the bump land 4f formed in the tape base material 4g (FIG. 27), the wiring width of the connecting parts 4s which connect with the bump lands 4f is wider than the wiring width of the wiring 4d at points distant from these connecting parts 4s, these parts tapering off so that the wiring width of the connecting part 4s gradually becomes narrower with increasing distance from the bump lands 4f.

In the CSP17 shown in FIG. 50, the wiring width of all twelve of the connecting parts 4s is formed wide, and these wide connecting parts 4s progressively become narrower with increasing distance from the bump lands 4f.

The remaining features of the construction of the semiconductor device (CSP) according to the twentieth embodiment are identical to those of the CSP of the first to nineteenth embodiments, so their description will not be repeated.

However, it is not absolutely necessary to form the connecting parts 4s described in the twentieth embodiment, and they may be omitted.

Of the wiring formed on the tape base material 4g, the wiring 4d protrudeing from the connecting parts 4s which are connected to the bump lands 4f immediately adjacent to the leads 4c, is a relatively short distance away from the leads 4c.

Therefore when a load acts on the leads 4c and wiring 4d, stress tends to concentrate in the connecting parts 4s which are connected to the bump lands 4f immediately adjacent to the leads.

It is therefore desirable that when the connecting parts 4s are formed, these connecting parts 4s which are connected to the bump lands 4f immediately adjacent to the leads 4c are formed wider than other parts.

It is of course understood that the features of this invention may be applied not only to the seventh embodiment, but also to the first-nineteenth embodiments.

According to the twentieth embodiment, the connecting parts 4s between the wiring 4d and bump lands 4f are formed wide, so stress does not easily concentrate in these connecting parts 4s.

Hence during a temperature cycle, even if the tape base material 4g and wiring 4d deform due to thermal contraction and expansion, the connecting parts 4s between the wiring 4d and bump lands 4f do not break.

Embodiment 21

Figure 52A:
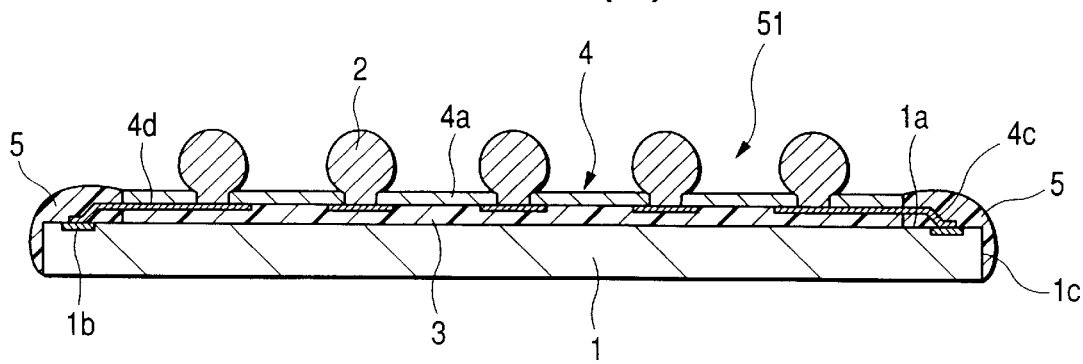
Figure 52B:
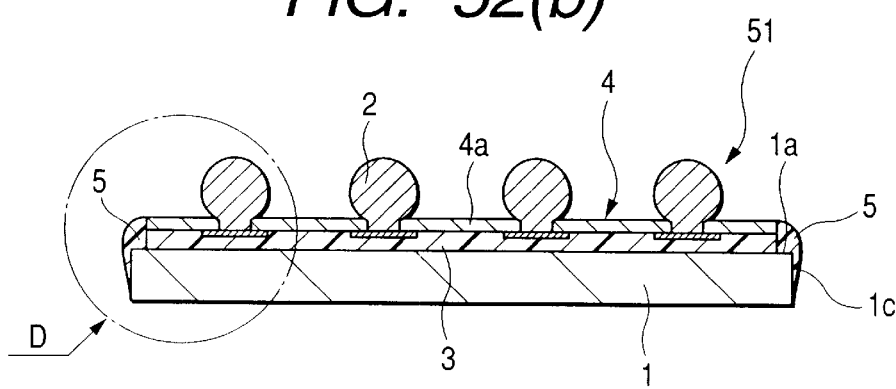
Figure 52C:
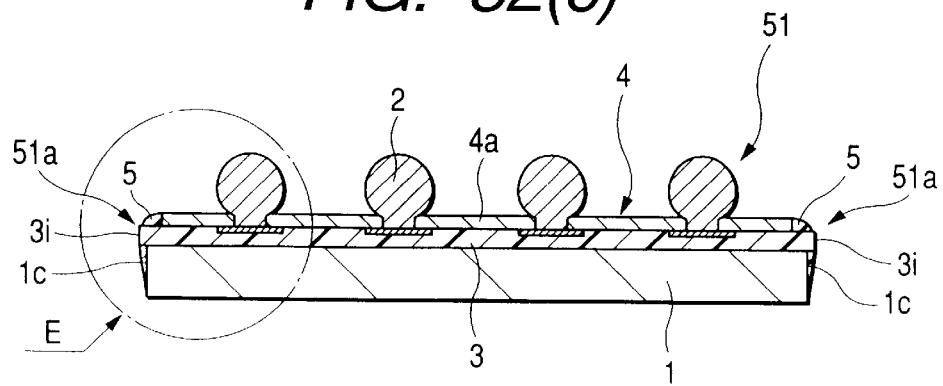
Figure 53A:
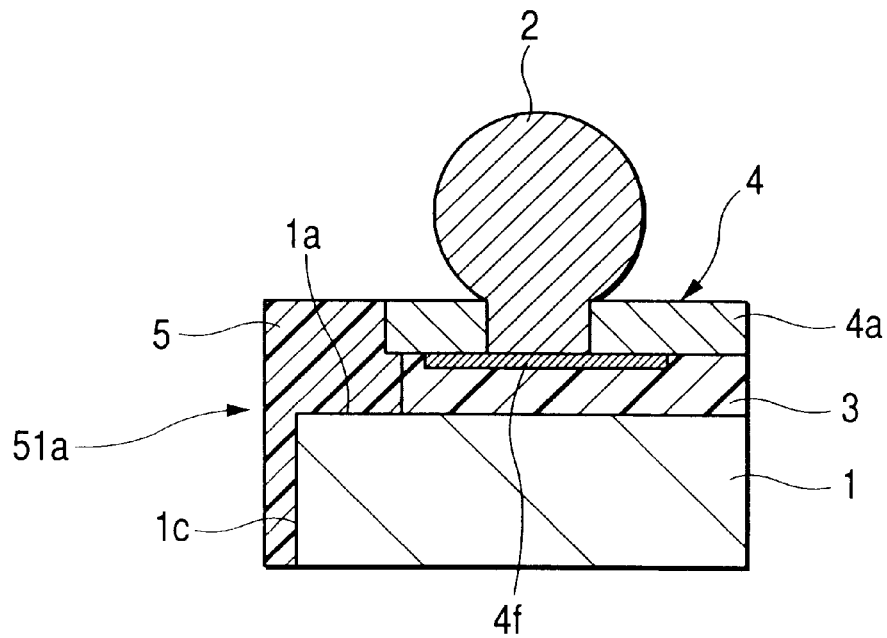
Figure 53B:
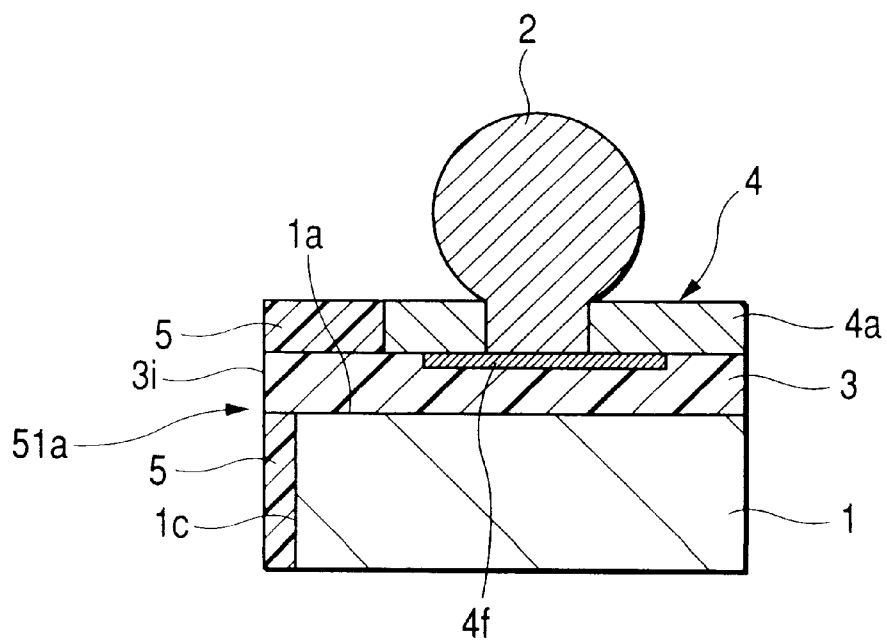

FIGS. 51(a) to 51(d) are figures each showing a typical structure of a semiconductor device according to a twenty-first embodiment of this invention. FIG. 51(*a*) is a base plan view, FIG. 51(*b*) is a side view, FIG. 51(*c*) is a plan view of which part has been cut away, and FIG. 51(*d*) shows a front view. FIGS. 52(*a*) to 52(*c*) are diagrams of the construction of the semiconductor device shown in FIG. 51. FIG. 52(*a*) is a cross-sectional view through a line A—A in FIG. 51. FIG. 52(*b*) is a cross-sectional view through a line B—B in FIG. 51. FIG. 52(*c*) is a cross-sectional view through a line C—C in FIG. 51. FIGS. 53(*a*) and 53(*b*) are enlarged partial cross-sections of the structure of the semiconductor device shown in FIG. 52. FIG. 53(*a*) is a view of a part D in FIG. 52(*b*), FIG. 53(*b*) is a view of a part E in FIG. 52(*c*), and FIGS. 54(*a*) to 54(*f*) are diagrams each showing an example of a method of manufacturing a thin film wiring substrate used in the semiconductor device according to the twenty-first embodiment of this invention. FIGS. 54(*a*), 54(*c*), 54(*e*) are partial plan views, FIG. 54(*b*), 54(*d*), 54(*f*) are respectively cross-sectional views showing a section through A—A. FIGS. 55(*a*) to 55(*d*) are diagrams each showing an example of a method of manufacturing a thin film wiring substrate used in the semiconductor device according to the twenty-first embodiment of this invention. FIGS. 55(*a*), 55(*c*) are partial plan views, 55(*b*), 55(*d*) are respectively cross-sectional views showing a section through A—A. FIGS. 56(*a*) to 56(*f*) are diagrams each showing an example of a method of manufacturing a thin film wiring substrate used in the semiconductor device according to the twenty-first embodiment of this invention. FIGS. 56(*a*), 56(*d*) are partial plan views, 56(*b*), 56(*e*) are respectively cross-sectional views showing a section through A—A, 56(*c*), 56(*f*) are respectively cross-sectional views showing a section through B—B. FIGS. 57(*a*) to 57(*f*) are diagrams each showing an example of a method of manufacturing a thin film wiring substrate used in the semiconductor device according to the twenty-first embodiment of this invention. FIGS. 57(*a*), 57(*d*) are partial plan views, 57(*b*), 57(*e*) are respectively cross-sectional views showing a section through A—A, 57(*c*), 57(*f*) are respectively cross-sectional views showing a section through B—B. FIGS. 58(*a*) to 58(*f*) are diagrams each showing an example of a method of manufacturing a thin film wiring substrate used in the semiconductor device according to the twenty-first embodiment of this invention. FIGS. 58(*a*), (*d*) are partial plan views, 58(*b*), 58(*e*) are respectively cross-sectional views showing a section through A—A, 58(*c*), 58(*f*) are respectively cross-sectional views showing a section through B—B.

A semiconductor device (CSP51) according to the twenty-first embodiment is a peripheral pad type fan-in CSP identical to the CSP17 of the seventh embodiment shown in FIG. 24. It has a substantially identical structure to that of the CSP17, however differences from the CSP17 of the seventh embodiment are that the thin film wiring substrate 4 does not comprise the base protruding parts 4*b* shown in FIG. 24, and the elastomer 3 (FIG. 51(*a*)) which is an elastic structure comprises exposed parts 3*i* which are exposed to the outside, as shown in FIG. 51(*b*).

Specifically, whereas the CSP of the first to twentieth embodiments is a structure wherein at least the thin film wiring substrate 4 comprises substrate protruding parts 4*b* which protrude beyond the periphery of the semiconductor chip 1, the CSP51 according to the twenty-first embodiment is a structure wherein the thin film wiring substrate 4 does not comprise the substrate protruding parts 4*b*.

The CSP51 therefore does not comprise the elastomer protruding parts 3*b* provided in the elastomer of the CSP17 shown in FIG. 24.

Herein, the detailed structure of the CSP51 according to the twenty-first embodiment will be described.

The CSP51 comprises the elastomer 3 (elastic structure) provided with the exposed parts 3*i* arranged on the main surface 1*a* of the semiconductor chip 1 for exposing the electrode pads 1*b* (connection terminals), a substrate body 4*a* provided with the wiring 4*d* whereof one end is electrically connected to the electrode pads 1*b* via the leads 4*c* and the other ends are electrically connected to the bump electrodes 2 (external terminals), the thin film wiring substrate 4 comprising the openings 4*e* for exposing the electrode pads 1*b*, and a sealing part 5 for sealing the electrode pads 1*b* of the semiconductor chip 1 and the thin film wiring substrate 4.

In the CSP51 shown in FIG. 51, 20 of the bump electrodes 2 are provided.

The CSP51 comprises the exposed parts 3*i* of the elastomer 3 (FIG. 51(*a*)) on the two long side faces 51*a* as shown in FIG. 51(*b*), there being four of the exposed parts 51*a* on each of the two sides 51*a* of the CSP51.

The remaining features of the construction of the semiconductor device (CSP) according to the twenty-first embodiment are identical to those of the CSP17 of the seventh embodiment, so their description will not be repeated.

The method of manufacturing the CSP51 according to the twenty-first embodiment will now be described.

First, as shown in FIG. 54 and FIG. 55, the elastomer 3 joined to the substrate body 4*a* comprising the wiring 4*d* is manufactured, the openings 4*e* comprising the leads 4*c* connected to the wiring 4*d* are formed, and the thin film wiring substrate 4 (FIG. 55(*c*)) wherein the substrate body 4*a* is supported in a substrate frame 4*t* by supporters 3*j* of the elastomer 3 is prepared.

The method of manufacturing the thin film wiring substrate 4 will be described referring to FIG. 54 and FIG. 55.

The tape base material 4*g* comprising a polyimide resin shown in FIG. 54(*a*) is prepared. An adhesive is coated on the top surface, under surface or both the top surface and under surface of the tape base material 4*g* in order to attach the copper foil 4*h* shown in FIG. 54(*c*).

Next, reference holes 4*i* for tape feed are formed at an approximately equal interval on both sides of the tape base material 4*g*.

Next, 20 of the bump openings 4*j* are formed. Two of the wiring join openings 4*e* and two of the long cutting holes 4*q* are formed on both sides by a punch die as shown in FIG. 54(*a*), and the copper foil 4*h* is laminated on the tape base material 4*g* as shown in FIGS. 54(*c*), 54(*d*).

The copper foil 4*h* is formed into a desired shape by etching as shown in FIG. 54(*e*) so as to form the wiring pattern.

Next, the tape base material 4*g* is attached to the elastomer 3 as shown in FIGS. 55(*a*), 55(*b*).

The elastomer 3 used in the twenty-first embodiment comprises four long supporting members 3*j* on each side (a total of eight on both sides) as shown in FIG. 55(*a*). These supporting members 3*j* straddle the four long holes 4*q* of the thin film wiring substrate 4 and are sufficiently long to reach the substrate frame 4*t*.

However the number of the supporting members 3*j* is not limited to eight, and any number is permitted.

The number of these supporting members 3*j* corresponds to the number of exposed parts 3*i* of the CSP51.

Hence, the elastomer 3 is attached to the thin film wiring substrate 4, the body of the elastomer 3 is attached to the substrate body 4*a* of the thin film wiring substrate 4, and the eight supporting members 3j of the elastomer 3 are arranged to straddle the long holes 4q of the thin film wiring substrate 4 so as to attach them to the substrate frame 4t.

Next, four suspension members 4u supporting the substrate body 4a shown in FIG. 55(a) are cut so that the substrate body 4a is supported in the substrate frame 4t by the supporting members 3j of the elastomer 3.

In other words, the substrate body 4a of the thin film wiring substrate 4 shown in FIG. 55(c) is supported by the elastomer attached to it.

As a result, the thin film wiring substrate 4 to which the elastomer 3 is attached is formed as shown in FIGS. 55(c), 55(d) and FIGS. 56(a) to 56(c).

Next, the electrode pads 1b (FIG. 51) of the semiconductor chip 1 are exposed by the openings 4e of the thin film wiring substrate 4, and the main surface 1a of the semiconductor chip 1 and the elastomer 3 are joined.

In other words, the semiconductor chip 1 is attached to the elastomer 3 as shown in FIGS. 56(d) to 56(f).

Next, the electrode pads 1b of the semiconductor chip 1 (FIG. 51) and the corresponding leads 4c of the thin film wiring substrate 4 are electrically connected, as shown in FIG. 57(a).

Next, the resin sealing 28 (FIG. 4) of the electrode pads 1b of the semiconductor chip 1 and the leads 4c of the thin film wiring substrate 4 is performed by a potting method using sealing resin as shown in FIGS. 57(d) to 57(f) so as to form the sealing parts 5.

The resin sealing 28 maybe performed also by the transfer mold method.

Next, a bump pole material is supplied to the bump openings 4j of the substrate body 4a, and the bump electrodes 2 are formed as shown in FIGS. 58(a)–(c) by passing the assembly through a reflow furnace, not shown.

In this way, the wiring 4d of the substrate body 4a (FIG. 51 or FIG. 52) is electrically connected to the bump electrodes 2.

Next, the supporting members 3j of the elastomer 3 are cut so as to separate them from the substrate frame 4t of the substrate body 4a, and the exposed parts 3i (FIG. 58(e)) of the elastomer 3 formed by the cut supporting members 3j, are thereby exposed.

Therefore, the CPS51 as shown in FIGS. 58(d) to 58(f) or FIG. 51 can be produced.

The remaining features of the method of manufacture of the CSP51 are identical to those of the CSP17 of the seventh embodiment, so their description will not be repeated.

It will be understood that the techniques of the aforesaid fourteenth-twentieth embodiments may be applied also to the CSP51 of the twenty-first embodiment.

The advantages of the CSP51 of the twenty-first embodiment and of its method of manufacture are as follows.

If the internal pressure of the elastomer rises due to expansion of water vapor and gas during solder reflow when the bump electrodes are formed, this gas (vapor) can escape from the exposed parts 3i of the elastomer 3 to the outside via a gas escape path 36 as shown in FIG. 51(a) (gas can escape from any of the eight exposed parts 3i).

In other words, gas can be released by the exposed parts 3i of the elastomer 3.

The occurrence of the popcorn phenomenon wherein the sealing part 5 is ruptured, is thereby prevented.

As a result, reliability of the CSP51 is improved.

The remaining advantages of the method of manufacture of the CSP51 according to the twenty-first embodiment are identical to those of the CSP17 of the seventh embodiment, so their description will not be repeated.

Embodiment 22

Figure 59A:
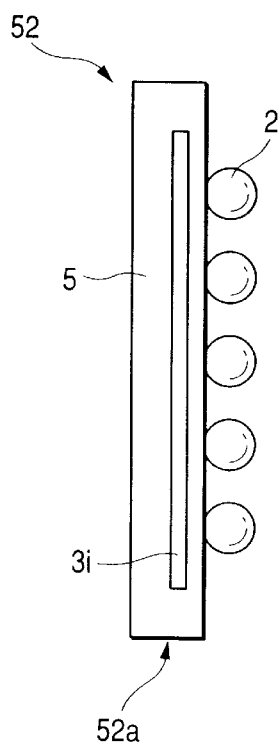
Figure 59B:
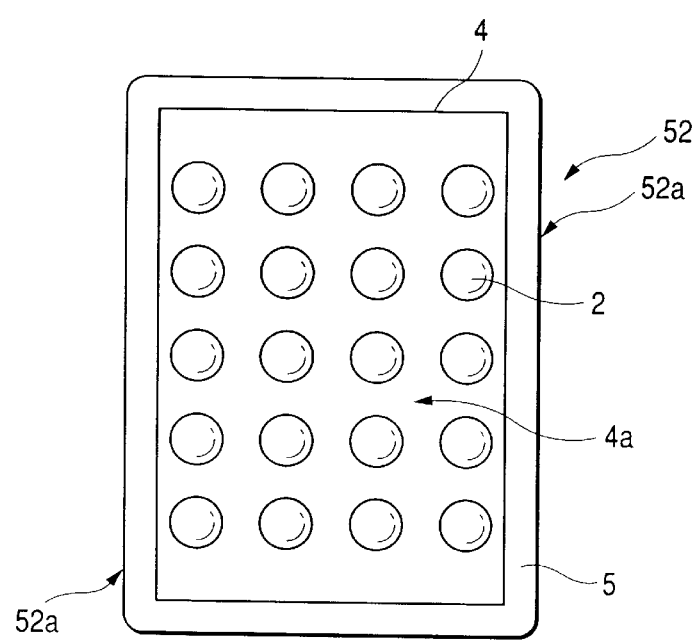
Figure 59C:
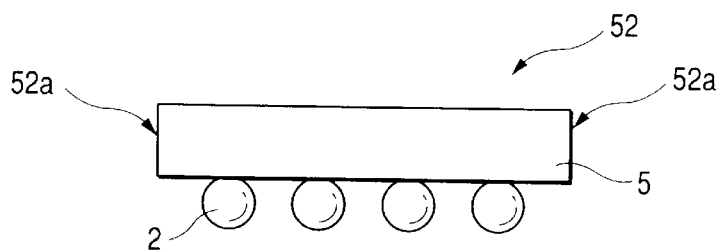

FIGS. 59(a) to 59(c) show examples of the structure of a semiconductor device according to a twenty-second embodiment. FIG. 59(a) is a side view, FIG. 59(b) is a plan view, FIG. 59(c) is a front view.

A CSP52 (semiconductor device) according to the twenty-second embodiment is a peripheral pad type fan-in CSP as is the CSP51 of the twenty-first embodiment shown in FIG. 51. It has a substantially identical structure to that of the CSP51, however differences from the CSP51 of the twenty-first embodiment are that all of the side faces of the elastomer 3 (FIG. 51) are exposed in the side faces 52a of the CSP52, as shown in FIG. 59.

In other words, in the CSP52, all the side faces of the elastomer 3 are exposed as the exposed parts 3i after manufacture is complete, as shown in FIG. 59(a).

The remaining features of the construction of the CSP52 according to the twenty-second embodiment are identical to those of the CSP51 of the twenty-first embodiment, so their description will not be repeated.

It will be understood that the techniques of the aforesaid fourteenth to twentieth embodiments may be applied also to the CSP52 of the twenty-second embodiment.

The advantages of the CSP52 of the twenty-second embodiment and of its method of manufacture are as follows.

In the CSP52, as the entire side faces of the elastomer 3 form the exposed parts 3i, the exposed surface area of the elastomer 3 is increased.

Hence, the gas release effect due to the exposed areas 3i of the elastomer 3 is enhanced.

As a result, the reliability of the CSP52 is further improved.

The remaining features of the CSP52 according to the twenty-second embodiment and of its method of manufacture are identical to those of the CSP52 of the twenty-second embodiment, so their description will not be repeated.

Embodiment 23

Figure 62A:
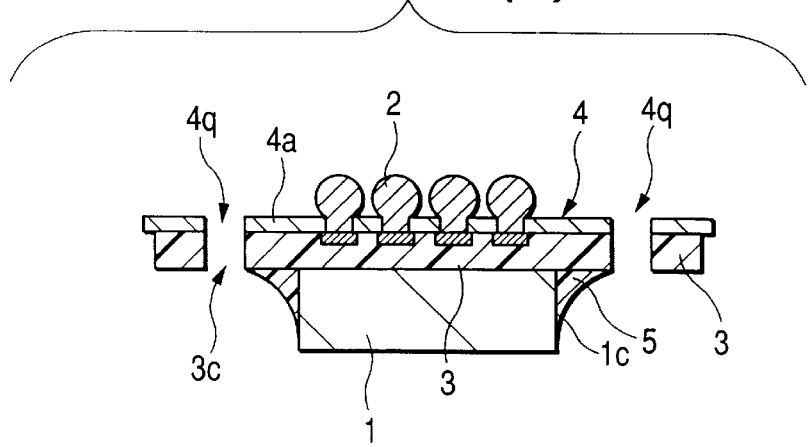
Figure 62B:
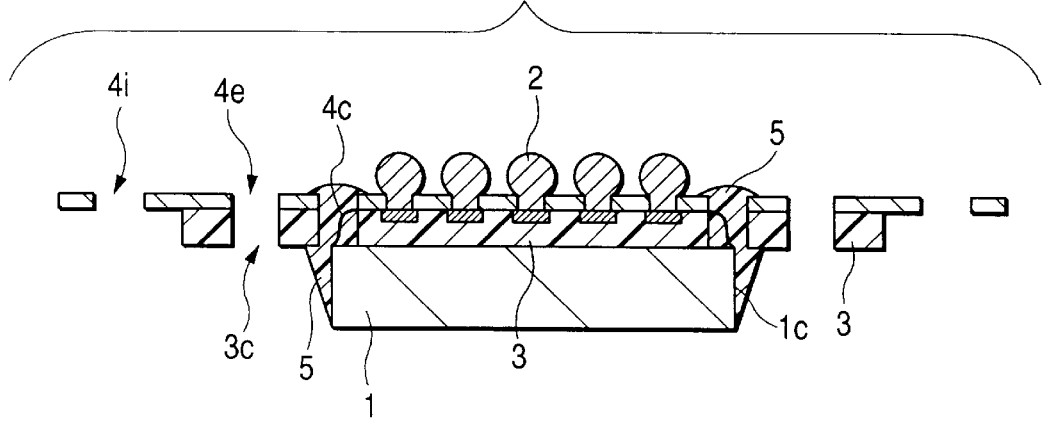
Figure 62C:
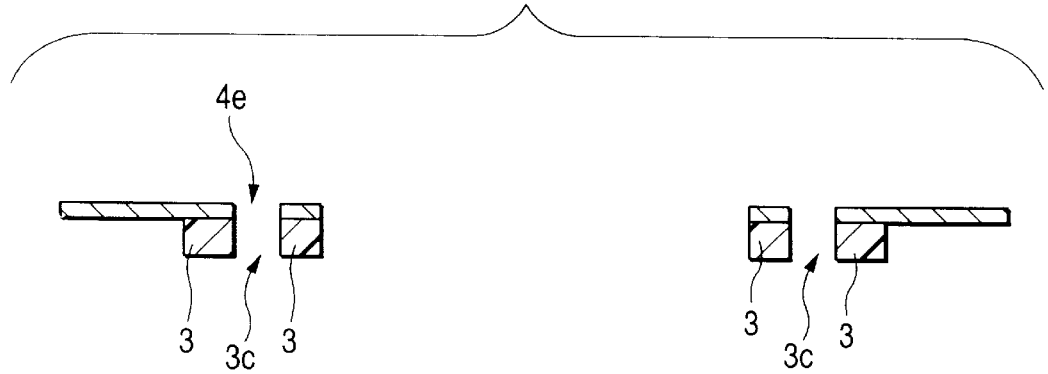
Figure 64:
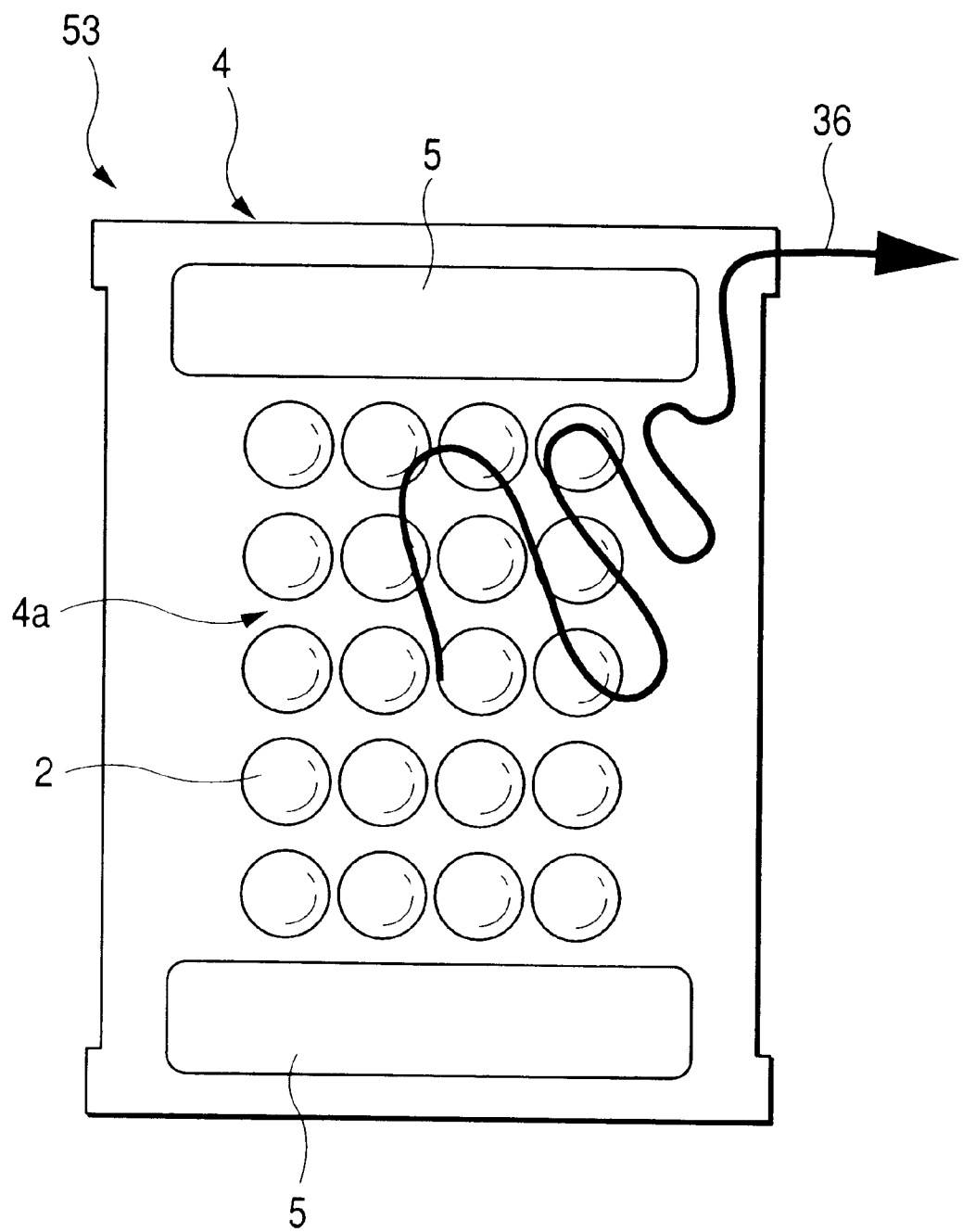
FIG. 64 is a schematic diagram of a state when gas is leaving in the semiconductor device according to the twenty-third embodiment of this invention.

FIGS. 60(a) to 60(d) are plan views each showing a typical structure of a semiconductor device according to a twenty-third embodiment of this invention. FIG. 60(a) is a plan view, FIG. 60(b) is a side view, FIG. 60(c) is a plan view, FIG. 60(d) is a front view. FIGS. 61(a) to 61(b) are diagrams each showing an example of a state when sealing is complete in a method of manufacturing the semiconductor device according to the twenty-third embodiment of this invention. FIG. 61(a) is a plan view, FIG. 61(b) is a base plan view. FIGS. 62(a) to 62(c) show cross-sections of the plan view shown in FIG. 61(a). FIGS. 62(a) is a cross-sectional view through a line A—A, 62(b) is a cross-sectional view through a line B—B, 62(c) is a cross-sectional view through a line C—C. FIGS. 63(a) to 63(c) are diagrams each showing an example of a state when sealing is complete in a method of manufacturing the semiconductor device according to the twenty-third embodiment of this invention. FIG. 63(a) is a plan view, FIG. 63(b) is a side view, FIG. 63(c) is a base plan view. FIG. 64 is a schematic diagram showing an example of a gas release state in the semiconductor device according to the twenty-third embodiment.

A CSP53 (semiconductor device) according to the twenty-third embodiment is a peripheral pad type fan-in CSP as is the CSP51 of the twenty-first embodiment shown in FIG. 51. It has a substantially identical structure to that of the CSP51, however differences from the CSP51 of the twenty-first embodiment are that the sealing parts 5 are formed only in the vicinity of the two ends of the semiconductor chip 1 as shown in FIG. 60(a). Hence, the device comprises the exposed parts 3i corresponding to the entire side faces of the elastomer 3, and the exposed parts 3i formed by exposing the area in the vicinity of the center on the left and right of the peripheral part on the top surface and under surface of the device, as shown in FIGS. 60(b), 60(c).

In other words, in the CSP53, the resin sealing 28 is not performed over all the side faces 1c of the semiconductor chip 1, but only in the vicinity of the electrode pads 1b (FIG. 51).

Herein, FIG. 61 and FIG. 62 show the structure obtained when the resin sealing 28 is complete in the process of manufacturing the CSP53. FIG. 61(a) shows a plan view, FIG. 61(b) is a base view seen from the under surface.

The sealing parts 5 are formed on the short side faces 1c of the semiconductor chip 1 and at both ends of the long side faces 1c, as shown in FIG. 61(b). As they are not formed in the vicinity of the center of the side faces 1c, the areas in the vicinity of the center on the left and right of the peripheral part of the top surface and under surface of the elastomer 3 are exposed.

In the CSP53 according to the twenty-third embodiment, the shape of the elastomer 3 is substantially identical to that of the tape base material 4g, as shown in FIG. 61.

In other words, the shape of the elastomer 3 is made to effectively fit that of the thin film wiring substrate 4 including the openings 4e, long holes 4q and suspension members 4u of the thin film wiring substrate 4.

FIG. 63 shows the situation after resin sealing when the suspension members 4u of the thin film wiring substrate 4 and suspension pieces 3k of the elastomer 3 shown in FIG. 61 are cut so as to separate the substrate body 4a from the substrate frame 4t.

The remaining features of the CSP53 according to the twenty-third embodiment and of its method of manufacture are identical to those of the CSP51 of the twenty-first embodiment, so their description will not be repeated.

It will be understood that the techniques of the aforesaid fourteenth-twentieth embodiments may be applied also to the CSP53 of the twenty-third embodiment.

The advantages of the CSP53 of the twenty-third embodiment and of its method of manufacture are as follows.

In the CSP53, the areas in the vicinity of the center on the left and right of the peripheral part of the top surface and under surface of the elastomer 3 are exposed, and as the exposed surface area of the elastomer 3 is increased with the addition of the exposed parts 3i at the cut positions. Therefore, the gas release effect is further enhanced when gas escapes via the gas escape path 36 shown in FIG. 64.

Also, by forming the shape of the elastomer 3 substantially the same as that of the tape base material 4g, the strength of the thin film wiring substrate 4 in the CSP53 is increased. As a result, defects in the CSP53 are reduced, and the yield is increased.

The remaining features of the CSP53 according to the twenty-third embodiment and of its method of manufacture are identical to those of the CSP51 of the twenty-first embodiment, so their description will not be repeated.

Embodiment 24

FIGS. 65(a) to 65(e) is a diagram of a typical structure of a semiconductor device according to a twenty-fourth embodiment of this invention. FIG. 65(a) is a base plan view, FIG. 65(b) is a side view, FIG. 65(c) is a plan view, FIG. 65(d) is a front view, FIG. 65(e) is a section through a line C—C in (c).

A CSP54 (semiconductor device) according to the twenty-fourth embodiment is a peripheral pad type fan-in CSP as is the CSP51 of the twenty-first embodiment shown in FIG. 51. It has a substantially identical structure to that of the CSP51, however differences from the CSP51 of the twenty-first embodiment are that openings 4v for exposing the elastomer 3 are provided in the thin film wiring substrate 4 as shown in FIGS. 65(c), 65(e), and that there are no positions exposing the elastomer 3 other than the openings 4v as shown in FIG. 65.

In the CSP54 according to the twenty-fourth embodiment, the two openings 4v are provided inside the substrate body 4a of the thin film wiring substrate 4.

As a result, when the CSP54 is assembled, the elastomer 3 is exposed via these openings 4v.

Therefore, the exposed parts 3i of the elastomer 3 are formed by the openings 4v.

In the CSP54, there are no positions exposing the elastomer 3 other than the openings 4v.

In other words, the resin sealing 28 is performed over all the side faces 1c without exposing the side faces 1c of the semiconductor chip 1 as shown in FIGS. 65(a) to 65(d).

In the CSP54 according to the twenty-fourth embodiment, the openings 4v are formed in the substrate body 4a of the thin film wiring substrate 4, and they may be formed at any position provided that the elastomer 3 is exposed after the CSP54 is assemble.

Moreover, there is no particular limitation on the number of the openings 4v.

The remaining features of the construction of the CSP54 according to the twenty-fourth embodiment and of its method of manufacture are identical to those of the CSP51 of the twenty-first embodiment, so their description will not be repeated.

It will be understood that the techniques of the aforesaid fourteenth-twentieth embodiments may be applied also to the CSP54 of the twenty-fourth embodiment.

The advantages of the CSP54 of the twenty-fourth embodiment and of its method of manufacture are as follows.

In the CSP54, the resin sealing 28 is performed over all the side faces 1c of the semiconductor chip 1, so the sealing properties of the semiconductor chip 1 are improved.

As a result, defects in the semiconductor chip 1 are reduced, and the reliability of the CSP54 is improved.

Also, as the openings 4v are provided in the thin film wiring substrate 4, gas can be released via these openings 4v even when the resin sealing 28 is performed over all the side faces 1c of the semiconductor chip 1.

Therefore, gas release from the elastomer 3 is enhanced while the sealing properties of the semiconductor chip 1 are improved.

The remaining advantages of the method of manufacture of the CSP54 according to the twenty-fourth embodiment are identical to those of the CSP51 of the twenty-first embodiment, so their description will not be repeated.

Embodiment 25

Figure 67:
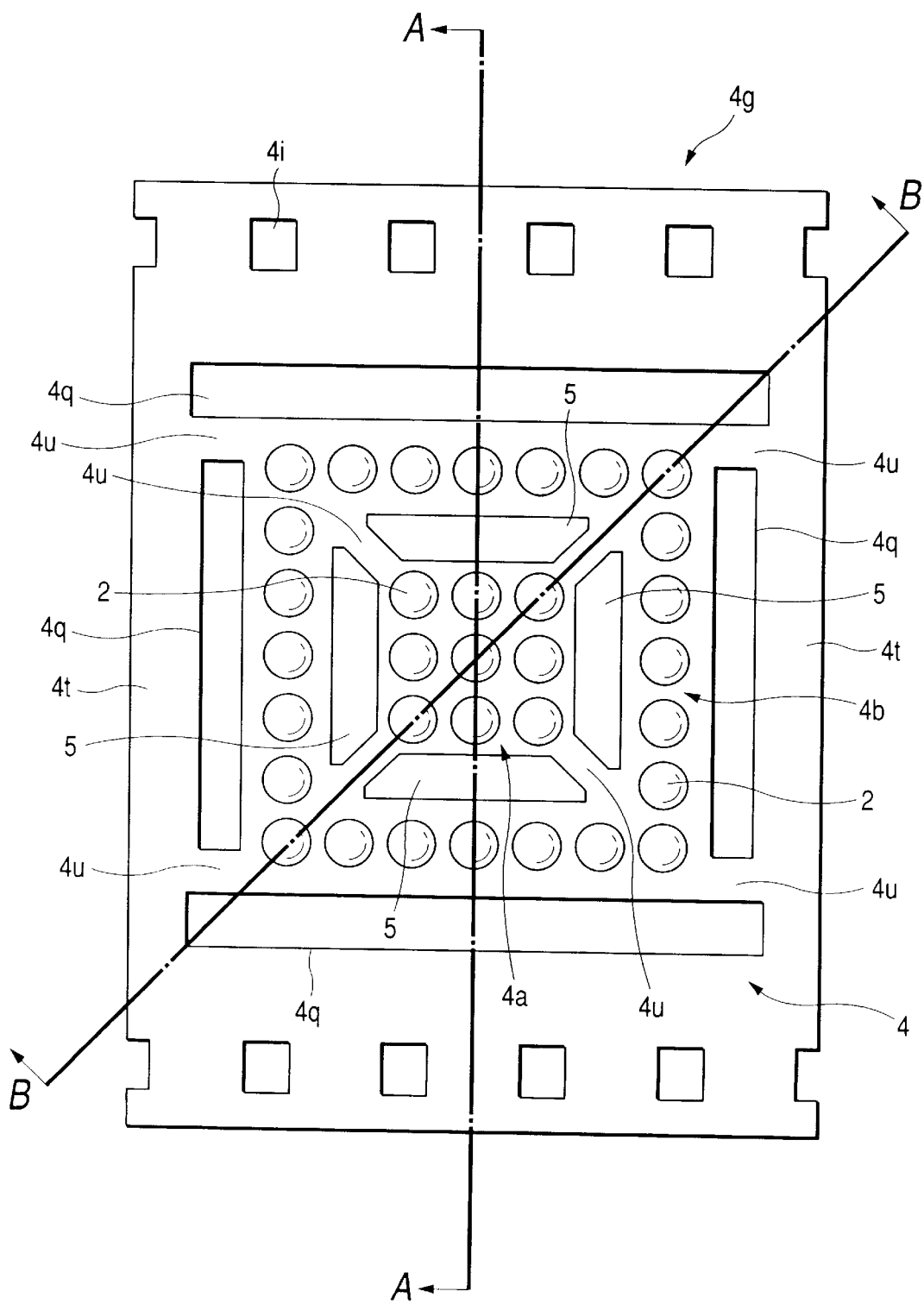
FIG. 67 is a partial plan view showing an example of a sealing completion state in a method of manufacturing the semiconductor device according to the twenty-fifth embodiment of this invention.
Figure 68A:
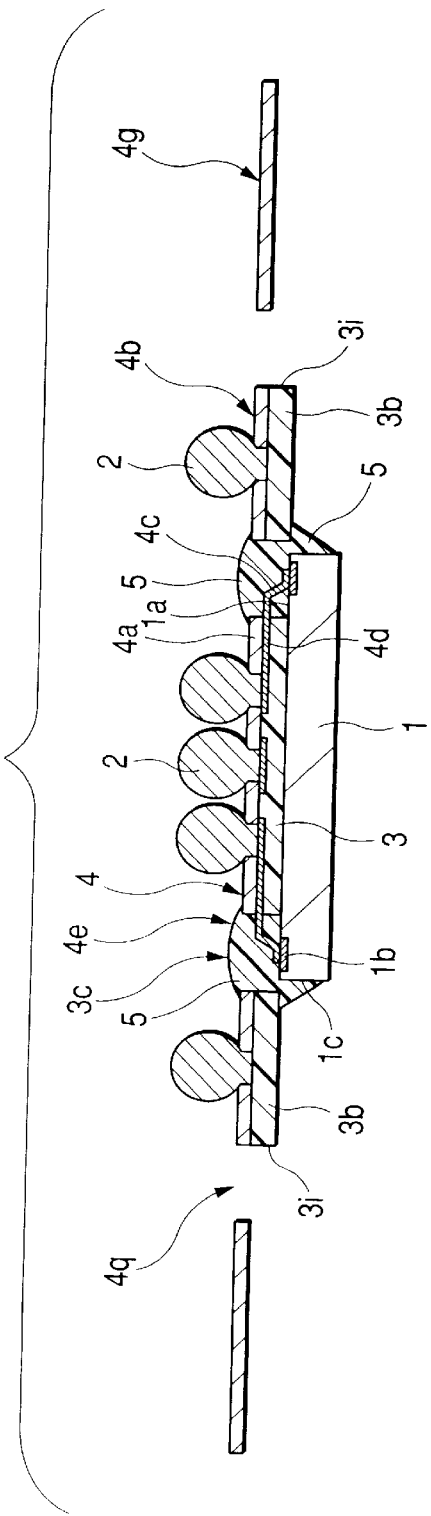
FIGS. 68(a), 68(b) are diagrams of cross-sections through the partial plan view shown in FIG. 67.
Figure 68B:
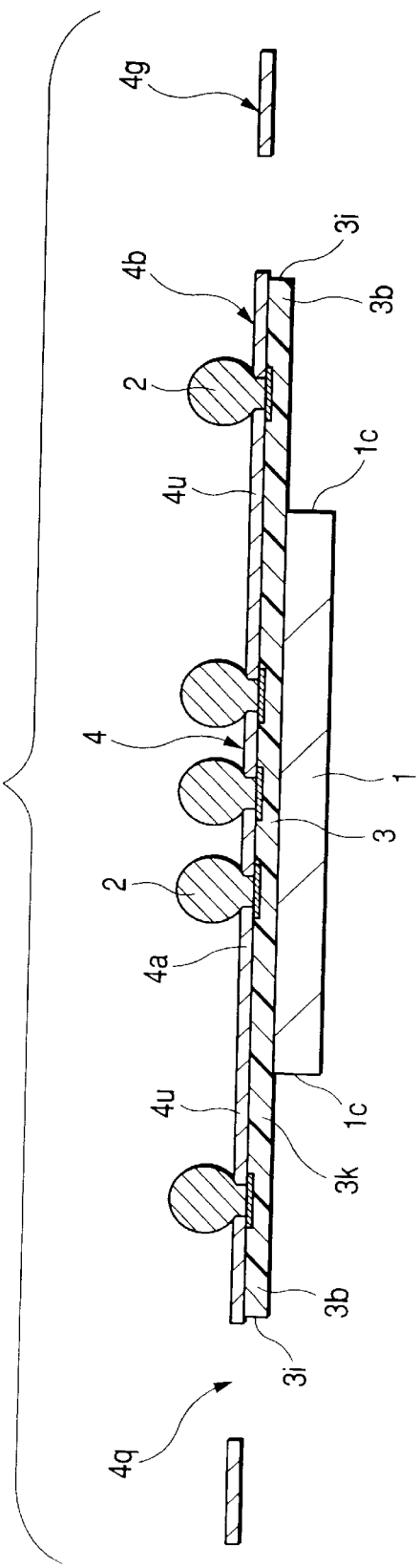
Figure 70:
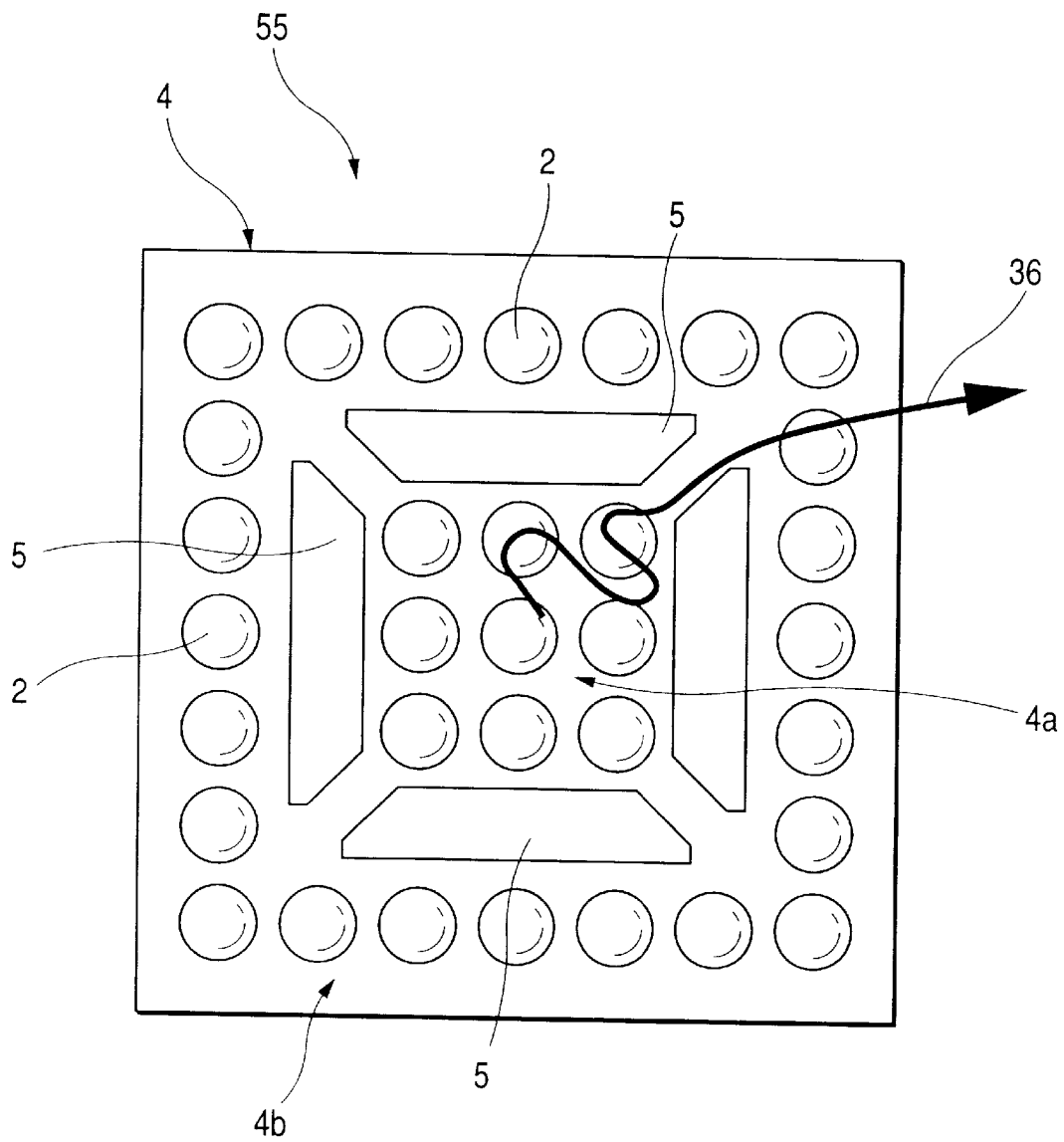
FIG. 70 is a schematic diagram of a state when gas is leaving in the semiconductor device according to the twenty-fifth embodiment of this invention.

FIGS. 66(a) to 66(c) are diagrams of a typical structure of a semiconductor device according to a twenty-fifth embodiment of this invention. FIG. 66(a) is a plan view, FIG. 66(b) is a side view, FIG. 66(c) is a base plan view. FIG. 67 is a partial plan view showing an example of a sealing completion state in a method of manufacturing the semiconductor device according to the twenty-fifth embodiment of this invention. FIGS. 68(a) and 68(b) are views showing cross-sections through the partial plan view shown in FIG. 67. FIG. 68(a) is a cross-section through the line A—A, FIG. 68(b) is a cross-section through the line B—B. FIGS. 69(a) and 69(b) are partial plan views each showing an example of a sealing completion state in a method of manufacturing the semiconductor device according to the twenty-fifth embodiment of this invention. FIG. 69(a) is a base plan view, FIG. 69(b) is a base plan view of a state with the semiconductor chip removed. FIG. 70 is a schematic diagram showing an example of a gas release state in a semiconductor device according to the twenty-fifth embodiment of this invention.

A CSP55 (semiconductor device) according to the twenty-fifth embodiment is a structure wherein pads are formed on the chip periphery, and the pad electrodes 1b are formed both inside and outside the chip as shown in FIG. 66. Hereafter, this type of CSP will be referred to as a fan-in/fan-out CSP. Differences from the CSP51 of the twenty-first embodiment are that electrode pads 1b are provided on the periphery of the four sides of the main surface 1a of the semiconductor chip 1, and the bump electrodes 2 which are external terminals are arranged inside (substrate body 4a) and outside (substrate protruding parts 4b) the semiconductor chip 1.

The CSP55 comprises an elastomer 3 comprising the exposed parts 3i for exposing the electrode pads 1b (connection terminals) arranged on the main surface 1a of the semiconductor chip 1, and the elastomer protruding parts 3b (elastic structure protruding parts) which protrude beyond the periphery of the semiconductor chip 1, the thin film wiring substrate 4 comprising the substrate body 4a provided with the wiring 4d whereof one end is electrically connected to the electrode pads 1b via the leads 4c (FIG. 51) and the other end is electrically connected to the bump electrodes 2, and the substrate protruding parts 4b provided with the openings 4e for exposing the electrode pads 1b (FIG. 51), these protruding parts protrudeing beyond the openings 4e and the semiconductor chip 1, and the sealing parts 5 for sealing the electrode pads 1b of the semiconductor chip 1 and the leads 4c of the thin film wiring substrate 4. The thin film wiring substrate 4 and the elastomer 3 are formed in approximately the same size, and the bump electrodes 2 are provided in the substrate body 4a.

Therefore, in the CSP55, the thin film wiring substrate 4 comprises the substrate protruding parts 4b formed in a one-piece construction with the substrate body 4a and its outer periphery, the bump electrodes 2 being provided in these substrate protruding parts 4b outside the semiconductor chip FIG. 67 to FIG. 69 show the structure of the CSP55 when the resin sealing 28 is complete. FIG. 67 is a plan view, FIG. 68 is a cross-sectional view, FIG. 69(a) is a base plan view seen from the under surface, and FIG. 69(b) is a view of the tape base material 4g seen from the under surface through the semiconductor chip 1.

The substrate body 4a and substrate protruding parts 4b are connected and supported by the suspension members 4u of the four angle pieces of the substrate body 4a, via the four openings 4e (FIG. 68(a)) formed in the outer periphery of the substrate body 4a.

In the outer periphery of the substrate protruding parts 4b, the four long holes 4q used for cutting are formed, and the substrate protruding parts 4b are supported in the substrate frame 4t by the suspension members 4u of the four angle pieces.

The elastomer 3 of the twenty-fifth embodiment is formed with a shape substantially fitting that of the substrate body CSP11 and substrate protruding parts 4b in the thin film wiring substrate 4 shown in FIG. 67, as shown in FIG. 69(a).

Therefore, the elastomer protruding parts 3b are provided which are supported by the suspension pieces 3k (FIG. 69(b)) and formed with essentially the same shape as that of the substrate protruding parts 4b, and the four openings 3c are formed with effectively the same size as that of the four openings 4e of the thin film wiring substrate.

The sealing parts 5 are formed only in the four openings 4e of the thin film wiring substrate 4, i.e. in the vicinity of the electrode pads 1b of the semiconductor chip 1, as shown in FIG. 68(a).

Therefore when assembly is complete, in the CSP55 which is a fan-in/fan-out structure, all points on the under surface of the elastomer 3 excluding those covered by the semiconductor chip 1 (elastomer protruding parts 3b) and all of the side faces 1a are exposed to form the exposed parts 3i, as shown in FIGS. 66(b), 66(c).

FIG. 66 shows the state where, after resin sealing, the semiconductor device is cut in the suspension members 4u of the angle pieces of the substrate protruding parts 4b of the thin film wiring substrate 4 shown in FIG. 67 so as to separate the substrate body 4a and substrate protruding parts 4b from the substrate frame 4t.

The remaining features of the construction of the CSP55 according to the twenty-fifth embodiment are identical to those of the CSP51 of the twenty-first embodiment, so their description will not be repeated.

The method of manufacturing the CSP55 according to the twenty-fifth embodiment will now be described.

First, the substrate body 4a comprising the wiring 4d and the substrate protruding parts 4b on its outer periphery are formed, the elastomer 3 which has effectively the same shape as that of the substrate protruding parts 4b and substrate body CSP11 is joined to it, and the thin film wiring substrate 4 comprising the openings 4e comprising the leads 4c joined to the wiring 4d is prepared.

Next, the main surface 1a of the semiconductor chip 1 and the elastomer 3 are joined so as to expose the electrode pads 1b (FIG. 51) of the semiconductor chip 1 in the openings 4e of the thin film wiring substrate 4.

The electrode pads 1b of the semiconductor chip 1 are electrically connected to the corresponding leads 4c of the thin film wiring substrate 4.

Next, the resin sealing 28 is applied to the electrode pads 1b of the semiconductor chip 1 and the leads 4c of the thin film wiring substrate 4 to form the sealing parts 5.

The state of the device when sealing is complete is shown in FIG. 67, FIG. 68 and FIG. 69.

Next, the bump electrodes 2 are formed in the substrate body 4a and substrate protruding parts 4b so that they are electrically connected to the wiring 4d.

The four suspension members 4u in the outer angle pieces of the substrate protruding parts 4b shown in FIG. 67 are cut so that the substrate body 4a and substrate protruding parts 4b are separated from the substrate frame 4t.

The state of the device when cutting is complete is shown in FIGS. 66(a), 66(b), 66(c).

The remaining features of the method of manufacturing the CSP55 according to the twenty-fifth embodiment are identical to those of the CSP51 of the twenty-first embodiment, so their description will not be repeated.

It will be understood that the techniques of the aforesaid fourteenth-twentieth embodiments may be applied also to the CSP55 of the twenty-fifth embodiment.

The advantages of the CSP55 of the twenty-fifth embodiment and of its method of manufacture are as follows.

In the CSP55, even in a fan-in/fan-out structure, gas (vapor) can be released via the gas escape path 36 through the suspension members 3k (FIG. 69(b)) provided in the elastomer 3 as shown in FIG. 70.

The occurrence of the popcorn phenomenon which damages the sealing part 5 is thereby prevented, and as a result the reliability of the CSP55 is improved.

The remaining features of the CSP55 according to the twenty-fifth embodiment and of its method of manufacture are identical to those of the CSP51 of the twenty-first embodiment, so their description will not be repeated.

This invention has been described in detail based on the first-twenty-fifth embodiments, however the invention is not limited to these twenty-five embodiments and various modifications are possible within the scope and spirit of the invention.

For example in the first to twenty-fifth embodiments, the specifications of the components shown in FIGS. 3(a,b,c,d) and the process conditions shown in FIG. 5 are only examples of optimum conditions, and the invention is not necessarily limited to the examples shown in FIGS. 3(a,b,c,d) and FIG. 5.

Further, in the aforesaid first to twenty-fifth embodiments, the case was described where the semiconductor chip 1 was longitudinal, but the semiconductor chip 1 may also be square.

The electrode pads 1b provided in the semiconductor chip 1 are not necessarily located at the two ends of the semiconductor chip 1, and may be provided in any other position provided that this position is situated on the outer periphery of the main surface 1a of the semiconductor chip 1. They may for example be provided over the whole of the outer periphery.

The number of the electrode pads 1b and the number of bump electrodes 2 provided in the semiconductor chip 1 is not limited to 12 or 20, and may be a number less than 12, 13–19 or more than 20.

The shape of the openings 4e of the thin film wiring substrate 4 and the openings 3c of the elastomer 3 is not limited to rectangular, and may be another shape provided that the electrode pads 1b of the semiconductor chip 1 can be exposed.

The semiconductor device (CSP) described in the aforesaid first-twenty-fifth embodiments may be used for example in a DRAM (Dynamic Random Access Memory), S (Synchronous) DRAM, S (Static) RAM, RAMBUS, flash memory, ASIC (Application Specific IC), CPU (Central Processing Unit) or gate array. Typical applications of these devices are modules and cards, but it will be understood that they may be applied to products other than modules and cards.

The main advantages of the invention as disclosed herein may be simply described as follows.

(1) As the substrate body and substrate protruding parts of the thin film wiring substrate in the semiconductor device (CSP) are formed in a one-piece construction, the substrate protruding parts are not formed independently and therefore do not have to be formed of costly materials. This lowers the cost of manufacturing the semiconductor device.

(2) By providing the substrate protruding parts outside the openings in the thin film wiring substrate, when a sealing resin is applied via the openings, the sealing parts are formed as a bridge between the substrate protruding parts and the semiconductor chip. In this way, a stable seal can be obtained, sealing properties are improved, and consequently humidity resistance is improved.

(3) When the bump electrodes are formed, even if the semiconductor device absorbs is subjected to reflow after it absorbs moisture, water vapor produced during reflow can be released to the outside via the elastic structure as the side faces in a predetermined direction of the elastic structure are exposed to the outside, and reflow tolerance is thereby improved.

(4) By forming the elastic structure of a porous fluoride resin, the water vapor produced during reflow can be released to the outside and at the same time, penetration of moisture into the semiconductor device is prevented by the water repelling properties of the fluoride resin. As a result, deterioration of the electrical characteristics of the semiconductor device is reduced.

(5) By incorporating a coloring agent in the elastic structure, transmittance of light in the elastic structure can be reduced without affecting the basic physical properties of the elastic structure. In this way, the circuit of the semiconductor chip can be shielded from light, ultraviolet light which would cause incorrect operation of the semiconductor chip is blocked, and operational stability of the electrical circuit of the semiconductor device is improved.

(6) In the thin film wiring substrate, by making the connections between the wiring and bump lands wide, concentration of stress in the connections is prevented. Hence, even if the wiring deforms due to thermal contraction and expansion together with the tape base material during temperature cycles, rupture of leads is prevented in the connecting parts 4s between the wiring and bump lands.

(7) By forming the exposed parts in the elastic structure, even when the internal pressure of the elastic structure rises as during reflow for example, gas can be released to the outside from the exposed parts of the elastic structure. In this way, occurrence of the popcorn phenomenon which damages the sealing parts, etc., is prevented, and as a result the reliability of the semiconductor device is improved.

What is claimed:

1. A semiconductor device comprising:

a semiconductor chip including plural semiconductor elements on its main surface and plural connection terminals, said plural connection terminals being arranged on the periphery of said semiconductor chip;

an elastic body arranged on the main surface of said semiconductor chip leaving said connection terminals exposed;

an insulating tape formed on said elastic body comprising openings in an area where said connection terminals are arranged;

plural leads formed on the surface of said insulating tape, in which one end is electrically connected to the said terminals and the other ends are arranged on said elastic body;

plural bump electrodes formed at the other end of said plural leads; and a resin body for sealing said connection terminals of said semiconductor chip and one end of said leads;

wherein said insulating tape comprises a first part arranged over said main surface of said semiconductor chip, and a second part protruding beyond said semiconductor chip in the vicinity of the periphery of said semiconductor chip wherein said plural connection terminals are arranged; and further comprising a dam piece formed as a separate body from said insulating tape in said second part of said insulating tape.

2. A semiconductor device comprising a semiconductor chip having connection terminals provided on the outer periphery of its main surface, comprising:

an elastic body arranged on the main surface of said semiconductor chip leaving said connection terminals exposed;

a thin film wiring substrate comprising a substrate body having wiring whereof one end is electrically connected to said connection terminals via leads and the other ends are electrically connected to bump electrodes which are external terminals, and comprising substrate protruding parts having openings which leave said connection terminals exposed and which protrude beyond said openings and said semiconductor chip;

sealing parts which seal said connection terminals of said semiconductor chip and seal said leads of said thin film wiring substrate;

said substrate body and said substrate protruding parts of said thin film wiring substrate being formed in a one-piece construction; and wherein a dam piece is provided for preventing leakage of sealing resin when resin sealing is performed around said openings of said thin film wiring substrate.

3. A semiconductor device comprising a semiconductor chip having connection terminals provided on the outer periphery of its main surface, comprising an elastic body arranged on the main surface of said semiconductor chip having openings for exposing said connection terminals, said elastic body comprising elastic body protruding parts which protrude beyond said openings and said semiconductor chip;

a thin film wiring substrate comprising a substrate body having wiring whereof one end is electrically connected to said connection terminals via leads and the other ends are electrically connected to bump electrodes which are external terminals, and comprising substrate protruding parts having openings which leave said connection terminals exposed and which protrude beyond said openings and said semiconductor chip; and sealing parts which seal said connection terminals of said semiconductor chip and seal said leads of said thin film wiring substrate;

said substrate body and said substrate protruding parts of said thin film wiring substrate being formed in a one-piece construction, and said thin film wiring substrate and said elastic body being formed in approximately the same size, wherein said semiconductor chip is attached so that its side faces are surrounded by said elastic body protruding parts of said elastic body.

4. A semiconductor device comprising:

a semiconductor chip including plural semiconductor elements on its main surface and plural connection terminals, said plural connection terminals being arranged on the periphery of said semiconductor chip an elastic body arranged on the main surface of said semiconductor chip leaving said connection terminals exposed;

an insulating tape formed on said elastic body comprising openings in an area where said connection terminals are arranged;

plural leads formed on the surface of said insulating tape, in which one end is electrically connected to the said terminals and the other ends are arranged on said elastic body;

plural bump electrodes formed at the other end of said plural leads; and a resin body for sealing said connection terminals of said semiconductor chip and one end of said leads;

wherein said insulating tape comprises a first part arranged over said main surface of said semiconductor chip, and a second part protruding beyond said semiconductor chip in the vicinity of the periphery of said semiconductor chip wherein said plural connection terminals are arranged; and further comprising an unconnected lead which is not connected to said connection terminals of said semiconductor chip, and said unconnected lead is bent towards said connection terminals.

5. A semiconductor device comprising:

a semiconductor chip including plural semiconductor elements on its main surface and plural connection terminals, said plural connection terminals being arranged on the periphery of said semiconductor chip;

an elastic body arranged on the main surface of said semiconductor chip leaving said connection terminals exposed;

an insulating tape formed on said elastic body comprising openings in an area where said connection terminals are arranged;

plural leads formed on the surface of said insulating tape, in which one end is electrically connected to said terminals and the other ends are arranged on said elastic body;

plural bump electrodes formed at the other end of said plural leads; and a resin body for sealing said connection terminals of said semiconductor chip and one end of said leads;

wherein said insulating tape comprises a first part arranged over said main surface of said semiconductor chip, and a second part protruding beyond said semiconductor chip in the vicinity of the periphery of said semiconductor chip wherein said plural connection terminals are arranged, and wherein said elastic body is formed from a porous fluoride resin comprising an adhesive layer on its top surface and under surface.

6. A semiconductor device according to claim 5, wherein said elastic body comprises a skeleton layer formed from a three-dimensional mesh structure.

7. A semiconductor device comprising a semiconductor chip having connection terminals provided on the outer periphery of its main surface, comprising:

an elastic body arranged on the main surface of said semiconductor chip having openings for exposing said connection terminals, said elastic body comprising elastic body protruding parts which protrude beyond said openings and said semiconductor chip a thin film wiring substrate comprising a substrate body having wiring whereof one end is electrically connected to said connection terminals via leads and the other ends are electrically connected to bump electrodes which are external terminals, and comprising substrate protruding parts having openings which leave said connection terminals exposed and which protrude beyond said openings and said semiconductor chip; and sealing parts which seal said connection terminals of said semiconductor chip and seal said leads of said thin film wiring substrate;

said substrate body and said substrate protruding parts of said thin film wiring substrate being formed in a one-piece construction, and said thin film wiring substrate and said elastic body being formed in approximately the same size, wherein either one of or both adhesive layers in said elastic body comprises a coloring agent.

8. A semiconductor device comprising:

a semiconductor chip having a quadrilateral main surface, a first end side of the main surface, a second, opposing end side of the main surface, a first row of connection terminals arranged parallel to and near the first end side on the main surface, a second row of connection terminals arranged parallel to and near the second end side on the main surface, and a plurality of semiconductor elements formed between the first row of connection terminals and second row of connection terminals on the main surface;

a wiring substrate having a first portion arranged over the main surface of said semiconductor chip such that a rear surface of said wiring substrate is facing towards the main surface of said semiconductor chip, a second portion protruding from the first end side of the main surface of said semiconductor chip, and a third portion protruding from the second end side of the main surface of said semiconductor chip, wherein said wiring substrate has a first opening positioned over the first row of connection terminals and a second opening positioned over the second row of connection terminals;

a plurality of wirings formed on the first portion of said wiring substrate;

a plurality of bump electrodes arranged on the first portion of said wiring substrate, respectively, and each being electrically connected to a connection terminal at a corresponding one of the first and second rows of connection terminals through one of said wirings; and a resin body having a first portion sealing the first row of connection terminals and the first opening, and a second portion sealing the second row of connection terminals and the second opening, wherein a rear surface of the semiconductor chip, opposite of the main surface thereof, remains exposed, wherein the first portion of said resin body is formed as a bridge in the first opening of said wiring substrate and is formed as a bridge between a side face of said semiconductor chip, adjacent to the first end side, and a rear surface of the second portion of the wiring substrate, and wherein the second portion of said resin body is formed as a bridge in the second opening of said wiring substrate and is formed as a bridge between a side face of said semiconductor chip, adjacent to the second end side, and a rear surface of the third portion of said wiring substrate.

9. A semiconductor device according to claim 8, wherein the bridging surface of the first and second portion of the resin body remains exposed.

10. A semiconductor device according to claim 8, wherein the second and third parts of said wiring substrate function as a dam for preventing the flow of said resin body.

11. A semiconductor device according to claim 8,
wherein a width of the first opening is larger than a distance between the second portion of said wiring substrate and the side face of said semiconductor chip adjacent the first end side, and
wherein a width of the second opening is larger than a distance between the third portion of said wiring substrate and the side face of the semiconductor chip adjacent the second end side.

12. A semiconductor device according to claim 10,
wherein the first portion of said resin body is a sealing part which is made of potting method through the first opening, and
wherein the second portion of said resin body is a sealing part which is made of potting method through the second opening.

13. A semiconductor device according to claim 8, wherein said bump electrodes are not provided on the second and third portions of said wiring substrate.

14. A semiconductor device comprising:

a semiconductor chip having a quadrilateral main surface, a first end side of the main surface, a second, opposing end side of the main surface, a first row of connection terminals arranged parallel to and near the first end side of the main surface, a second row of connection terminals arranged parallel to and near the second end side on the main surface, and a plurality of semiconductor elements formed between the first row of connection terminals and second row of connection terminals on the main surface;

an elastic body arranged on the main surface of said semiconductor chip between the first row of connection terminals and the second row of connection terminals, leaving the connection terminals exposed;

an insulating tape having a first portion arranged over the main surface of said semiconductor chip, through said elastic body such that a rear surface of said insulating tape is facing towards the main surface of said semiconductor chip, a second portion protruding from the first end side of the main surface of said semiconductor chip, a third portion protruding from the second end side of the main surface of the semiconductor chip, a first opening formed over the first row of connection terminals between the first and second portions, and a second opening formed over the second row of connection terminals between the first and third portions;

a plurality of leads connected, respectively, to the first and second rows of connection terminals and extended over said elastic body;

a plurality of bump electrodes electrically connected to the first and second rows of connection terminals through the leads, respectively, arranged on the first portion of said insulating tape; and a resin body having a first portion and a second portion, wherein the first portion of said resin body sealing the first row of connection terminals, the first opening, the leads connected to the first row of connection terminals, and a side face, adjacent to the first side, of said semiconductor chip, wherein the second portion of said resin body sealing the second row of connection terminals, the second opening, the leads connected to the second row of connection terminals, and a side face, adjacent to the second end side, of said semiconductor chip, and wherein the bump electrodes, electrically connected to the connection terminals, are arranged on the first portion of the insulating tape, and are not arranged on the second and third portions of said insulating tape.

15. A semiconductor device according to claim 14,
wherein the first portion of said resin body is formed as a bridge in the first opening of said insulating tape, and
wherein the second portion of said resin body is formed as a bridge in the second opening of said insulating tape.

16. A semiconductor device according to claim 15,
wherein the first portion of said resin body is formed as a bridge between a side face, adjacent to the first end side, of said semiconductor chip and a rear surface of the second portion of said insulating tape, and
wherein the second portion of said resin body is formed as a bridge between a side face, adjacent to the second end side, of the semiconductor chip and a rear surface of the third portion of said insulating tape.

17. A semiconductor device according to claim 16, wherein a rear surface of said semiconductor chip, opposite of the main surface thereof, remains exposed.

18. A semiconductor device according to claim 16,
wherein a width of the first opening is larger than a distance between the second portion of said insulating tape and the side face of said semiconductor chip adjacent the first end side, and
wherein a width of the second opening is larger than a distance between the third portion of said insulating tape and the side face of said semiconductor chip adjacent the second end side.

19. A semiconductor device according to claim 18,
wherein the first portion of said resin body is a sealing part which is made of potting method through the first opening, and
wherein the second portion of said resin body is a sealing part which is made of potting method through the second opening.

20. A semiconductor device according to claim 14, wherein a rear surface of said semiconductor chip, opposite of the main surface thereof, remains exposed.

21. A semiconductor device according to claim 14, wherein the second and third parts of said insulating tape function as a dam for preventing the flow of said resin body, respectively.

22. A semiconductor device according to claim 14, wherein said elastic body is formed of a porous material.

23. A semiconductor device according to claim 14, wherein said resin body provides sealing parts and is made of potting method.

* * * * *